US006794118B2

(12) United States Patent
Okamoto et al.

(10) Patent No.: US 6,794,118 B2
(45) Date of Patent: Sep. 21, 2004

(54) PROCESS FOR FABRICATING SEMICONDUCTOR INTEGRATED CIRCUIT DEVICE, AND EXPOSING SYSTEM AND MASK INSPECTING METHOD TO BE USED IN THE PROCESS

(75) Inventors: Yoshihiko Okamoto, Ohme (JP); Noboru Moriuchi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 76 days.

(21) Appl. No.: 09/922,656

(22) Filed: Aug. 7, 2001

(65) Prior Publication Data

US 2002/0025479 A1 Feb. 28, 2002

Related U.S. Application Data

(63) Continuation of application No. 09/567,158, filed on May 9, 2000, now Pat. No. 6,309,800, which is a continuation of application No. 08/896,139, filed on Jul. 17, 1997, now Pat. No. 6,153,357, which is a continuation of application No. 08/478,023, filed on Jun. 7, 1995, now Pat. No. 5,753,416, which is a division of application No. 08/219,726, filed on Mar. 29, 1994, now Pat. No. 5,455,144, which is a division of application No. 08/026,200, filed on Feb. 26, 1993, now Pat. No. 5,298,365, which is a continuation of application No. 07/699,703, filed on May 14, 1991, now abandoned, which is a continuation-in-part of application No. 07/610,422, filed on Nov. 7, 1990, now abandoned.

(30) Foreign Application Priority Data

Mar. 20, 1990 (JP) ............................................... 2-71266
May 18, 1990 (JP) ............................................... 2-126662
Sep. 19, 1990 (JP) ............................................... 2-247100

(51) Int. Cl.[7] ................................................. G03F 7/20
(52) U.S. Cl. .............................. 430/311; 430/5; 430/22; 430/313; 430/396
(58) Field of Search ............................... 430/5, 22, 311, 430/313, 396

(56) References Cited

U.S. PATENT DOCUMENTS

| 4,153,457 A | 5/1979 | Kellie ............................. 430/8 |
| 4,533,624 A | 8/1985 | Sheppard ..................... 430/312 |
| 4,592,132 A | 6/1986 | Lee .............................. 438/637 |
| 5,045,417 A | 9/1991 | Okamoto ........................ 430/5 |
| 5,234,780 A | * 8/1993 | Nitayama et al. .............. 430/5 |
| 5,266,446 A | 11/1993 | Chang et al. ................ 430/314 |
| 5,670,427 A | 9/1997 | Cho ............................ 438/669 |
| 5,736,300 A | 4/1998 | Mizuno ....................... 430/313 |
| 5,741,625 A | 4/1998 | Bae ............................. 430/312 |
| 5,830,606 A | 11/1998 | Okamoto ........................ 430/5 |

FOREIGN PATENT DOCUMENTS

| JP | 57-62052 | 4/1982 |
| JP | 58-173744 | 10/1983 |
| JP | 60-107835 | 6/1985 |
| JP | 60-109228 | 6/1985 |
| JP | 61-292643 | 12/1986 |
| JP | 62-67514 | 3/1987 |
| JP | 62-67547 | 3/1987 |
| JP | 62-92438 | 4/1987 |
| JP | 62-189468 | 8/1987 |
| JP | 62-59296 | 12/1987 |
| JP | 64-1233 | * 1/1989 |
| JP | 1283925 | 1/1989 |
| JP | 1147458 | 6/1989 |
| JP | 234854 | 2/1990 |

(List continued on next page.)

Primary Examiner—Mark F. Huff
Assistant Examiner—Nicole Barreca
(74) Attorney, Agent, or Firm—Mattingly, Stanger & Malur, P.C.

(57) ABSTRACT

Herein disclosed is an exposure technology for a semiconductor integrated circuit device which has a pattern as fine as that of an exposure wavelength. The technology contemplates to improve the resolution characteristics of the pattern by making use of the mutual interference of exposure luminous fluxes.

1 Claim, 67 Drawing Sheets

FOREIGN PATENT DOCUMENTS

| | | |
|---|---|---|
| JP | 2140743 | 2/1990 |
| JP | 2210250 | 2/1990 |
| JP | 2211450 | 2/1990 |
| JP | 2211451 | 2/1990 |
| JP | 2-98119 | 4/1990 |
| JP | 278216 | 9/1990 |

* cited by examiner

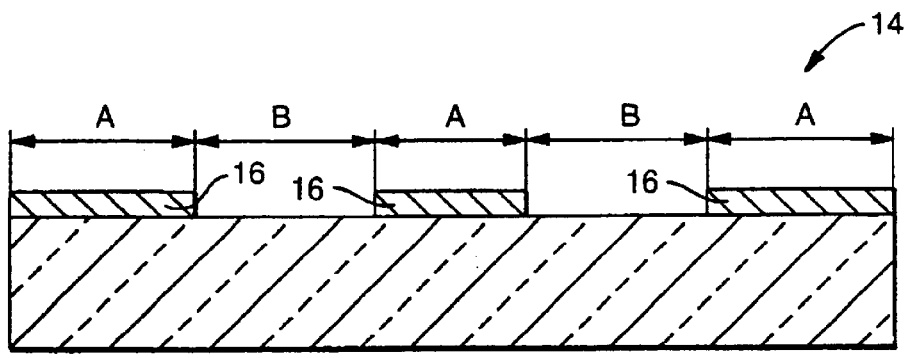
FIG. 1B
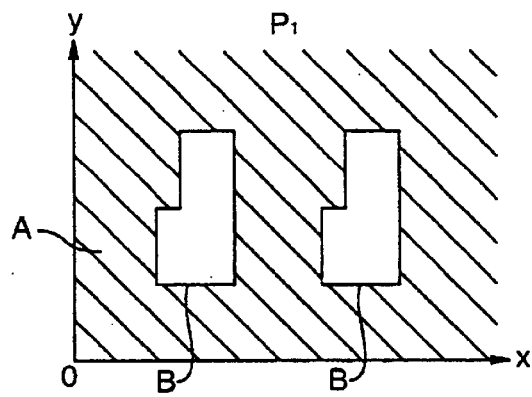
FIG. 1C-1
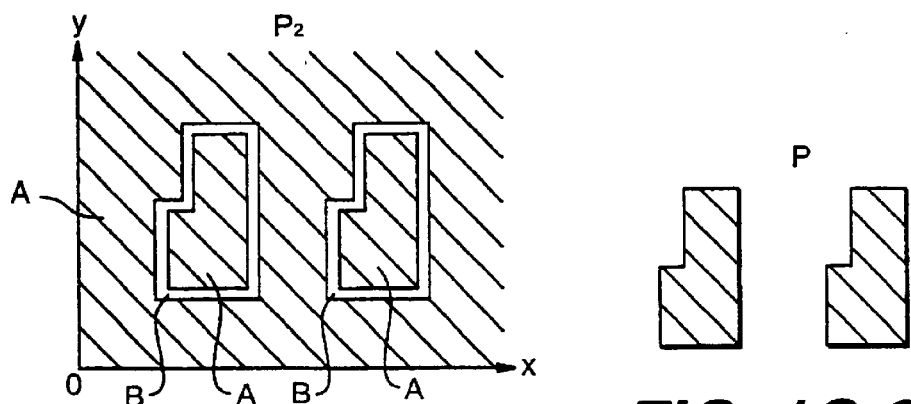
FIG. 1C-2
FIG. 1C-3

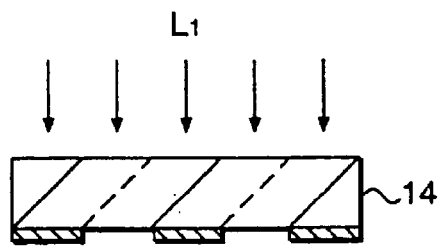
FIG. 1I-1
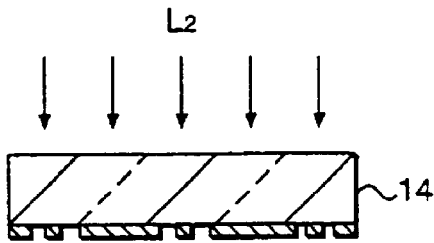
FIG. 1I-2
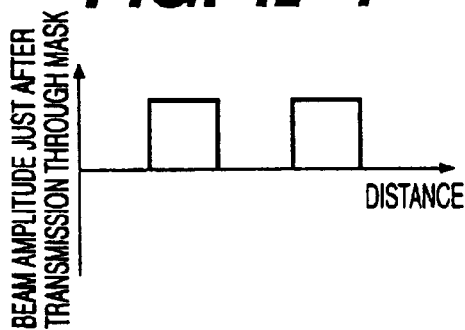
FIG. 1I-1'
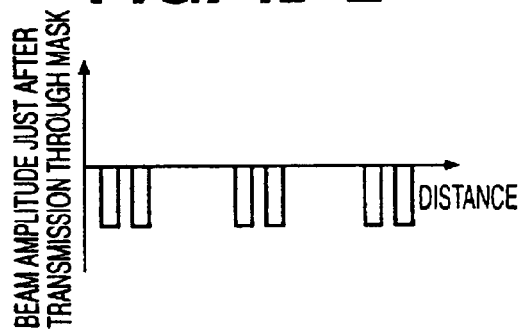
FIG. 1I-2'
FIG. 1I-3
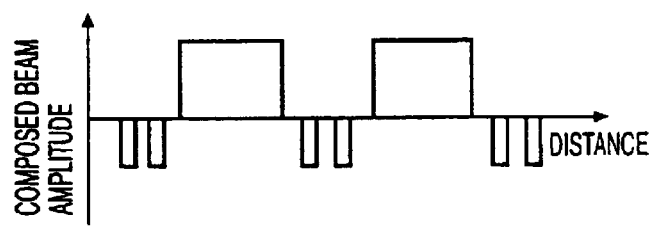
FIG. 1I-4
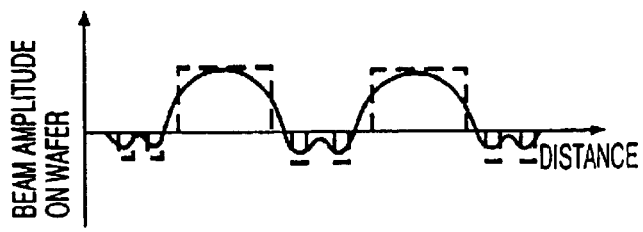
FIG. 1I-5
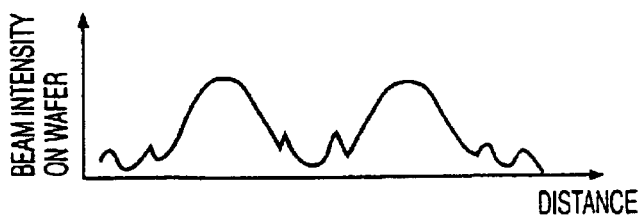

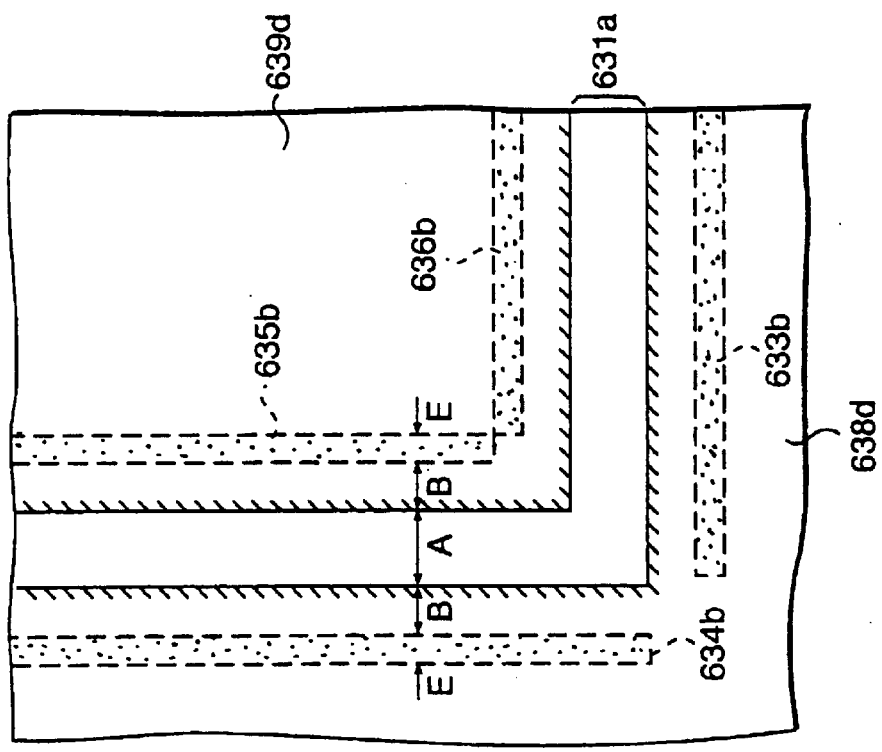
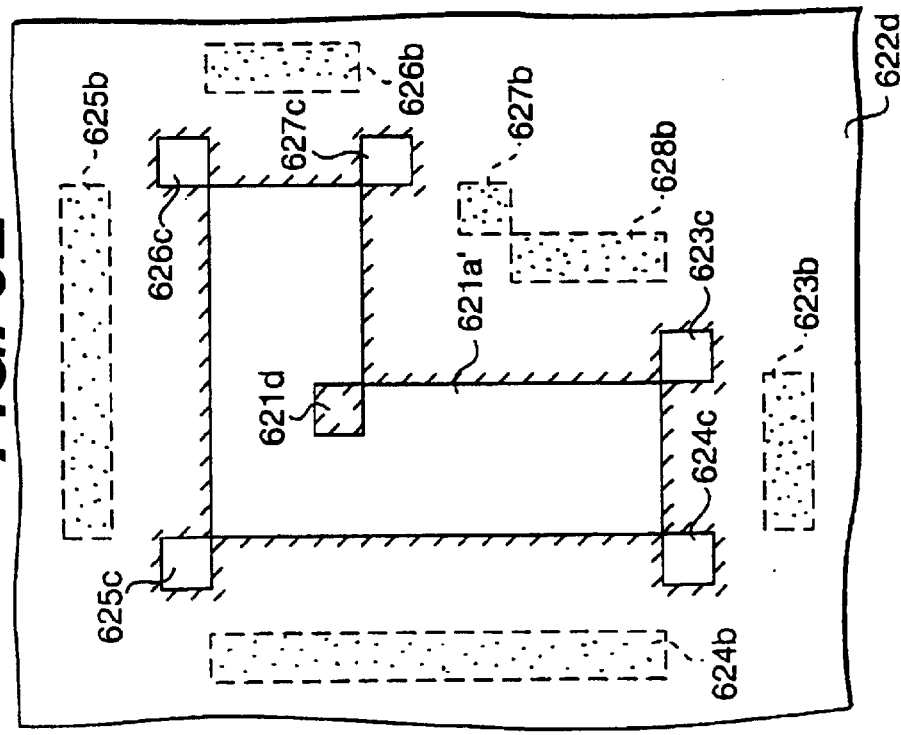

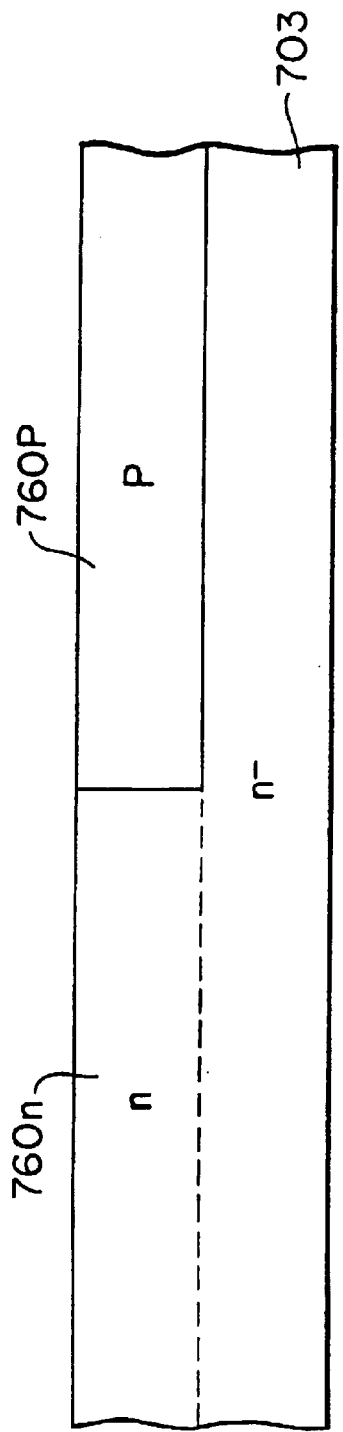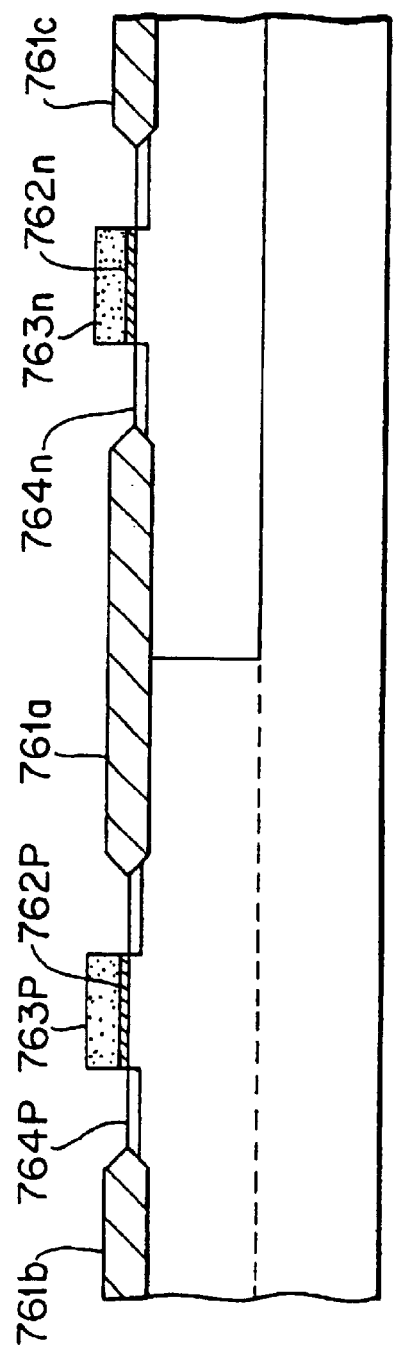

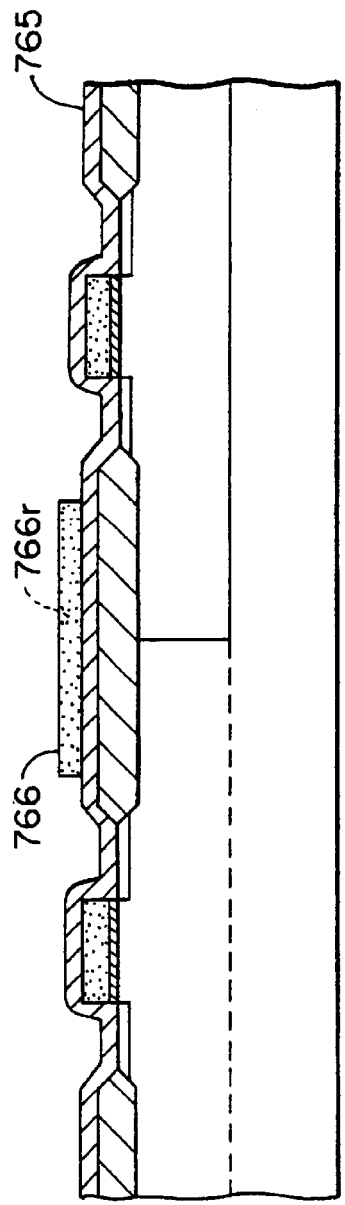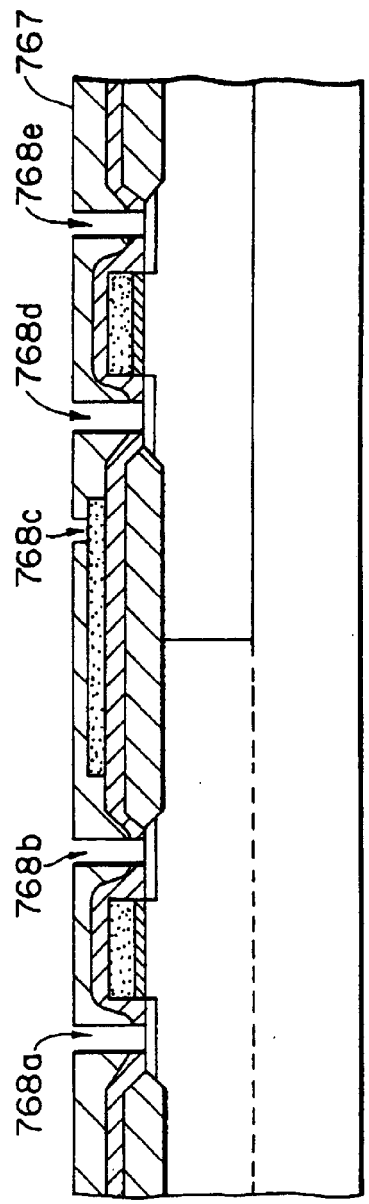
FIG. 7L
FIG. 7M

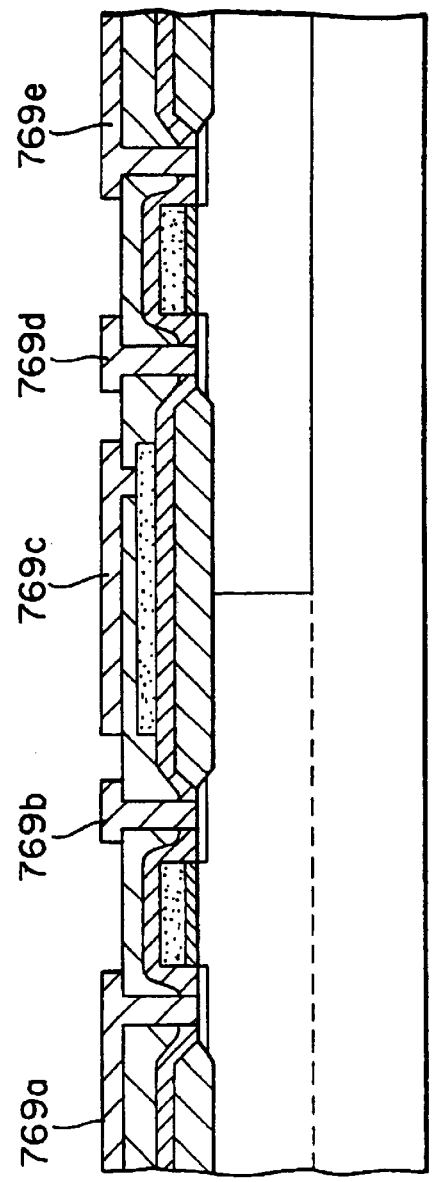
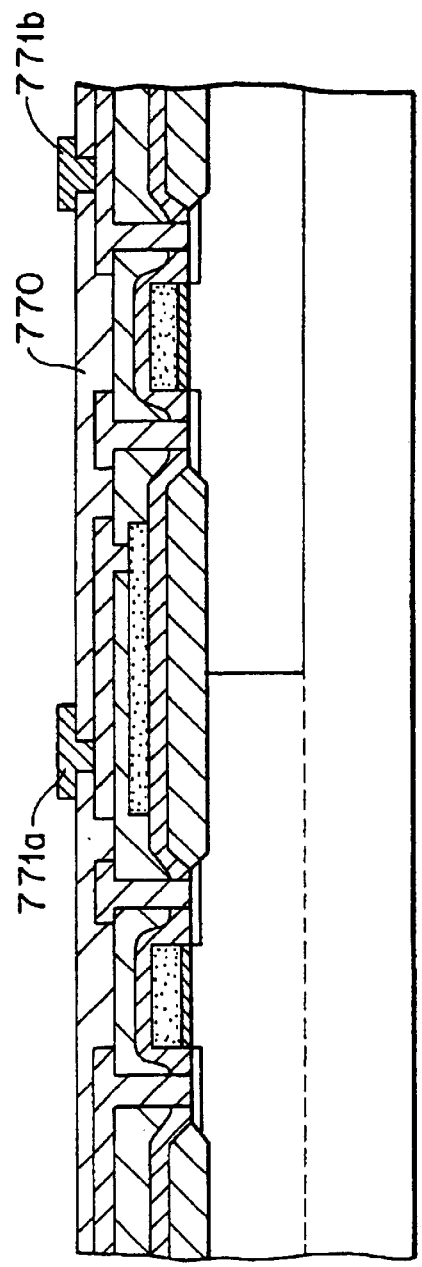
FIG. 7N
FIG. 7O

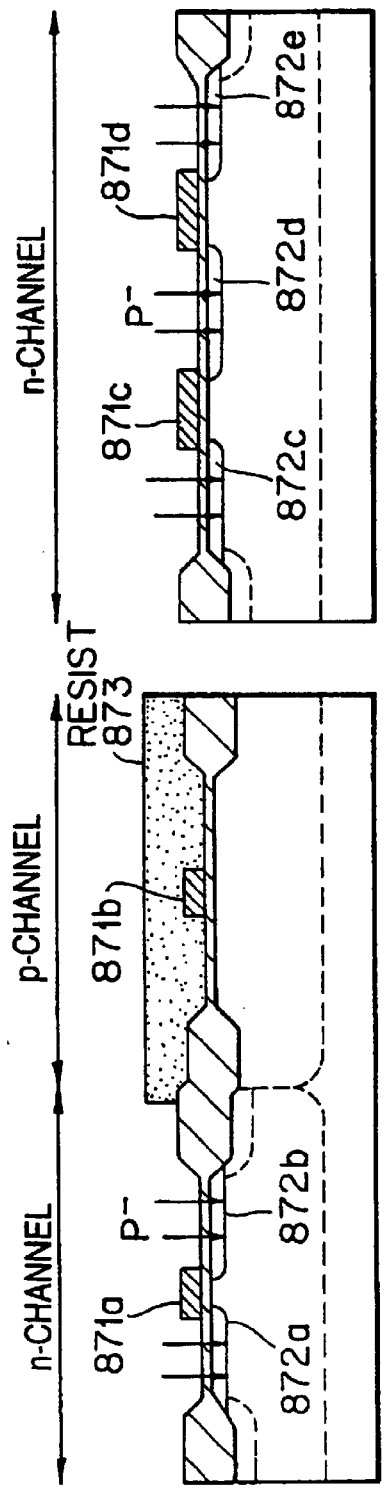
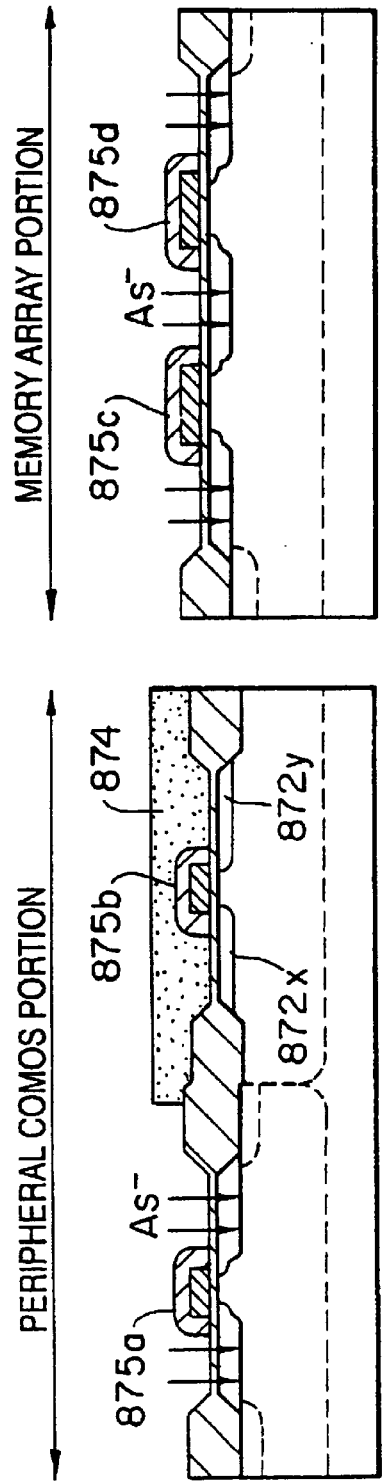
FIG. 8E-2
FIG. 8E-1
FIG. 8F-2
FIG. 8F-1

FIG. 10

| CONDITIONS / LINE SOURCE | CENTER WAVELENGTH | BAND WIDTH | PARTIAL COHERENCE | REMARKS |
|---|---|---|---|---|
| I-LINE OF HIGH-PRESSURE Hg LAMP | 365 nm | 7~10 nm | 0.2~1.1 | |
| KrF EXCIMER LASER | 248 nm | ABOUT 0.001 nm | 0.2~1.1 | DEEP UV REGION |
| ArF EXCIMER LASER | 193 nm | DITTO | 0.2~1.1 | DITTO |

FIG. 20D

| ABBREV. | CHEMICAL FORMULA | POINT GROUP | TRANSMISSIVE RANGE (μm) |
|---|---|---|---|
| KDP | $KH_2PO_4$ | 42 m | 0.27 ~ 1.7 |
| DKDP | $KD_2PO_4$ | 42 m | 0.2 ~ 1.6 |
| ADP | $NH_4H_2PO_4$ | 42 m | 0.13 ~ 1.7 |

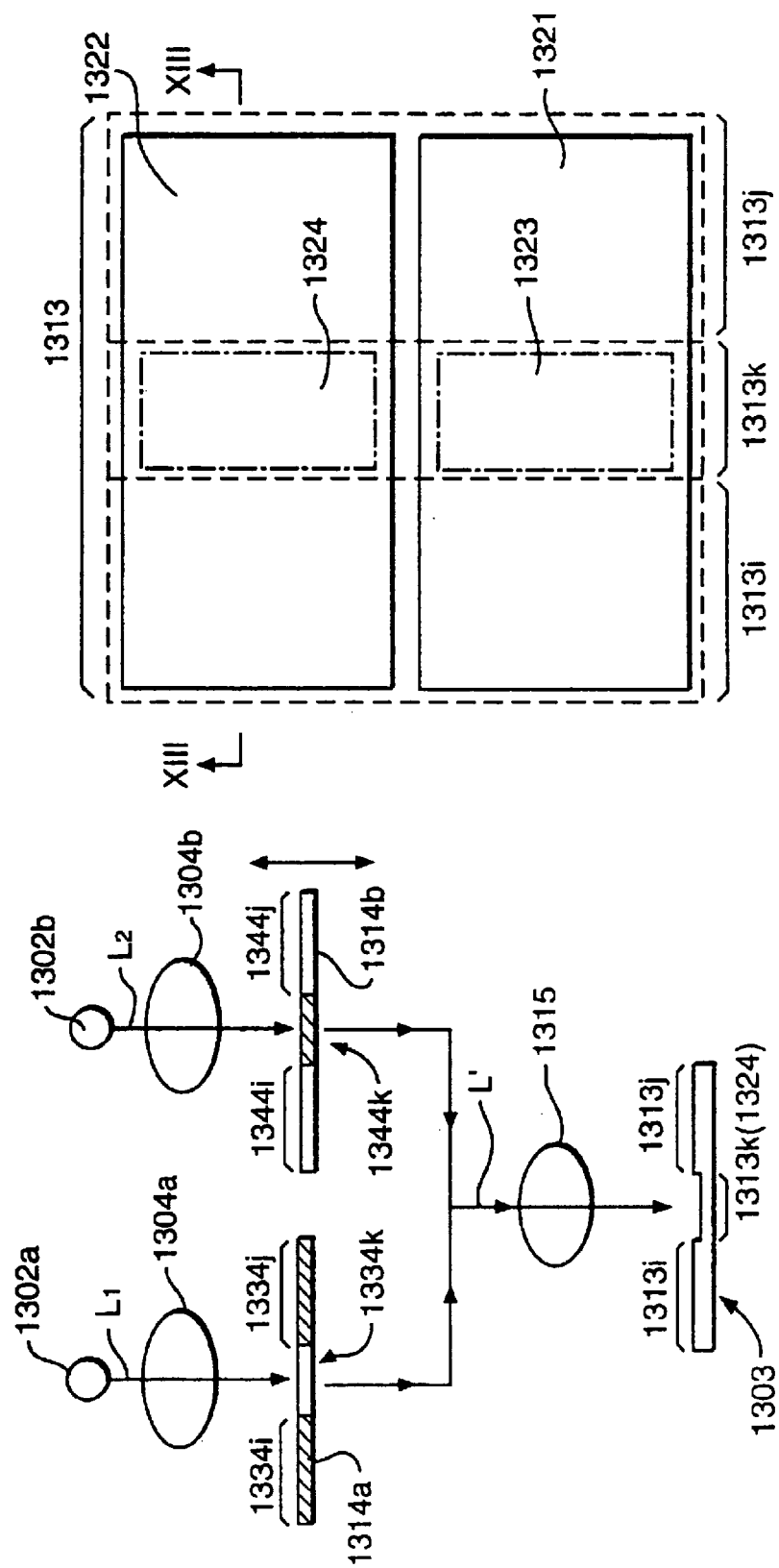

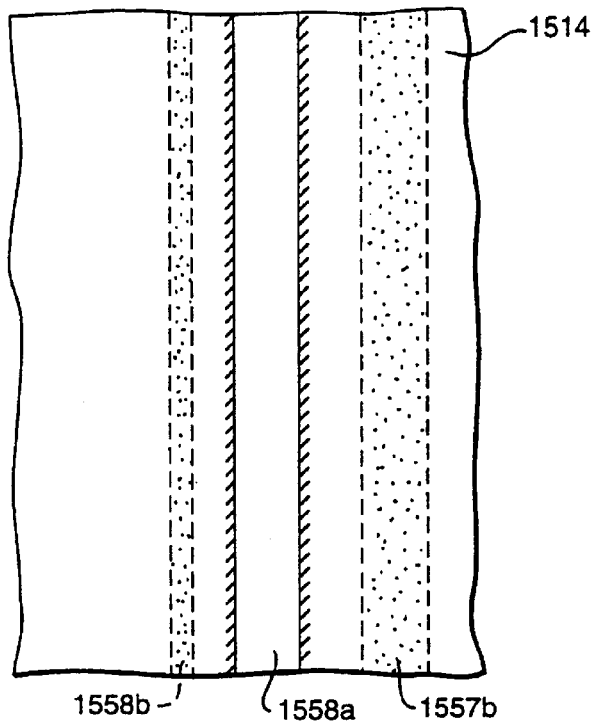

FIG. 15F

| RESIST NAME<br>EXPOSURE BEAM | POSITIVE RESIST | NEGATIVE RESIST |
|---|---|---|
| I-LINE<br>(365nm) | ① HITACHI KASEI<br>[RAY CAST RI-7000P]<br>② SHIPLEY COMPANY INC.<br>[TITAN LINE SERIES] | ① HITACHI KASEI<br>[RU1100N]<br>② TOKYO OHKA KOGYO<br>[ONNR20 SERIES] |
| KrF<br>EXCIMER LASER<br>(248nm) | ① POLYMETHYL METHACRYLATE<br>(ABBREV. PMMA)<br>② SHIPLEY COMPANY INC.<br>(MICROPOSIT) | ① HITACHI KASEI<br>[RD2000N]<br>② FUJI YAKUHIN KOGYO<br>[LMR] |

FIG. 16

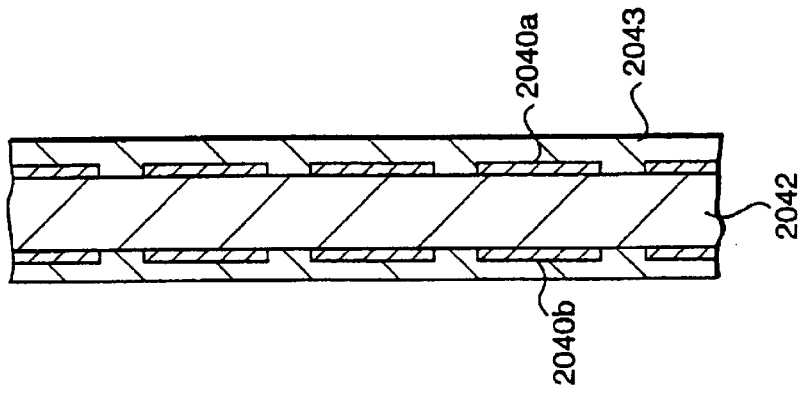
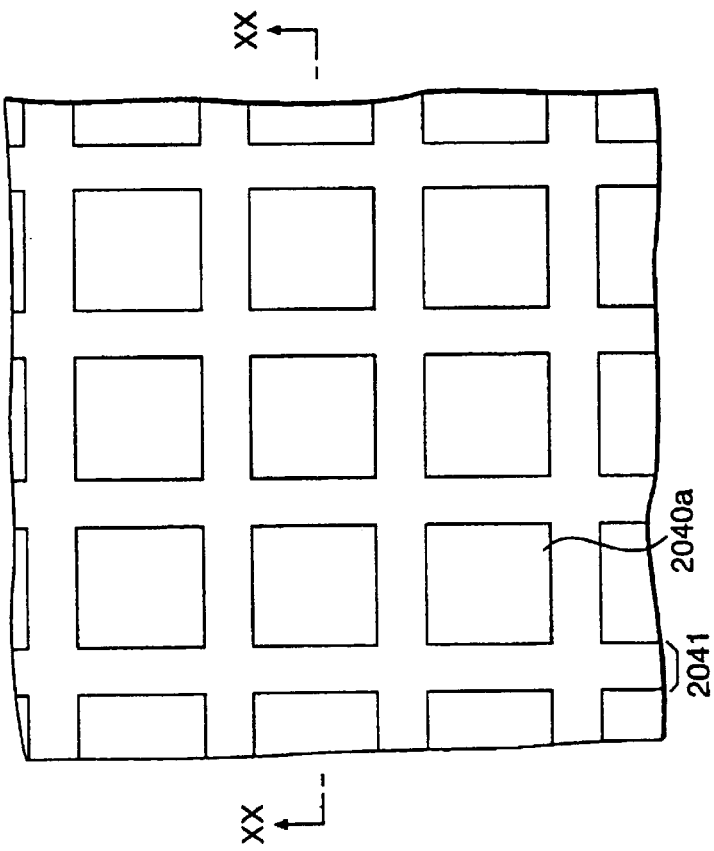

PROCESS FOR FABRICATING SEMICONDUCTOR INTEGRATED CIRCUIT DEVICE, AND EXPOSING SYSTEM AND MASK INSPECTING METHOD TO BE USED IN THE PROCESS

This is a continuation application of U.S. Ser. No. 09/567,158, filed May 9, 2000 (now U.S. Pat. No. 6,309, 800), which is a continuation application of U.S. Ser. No. 08/896,139, filed Jul. 17, 1997 (now U.S. Pat. No. 6,153, 357), which is a continuation application of U.S. Ser. No. 08/478,023, filed Jun. 7, 1995 (now U.S. Pat. No. 5,753, 416), which is a divisional application of U.S. Ser. No. 08/219,726, filed Mar. 29, 1994 (now U.S. Pat. No. 5,455, 144), which is a divisional application of U.S. Ser. No. 08/026,200, filed Feb. 26, 1993 (now U.S. Pat. No. 5,298, 365), which is a continuation of U.S. Ser. No. 07/699,703, filed May 14, 1991 (now abandoned), which is a continuation-in-part of U.S. Ser. No. 07/610,422, filed Nov. 7, 1990 (now abandoned).

BACKGROUND OF THE INVENTION

The present invention relates to an exposure technology and, more particularly, to a technology which is effective if applied to the photolithography process of a semiconductor integrated circuit device.

If the high integration of the semiconductor integrated circuit advances so that the circuit elements and the wiring design rules come to the sub-micron order, the photolithography process for transferring a circuit pattern on a mask onto a semiconductor wafer by making use of a beam of g- or i-line is troubled by a serious problem of a reduction in the precision of the circuit pattern to be transferred onto the wafer. In case, for example, a circuit pattern formed of transparent regions $P_1$ and $P_2$ and a shielding region N over a mask 20, as shown in FIG. 1J-1, is to be transferred onto the wafer, the phases of the lights L just after having passed through the paired transparent regions $P_1$ and $P_2$ interposing the shielding region N are in phase with each other, as shown in FIG. 1J-2. As a result, the two lights interfere with each other at that portion on the wafer, which might otherwise be intrinsically the shielding region, so that they are intensified (as shown in FIG. 1J-3). As a result, the contrast of the projected image on the wafer drops with a reduced focal depth, as shown in FIG. 1J-4, so that the pattern transfer precision is seriously degraded.

As means for solving this problem, there has been proposed a phase shift technology for preventing the drop of the contrast of the projected image by changing the phases of the lights to transmit the mask. In Japanese Patent Publication No. 59296/1987, for example, there is disclosed a phase shifting technology, in which one of the paired transparent regions across the shielding region is formed with a transparent film to establish a phase difference between the lights having passed through the two transparent regions at the time of exposure so that the interfering lights may be weakened at that portion on the wafer, which might otherwise be the shielding region. When a circuit pattern formed on a mask 21, as shown in FIG. 1K-1, is to be transferred onto a wafer, either of the-paired transparent regions $P_1$ and $P_2$ interposing the shielding region N in between is formed with a transparent film 22 having a predetermined refractive index. By adjusting the thickness of the transparent film 22, moreover, the individual lights having passed through the transparent regions $P_1$ and $P_2$ go out of phase of 180 degrees, as shown in FIG. 1K-2, so that they interfere with each other in the shielding region N on the wafer and are weakened (as shown in FIG. 1K-3). As a result, the contrast of the projected image on the wafer is improved, as shown in FIG. 1K-4, to improve the resolution and the focal depth and accordingly the transfer precision of the circuit pattern formed on the mask 21.

In Japanese Patent Laid-Open No. 67514/1987, on the other hand, there is disclosed a phase shift technology, in which a phase difference is established between a light having passed through a transparent region and a light having passed through a fine opening pattern, by removing the shielding region of a mask partially to form the opening pattern and by forming a transparent film in either the opening pattern or the transparent region existing in the vicinity of the opening pattern, so that the light having passed through the transparent region may be prevented from having its amplitude distribution expanded transversely.

The phase shifting method, by which one mask is formed thereon with an ordinary pattern (or main pattern) and a shifter pattern (or accompanying or complementary pattern) for giving a phase opposed to that of the former, will be called hereinafter the "on-mask phase shifting method" and will be called the "on-mask phase inversion shifting method" especially in case the phase shift is $(2n+1)\pi$ (wherein n: an integer).

In Japanese Patent Laid-Open No. 109228/1985, moreover, there is disclosed a method, in which two masks are simultaneously illuminated to improve the throughput of a projecting exposure so that the portions of one wafer corresponding to different chips may be simultaneously exposed. In Japanese Patent Laid-Open No. 107835/1985, on the other hand, there is disclosed a technology, in which two masks having an identical pattern can be exposed without any trouble even if one of them is defective, by dividing one exposing line into two halves to illuminate the identical portion of the two masks and by composing them to expose the wafer.

However, these two disclosures are not effective in the least for improving the resolution although they are effective for preventing the defect on the mask pattern from being transferred onto the wafer or for improving the throughput.

SUMMARY OF THE INVENTION

According to our examinations, the aforementioned phase shifting technology of the prior art, in which the transmitting region of the mask is in its portion with the transparent film so that a phase difference may be established between the light having passed therethrough and the light having passed through the neighborhood transmitting region, is troubled by a problem that the manufacture of the mask takes a long time period and many works.

Specifically, the actual mask formed with an integrated circuit pattern is complicated by various patterns so that the mask makes it seriously difficult to select the place to be arranged with the transparent film thereby to exert serious restrictions upon the pattern design. In case the mask is formed with the transparent film, on the other hand, in addition to the step of inspecting the existence of a defect in the integrated circuit pattern, there is required a step of inspecting the existence of a defect in the transparent film so that the mask inspecting step is seriously complicated. In case, moreover, the mask is formed with the transparent film, foreign substances to be caught by the mask are increased to make it difficult to prepare a clean mask.

An object of the present invention is to provide a phase shifting technology which has succeeded in solving the above-specified problems.

Another object of the present invention is to provide a size-reducing projection exposure technology which is enabled to give the best image plane to the individual planes to be exposed, if stepped, by a single exposure.

A further object of the present invention is to provide a projection exposure technology which can extend the exposure limit of a fine pattern by violet or ultraviolet rays to a finer range.

A further object of the present invention is to provide a projection exposure technology which can compose and expose two master patterns.

A further object of the present invention is to provide a size-reducing projection exposure technology which can compose and interfere two mask patterns to be projected and exposed, even in case an interference distance of a light source is short.

A further object of the present invention is to provide a mask pattern layout technology which is useful for fabricating an integrated circuit by using the phase shifting method.

A further object of the present invention is to provide a projection exposure technology which is useful for fabricating an SRAM by using the phase shifting method or the like.

A further object of the present invention is to provide an exposure technology which is useful for fabricating a highly integrated semiconductor circuit such as a DRAM having a fine size as small as the exposure wavelength.

A further object of the present invention is to provide a projection exposure technology which is effective for exposing a periodic fine pattern.

A further object of the present invention is to provide a projection exposure technology which is effective if applied to an excimer laser exposure technology.

A further object of the present invention is to provide a mask inspection technology which is useful for inspecting a mask to be used in the phase shifting method.

The invention to be disclosed hereinafter will be briefly described in the following in connection with its representatives.

According to one representative of the present invention, there is provided the following exposure method. When a predetermined pattern, which is formed on a mask and composed of a shielding region and a transparent region, is to be transferred onto a specimen to be illuminated, by irradiating the mask with a light and irradiating the specimen with the light having passed through the transparent region of said mask, the light emitted from a light source is divided into two lights, and the phases of the two lights immediately after having passed through different portions of said mask are opposed to each other by changing the individual optical lengths for said two lights to reach said mask. After this, said two lights are composed to illuminate said specimen.

According to the above-specified means, the two lights immediately after having passed through the different portions of the mask have their phases opposed to each other and are then composed to illuminate the specimen. As a result, one light having passed through a predetermined transparent region on the mask and the other light having passed through another transparent region on the mask interfere with each other and are weakened in their boundary regions at the portions, in which they are arranged close to each other, so that the projected image has its contrast improved drastically.

BRIEF DESCRIPTION OF THE DRAWINGS

FIG. 1B is an enlarged section showing a mask according to the aforementioned embodiment of the present invention;

FIGS. 1C-1 and 1C-2 are top plan views showing a pair of circuit patterns formed on the mask;

FIG. 1C-3 is a top plan view showing a circuit pattern which is obtained by composing the paired circuit patterns;

FIGS. 1D-1 to 1D-5 are explanatory diagrams showing the amplitudes and intensity of the lights which have passed through the transparent region of the circuit patterns shown in FIGS. 1C-1 and 1C-2;

FIGS. 1E-1 and 1E-2 are top plan views showing a pair of registering marks formed on the mask;

FIG. 1E-3 is a top plan view showing a circuit pattern which is obtained by composing those paired registering marks;

FIGS. 1F-1 and 1F-2 are top plan views showing another example of a pair of circuit patterns formed on a mask according to Embodiment 1-II of the present invention;

FIG. 1F-3 is a top plan view showing a circuit pattern which is obtained by composing the paired circuit patterns;

FIGS. 1G-1 to 1G-5 are explanatory diagrams showing the amplitudes and intensity of the lights which have passed through the transparent regions of the circuit patterns shown in FIGS. 1F-1 and 1F-2;

FIGS. 1H-1 and 1H-2 are top plan views showing other examples of a pair of circuit patterns which are formed on a mask according to Embodiment 1-III of the present invention;

FIG. 1H-3 is a top plan view showing a circuit pattern which is obtained by composing the paired circuit patterns;

FIGS. 1I-1 to 1I-5 are explanatory diagrams showing the amplitudes and intensity of the lights which have passed through the transparent regions of the circuit patterns shown in FIGS. 1H-1 and 1H-2;

FIGS. 1J-1 to 1J-4 are explanatory diagrams showing the amplitudes and intensity of the lights which have passed through the transparent regions of the mask of the prior art; and FIGS. 1K-1 to 1K-4 are explanatory diagrams showing the amplitudes and intensity of the lights which have passed through the transparent regions of the mask of the prior art having the transparent film.

FIGS. 2B-1 and 2B-2 are top plan views showing examples of the individual pattern structures of the masks of FIG. 2A, and FIG. 2B-3 is a top plan view showing a desired pattern which is formed by those patterns;

FIGS. 2C-1 and 2C-2 are top plan views showing essential portions of examples of the individual pattern structures of the masks of FIG. 2A, and FIG. 2C-3 is a top plan view showing a desired pattern which is formed by those patterns;

FIGS. 2D-1 and 2D-2 are top plan views showing essential portions of examples of the individual pattern structures of the masks of FIG. 2A, and FIG. 2D-3 is a top plan view showing a desired pattern which is formed by those patterns;

FIGS. 2E-1 and 2E-5 are explanatory diagrams showing the amplitudes and intensity of the lights which have passed through the transparent regions of the masks of FIGS. 2B-1 to 2B-3;

FIGS. 2F-1 to 2F-5 are explanatory diagrams showing the amplitudes and intensity of the lights which have passed through the transparent regions of the masks of FIGS. 2C-1 to 2C-3;

FIGS. 2G-1 to 2G-5 are explanatory diagrams showing the amplitudes and intensity of the lights which have passed through the transparent regions of the masks shown in FIGS. 2D-1 to 2D-3.

FIGS. 2I-1 to 2I-3 are explanatory diagrams showing a pattern registering method to be used in the system of the present invention.

FIG. 3C-1 is a top plan view showing a main mask pattern (or positive mask) which corresponds to a stepped periodic pattern of the aforementioned embodiment;

FIG. 3C-2 is also a top plan view showing a sub-mask pattern;

FIG. 3C-3 is a top plan view showing a composed opening pattern;

FIG. 3C-4 is a section showing a periodic step portion of the semiconductor integrated circuit device which is being fabricated on the exposed wafer;

FIG. 3E-1 is a top plan view showing that one of the phase shift registering marks of the foregoing embodiment, which is formed in the main pattern portion;

FIG. 3E-2 is a top plan view showing the phase registering opening pattern which is formed in the same sub-pattern; and FIG. 3E-3 is a top plan view showing the composed projection pattern.

FIG. 4 is a schematic section showing a stepper system of Embodiment 4 of the present invention.

FIG. 6E is a top plan view showing a mask pattern corresponding to an "L"-shaped pattern according to a modification of FIG. 6D;

FIG. 6F is a top plan view showing a mask pattern corresponding to a bent isolated band pattern according to Embodiment 6 of the present invention;

FIGS. 7J to 7P are flow sections showing the wafer step of an SRAM corresponding to FIG. 7I of the present invention.

FIGS. 8A-1 to 8O-2 are flow sections showing the wafer step of a DRAM according to Embodiment 8 of the present invention;

FIG. 10 is a diagram showing several conditions of an exposing monochromatic light source to be used in the exposure method of the present invention.

FIG. 13A is a simplified front section showing a step-and-repeat type 5:1 size-reducing projection exposure system of Embodiment 13 of the present invention using two light sources which are not coherent with each other; and FIG. 13B is a mask or wafer top plan view showing the layout of a unit exposure region to be exposed by the exposing method of FIG. 13A.

FIGS. 15E and 15F are top plan layouts corresponding to FIGS. 15B and 15C, respectively.

FIG. 16 is a table enumerating photo resists to be used for practicing the present invention.

FIG. 20B is a top plan view showing the same two-dimensional phase shifting plate;

FIG. 20C is a section showing the same two-dimensional phase shifting plate; and FIG. 20D is a table showing crystals having the electrochemical effect to be used in the same phase shifting plate.

DETAILED DESCRIPTION OF THE INVENTION

The following description of the embodiments of the present invention will be divided into a plurality of items for conveniences, but the individual embodiments belong not to different inventions but to portions or modifications of a step relating to a single invention. Therefore, any overlapped portion will not be described unless otherwise necessary. Moreover, the reference numbers to be used in the following embodiments designate the parts performing identical or similar functions, unless otherwise specified, if they have identical numerals in the lower two figures. (1) Embodiment 1

Figure 1A:
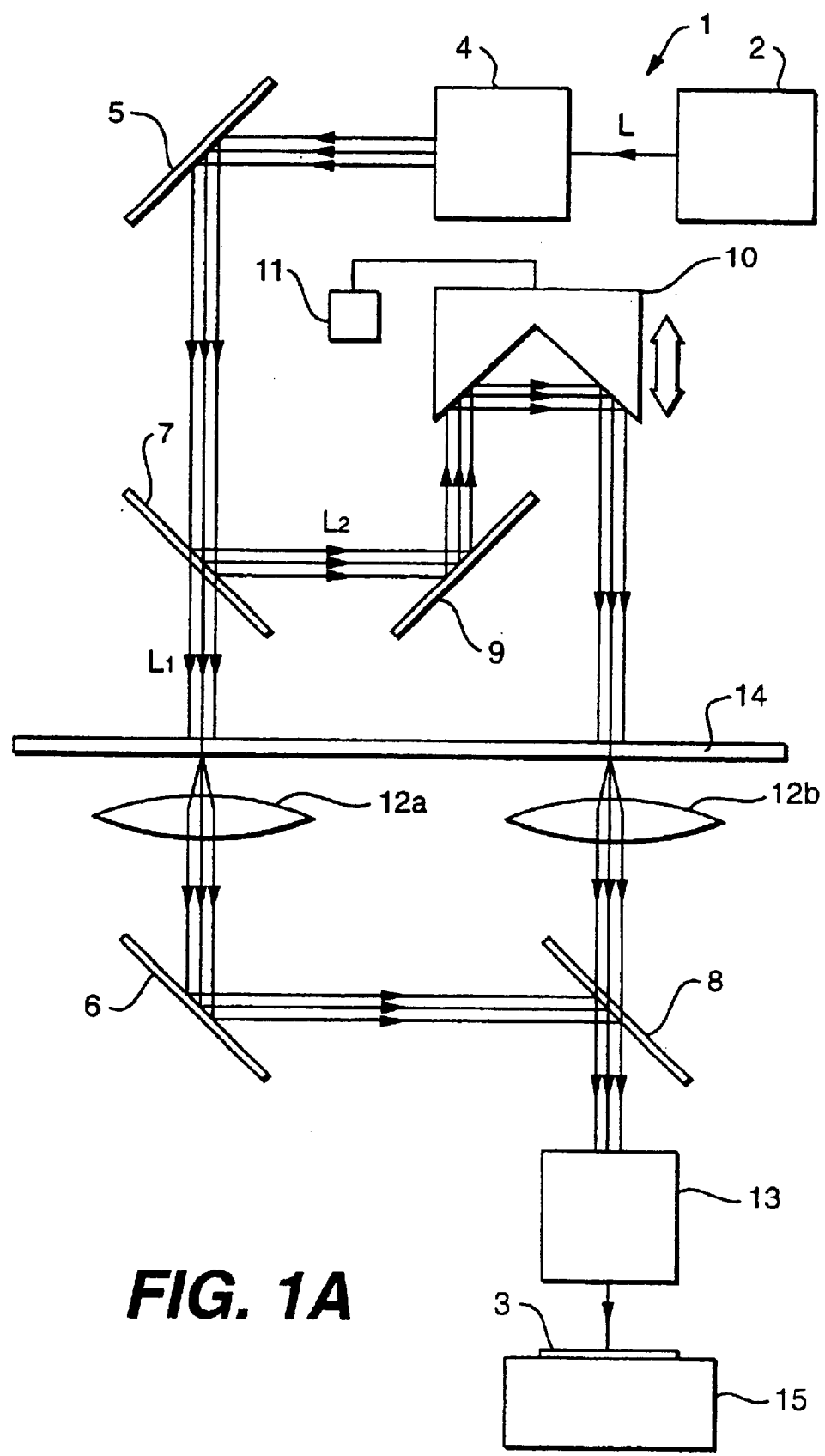
FIG. 1A is a diagram showing the whole structure of a phase shifting mechanism which is disposed in an exposure system according to an embodiment 1-I of the present invention.

FIG. 1A shows a phase shifting mechanism 1 of an exposure system according to Embodiment 1-I of the present invention.

The phase shifting mechanism 1 is constructed of an optical system which is interposed between a light source 2 for the exposure system and a specimen 3 to be irradiated and which includes a beam expander 4, mirrors 5, 6 and 9, half mirrors 7 and 8, a corner mirror 10, an optical path varying mechanism 11 for driving the corner mirror 10 finely, a pair of lenses 12a and 12b, and a size-reducing lens 13. In the alignment system of this optical system, there is positioned a mask 14 which is formed with the original image of a pattern to be transferred to the aforementioned irradiated specimen 3. The mask 14 is a one (e.g., reticle) to be used in the process for fabricating a semiconductor integrated circuit device, for example, and the irradiated specimen 3 is a semiconductor wafer which is made of single crystal of silicon, for example.

A light L such as the i-line (having a wavelength of 365 nm) emitted from the light source 2 is expanded by the beam expander 4 and is then refracted through the mirror 5 in a direction normal to the principal plane of the mask 14. After this, the refracted light is divided through the half mirror 7 disposed midway of the optical path into two halves: a straight light $L_1$ and a perpendicular light $L_2$. This light $L_2$ is refracted through the mirror 9 and the corner mirror 10 until it irradiates another portion of the mask 14 by way of a path different from that of the light $L_1$. These two lights $L_1$ and $L_2$ thus having passed through the different portions of the mask 14 are guided through the lenses 12a and 12b and are then composed into one light L' through the mirror 6 and the half mirror 8. After this, the single light L' is reduced by the size-reducing lens 13 and irradiates the specimen 3 which is positioned on an X-Y table 15.

Since the aforementioned phase shifting mechanism 1 has different optical paths of the two lights $L_1$ and $L_2$ from the half mirror 7 to the mask 14, a desired phase difference can be established between the two lights $L_1$ and $L_2$ immediately after passage through the mask 14 by changing the height (or the optical path of the light $L_2$) from the principal plane of the mask 14 to the corner mirror 10. For example, the phases of the two lights $L_1$ and $L_2$ immediately after having passed through the mask 14 can be opposed to each other (to give a phase difference of 180 degrees) by moving the corner mirror 10 vertically from an origin, which is assumed to be the position of the corner mirror 10 when the two lights $L_1$ and $L_2$ immediately after having passed through the mask 14 are in phase, by a distance (d) which is defined by the following formula:

$$d=(2m+1)\lambda/4$$

($\lambda$: wavelength of the light; and m: an integer).

The vertical movement of the aforementioned corner mirror 10 can be accomplished by using the optical path varying mechanism 11 using a piezoelectric control element or the like.

FIG. 1B is an enlarged view showing the section of the aforementioned mask 14.

This mask 14 is made of transparent synthetic quartz having a refractive index of about 1.47 and has its principal plane formed with a metal layer of Cr or the like having a film thickness of about 500 to 3,000 Å. For the exposure, the metal layer 16 provides shielding regions A for inhibiting transmission of lights, and the remaining region provides a transparent region B for transmitting lights. An integrated circuit pattern is formed of the aforementioned shielding regions A and transparent region B and has a size of five times as large as the actual one, for example.

Figures 1, 1D:
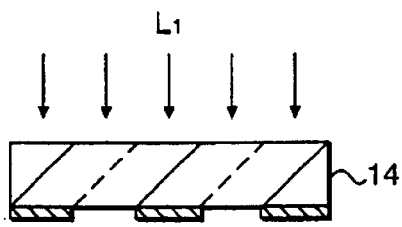
Figures 1, 1D, 2:
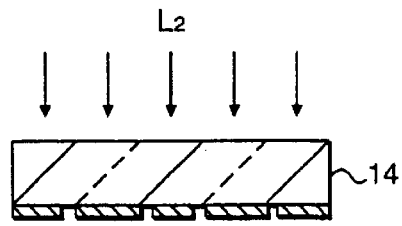
Figures 1, 1D:
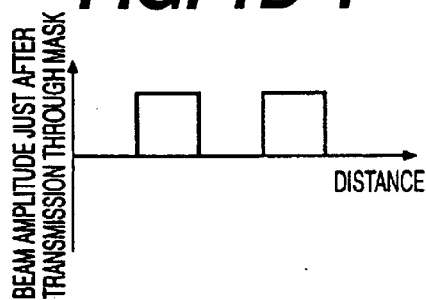
Figures 1, 1D, 2:
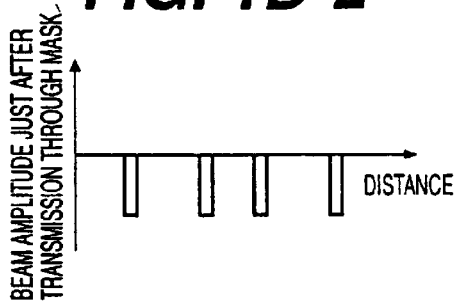

FIGS. 1C-1 and 1C-2 present examples of the integrated circuit patterns formed on the aforementioned mask 14. A circuit pattern $P_1$, as shown in FIG. 1C-1, is formed of the hatched shielding region A and the L-shaped transparent regions B, for example, which are surrounded by that shielding region A. On the other hand, the transparent regions B of a circuit pattern $P_2$, as in FIG. 1C-2, are patterned by arranging the shielding regions A, which have the same shape and size as those of the transparent regions B of the circuit pattern $P_1$, in the transparent regions B, which have the same shape but an enlarged size as that of the transparent regions B of the circuit pattern $P_1$. In other words, the transparent regions B of the circuit pattern $P_2$ are substantially identical to the patterns of the peripheral portions of the transparent regions B of the circuit pattern $P_1$. These two circuit patterns $P_1$ and $P_2$ are paired to transfer the (hatched) circuit pattern P, as indicated in FIG. 1C-3, highly precisely to the wafer, and are arranged in predetermined portions of the mask 14 and at a predetermined pitch.

Next, the method of preparing the aforementioned mask 14 will be briefly described in the following.

First of all, a synthetic quartz plate has its surface polished and rinsed. After this, a Cr film having a thickness of about 500 to 3,000 Å, for example, is deposited all over the principal plane of the quartz plate by the sputtering method. Subsequently, a photo resist is applied to the whole surface of the Cr film. Next, on the basis of the integrated circuit pattern data which are coded in advance in a magnetic tape or the like, an integrated circuit pattern is drawn on the photo resist by an electron beam exposing method. After this, the exposed portion of the photo resist is removed by a development, and the exposed Cr film is removed by a wet etching to form the integrated circuit pattern. The pattern data of the aforementioned paired circuit patterns $P_1$ and $P_2$ can be automatically prepared either by expanding or reducing the data of the shielding region A or the transparent regions B of one of the circuit patterns or by taking a logical product between the inverted data of one circuit pattern and the data of the other circuit pattern. For example, the pattern data of the circuit pattern $P_2$ can be automatically prepared by taking a logical product between the enlarged data of the pattern of the transparent regions B of the circuit pattern $P_1$ and the inverted data of the transparent regions B of the circuit pattern $P_1$.

In order that the integrated circuit pattern prepared on the aforementioned mask 14 may be transferred onto the wafer 3, the wafer 3 having the photo resist applied to its surface is positioned is positioned at first on the X-Y table 15 of the aforementioned exposing system shown in FIG. 1, and the mask 14 is then positioned in the alignment system. Specifically, this mask 14 is so positioned that, when one light $L_1$ divided by the half mirror 7 is guided to irradiate one $P_1$ of the aforementioned paired circuit patterns $P_1$ and $P_2$, the other light $L_2$ may be precisely guided to irradiate the other circuit pattern $P_2$. Next, the corner mirror 10 is vertically moved to adjust the phase difference such that the two lights $L_1$ and $L_2$ immediately after having passed through the mask 14 may be opposed to each other. In order to perform the positioning of the mask 14 and the adjustment of the phase difference between the two lights $L_1$ and $L_2$ precisely, there are used, for example, a pair of positioning marks $M_1$ and $M_2$ which are formed on the mask 14, as shown in FIGS. 1E-1 and 1E-2. Each of the marks $M_1$ and $M_2$ is formed of a pattern, which has the hatched shielding region A and the transparent regions B having a square shape, for example, and surrounded by the shielding region A, and have absolutely identical size and shape. In case the positioning of the mask 14 and the adjustment of the phase difference between the lights $L_1$ and $L_2$ are precisely accomplished, the light $L_1$ having passed through the mark $M_1$ and the light $L_2$ having passed through the $M_2$ interfere with each other and completely disappear so that a projected image M of the marks $M_1$ and $M_2$ is not formed on the wafer 3. In other words, whether or not the positioning of the mask 14 and the adjustment of the phase difference between the lights $L_1$ and $L_2$ are precisely accomplished can be easily decided by discriminating the presence of the projected image M on the wafer 3.

After the positioning of the mask 14 and the adjustment of the phase difference between the light $L_1$ and $L_2$ have been thus accomplished, the original image of the integrated circuit pattern formed on the mask 14 is optically reduced to ⅕, for example, and projected on the wafer 3. The aforementioned operations are repeated while moving the wafer 3 sequentially stepwise.

FIG. 1D-1 is a section showing the mask 14 in the region where the aforementioned circuit pattern $P_1$ is formed, and FIG. 1D-2 is a section showing the mask 14 in the region where the aforementioned pattern $P_2$ is formed.

The light $L_1$ immediately after having passed through the transparent regions B of the circuit pattern $P_1$ and the light $L_2$ immediately after having passed through the transparent regions B of the circuit pattern $P_2$ are opposed in phase to each other, as shown in FIGS. 1D-1' and 1D-2'. Since, moreover, the transparent regions B of the circuit pattern $P_2$ are identical to the patterns of the peripheral portions of the transparent regions B of the circuit pattern $P_1$, the composed light $L_1$ of the two lights $L_1$ and $L_2$ take the amplitude which is shown in FIG. 1D-3. As a result, if the composed light L' irradiates the wafer 3, it is weakened by the interference at the boundary of the original lights $L_1$ and $L_2$, as indicated in FIG. 1D-4. As a result, as shown in FIG. 1D-5, the contrast of the image projected on the wafer 3 is drastically improved to improve the resolution and the focal depth drastically.

Thus, in the exposing system of the present Embodiment 1, the light L emitted from the light source 2 is divided into the two lights $L_1$ and $L_2$, and these two lights $L_1$ and $L_2$ immediately after having passed through the mask 14 are opposed in phase to each other by changing the optical paths for the two lights $L_1$ and $L_2$ to reach the mask 14. After this, these two lights $L_1$ and $L_2$ are composed to irradiate the wafer 3. Moreover, the mask 14 of the present Embodiment 1 has such paired circuit patterns $P_1$ and $P_2$ that the transparent regions B of one circuit pattern $P_2$ are identical to the patterns of the peripheral portions of the transparent regions B of the other circuit pattern $P_1$. As a result, by transferring the integrated circuit pattern formed on the aforementioned mask 14 onto the wafer 3 by using the aforementioned exposing system, the light L', which is obtained by composing the light $L_1$ having passed through the transparent regions B of the circuit pattern $P_1$ and the light $L_2$ having passed through the transparent regions B of the circuit pattern $P_2$, is weakened by the interference at the boundary between the original lights $L_1$ and $L_2$ so that the contrast of the image projected on the wafer 3 can be drastically improved to transfer the circuit pattern P highly precisely to the wafer.

As a result, the following effects can be attained in the exposing method of the present Embodiment 1-I.

(1) Since the mask need not be equipped thereon with phase shift means such as a transparent film, unlike the phase shifting technology of the prior art, there is no restriction on the pattern design. In the present Embodiment 1-I, when one circuit pattern is to be transferred onto the wafer, a pair of circuit patterns have to be formed on the mask. These paired circuit patterns can be automatically formed either by expanding or reducing the data of the shielding region or transparent regions of one circuit pattern or by taking a logical product between the inverted data of one circuit pattern and the data of the other circuit pattern.

(2) There is no necessity for that step for inspecting the existence of a defect in the transparent film, which has been indispensable for the phase shifting technology of the prior art. In the present Embodiment 1-I, the defect inspection of the paired circuit patterns can be practiced like the ordinary mask by making a comparison with the original pattern data. Moreover, the size inspection can also be practiced like the ordinary mask by the laser photometry or the like. As a result, the mask inspecting step is not complicated.

(3) Since the mask is not equipped thereon with the phase shifting means such as the transparent film or the like, it can be rinsed by a method like that of the ordinary mask. As a result, it is possible to form a mask which has no foreign obstacle as in the ordinary mask.

(4) Thanks to the aforementioned items (1) to (3), the transfer precision of the circuit pattern can be improved without requiring neither long time nor much work for preparing the mask.

Figures 1, 1D, 2, 3:
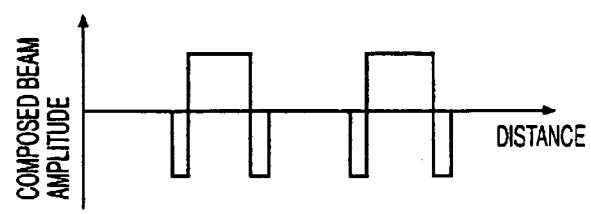
Figures 1, 1D, 2, 3, 4:
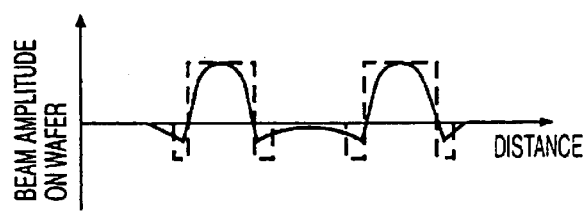
Figures 1, 1D, 2, 3, 4, 5:
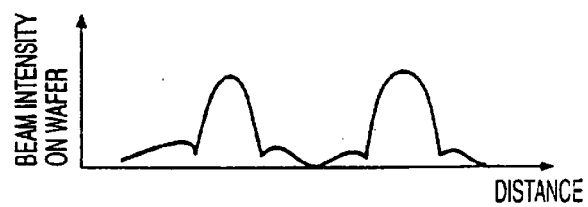
Figures 1, 1E:
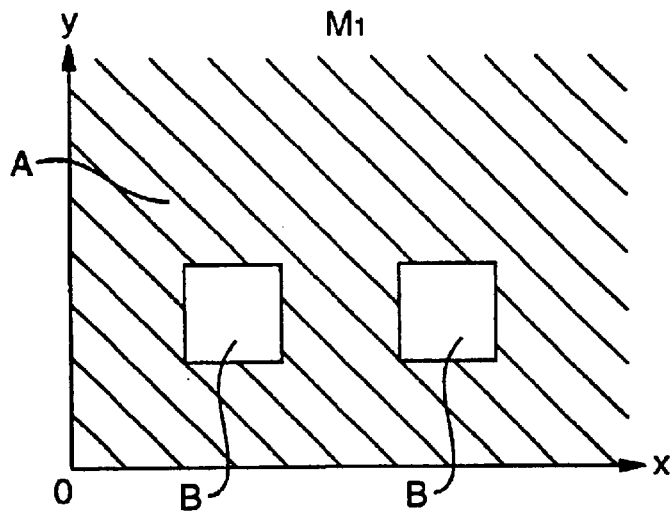
Figures 1, 1E, 2:
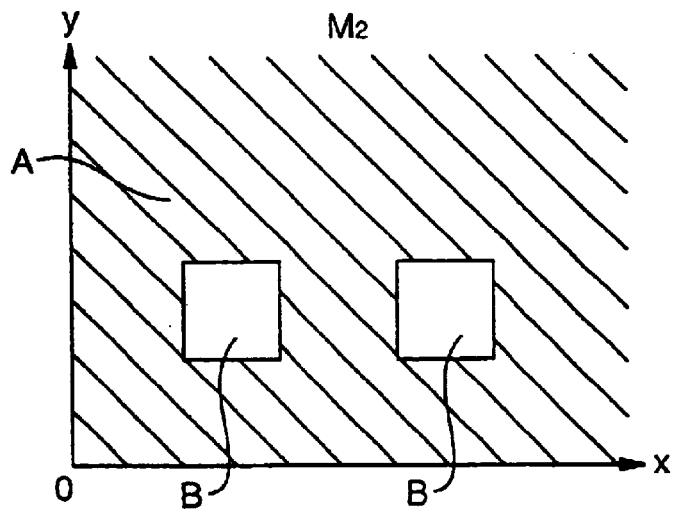
Figures 1, 1E, 2, 3:
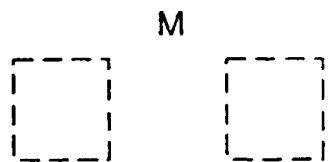
Figures 1, 1F:
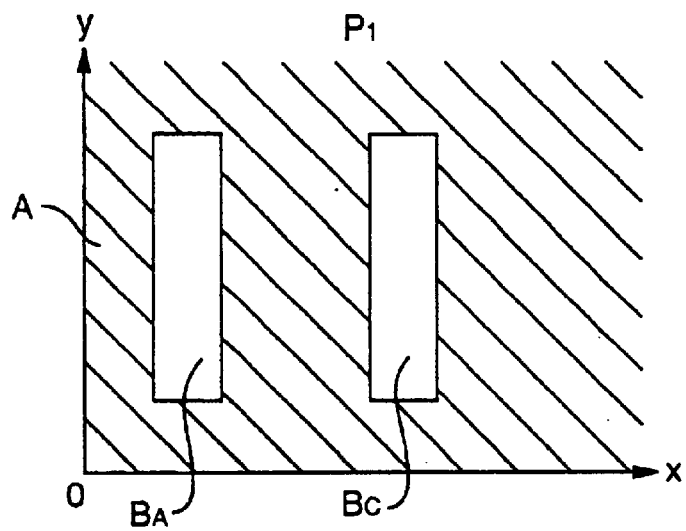
Figures 1, 1F, 2:
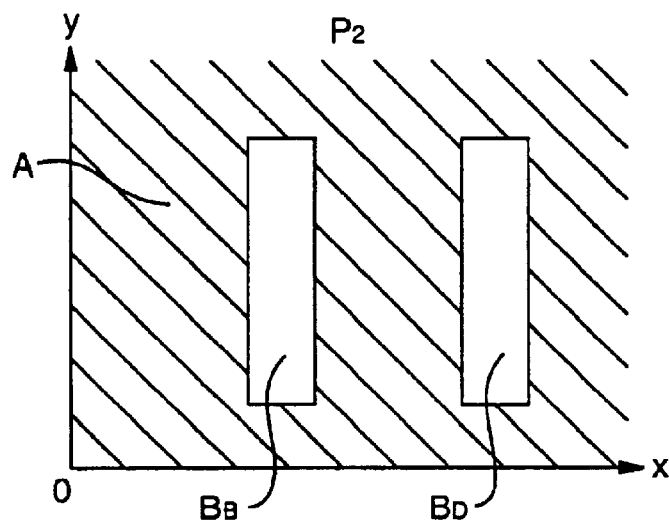
Figures 1, 1F, 2, 3:
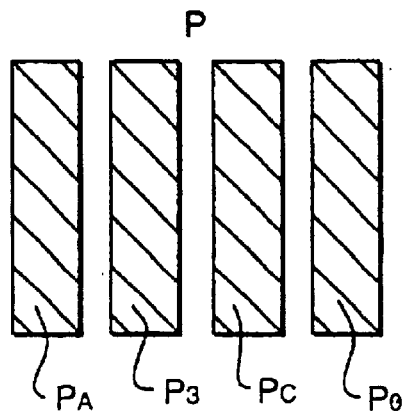

FIGS. 1F-1 and 1F-2 show another example (i.e., Embodiment 1-II) of the paired circuit patterns which are formed on the mask of the foregoing Embodiment 1-I.

Each of the circuit pattern $P_1$ shown in FIG. 1F-1 and the circuit pattern $P_2$ shown in FIG. 1F-2 is formed with the hatched shielding region A and the transparent regions B having a rectangular shape, for example, and enclosed by the shielding region A. The paired circuit patterns $P_1$ and $P_2$ are provided for transferring the (hatched) circuit pattern P, as shown in FIG. 1F-3, highly precisely to the wafer and are arranged in predetermined positions of the mask 14 and at a predetermined spacing. The circuit pattern P includes four patterns $P_A$, $P_B$, $P_C$ and $P_D$ which are identical in size and shape to one another. The transparent region $B_A$ of the circuit pattern $P_1$ corresponds to the pattern $P_A$, and the transparent region $B_C$ of the circuit pattern $P_1$ corresponds to the pattern $P_C$. Moreover, the transparent region $B_B$ of the circuit pattern $P_2$ corresponds to the pattern $P_B$, and the transparent region $B_D$ of the circuit pattern $P_2$ corresponds to the pattern $P_D$. In short, the circuit pattern P is one, in which the individual transparent regions B of the paired circuit patterns $P_1$ and $P_2$ are alternately arranged.

Figures 1, 1G:
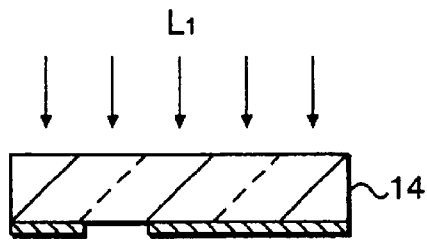
Figures 1, 1G, 2:
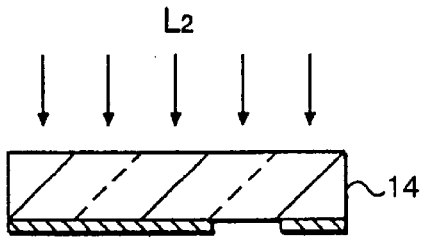
Figures 1, 1G:
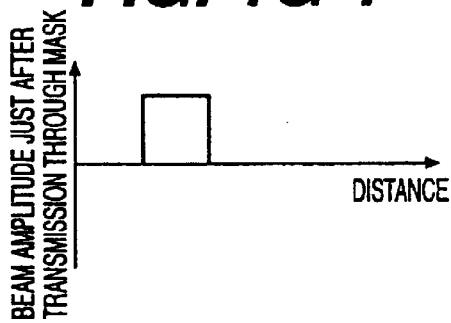
Figures 1, 1G, 2:
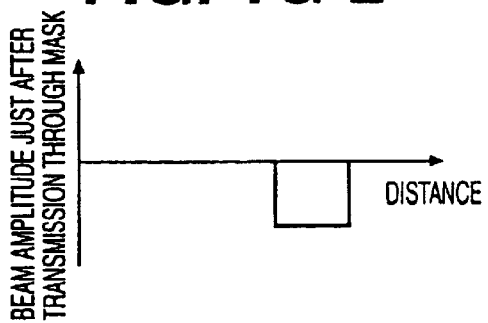
Figures 1, 1G, 2, 3:
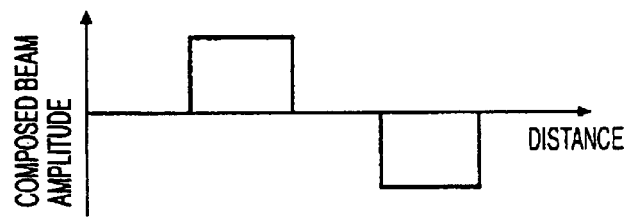
Figures 1, 1G, 2, 3, 4:
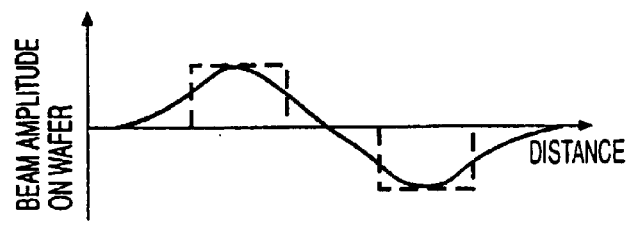
Figures 1, 1G, 2, 3, 4, 5:
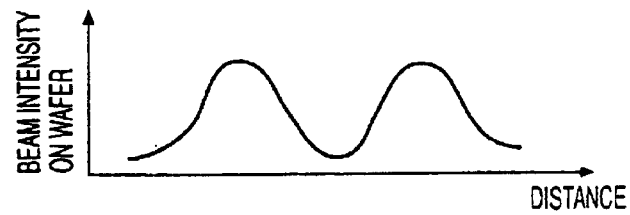

FIG. 1G-1 is a section showing a portion of the mask 14 in the region where the aforementioned circuit pattern $P_1$ is formed, and FIG. 1G-2 is a section showing a portion of the mask 14 in the region where the aforementioned circuit pattern $P_2$ is formed.

The light $L_1$ immediately after having passed through the transparent regions B of the circuit pattern $P_1$ and the light $L_2$ immediately after having passed through the transparent regions B of the circuit pattern $P_2$ are opposed in phase to each other, as shown in FIGS. 1G-1' and 1G-2'. Moreover, the composed light L' of the two lights $L_1$ and $L_2$ have their boundaries close to each other, as shown FIG. 1G-3. As a result, if the composed light L' is guided to irradiate the wafer 3, it interferes and is weakened at the boundary of the original lights $L_1$ and $L_2$, as shown in FIG. 1G-4. As a result, as shown in FIG. 1G-5, the contrast of the image projected on the wafer 3 is drastically improved to improve the resolution and focal depth drastically.

Figures 1, 1H:
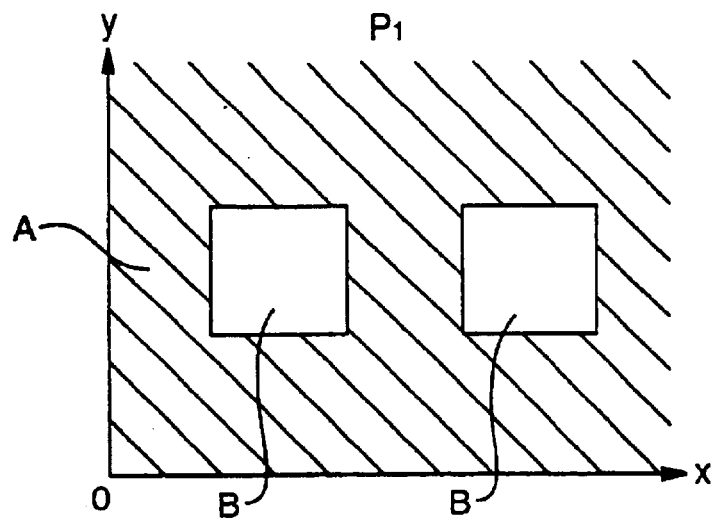
Figures 1, 1H, 2:
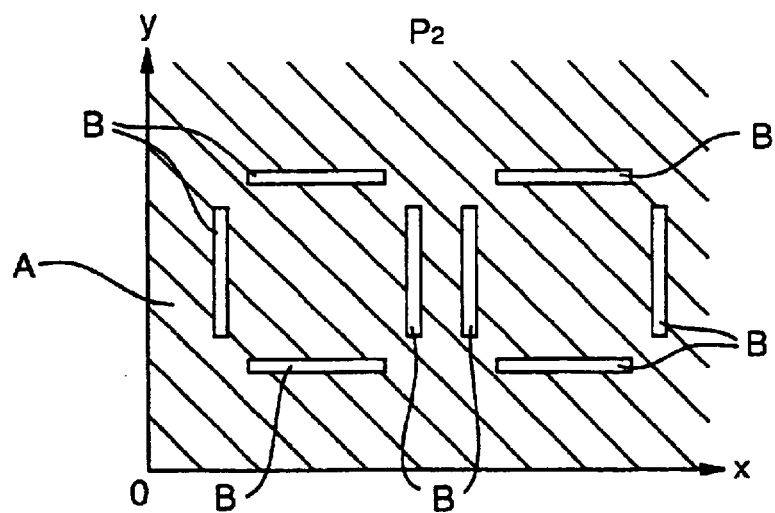
Figures 1, 1H, 2, 3:
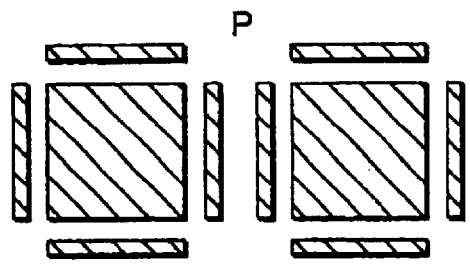
Figures 1, 1J:
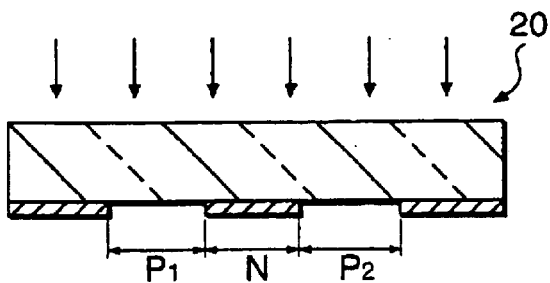
Figures 1, 1J, 2:
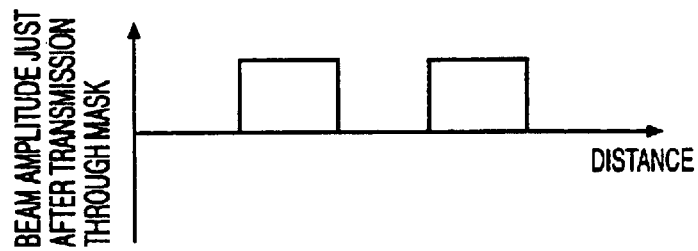
Figures 1, 1J, 2, 3:
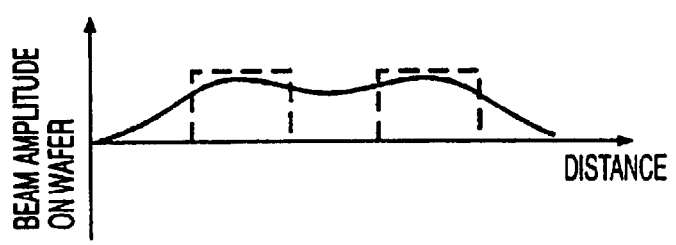
Figures 1, 1J, 2, 3, 4:
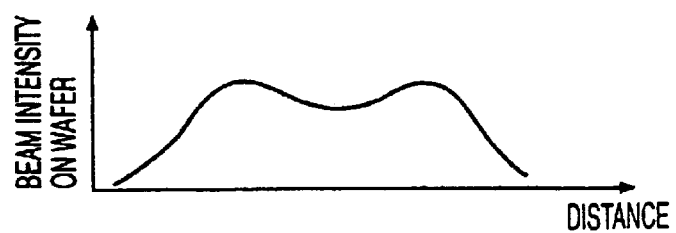

FIGS. 1H-1 and 1H-2 show another example (i.e., Embodiment 1-III) of the paired circuit patterns formed on the mask of the aforementioned Embodiment 1-I.

The circuit pattern $P_1$, as shown in FIG. 1H-1, is formed of the hatched shielding region A and the transparent regions B which have square shapes, for example, and are enclosed by that shielding region A. On the other hand, the transparent regions B of the circuit pattern $P_2$, as shown in FIG. 1H-2, arranged outside of the individual sides of the transparent regions B of the circuit pattern $P_1$. These paired circuit patterns $P_1$ and $P_2$ are provided for transferring the (hatched) circuit pattern P, as shown in FIG. 1H-3, highly precisely to the wafer. The two circuit patterns $P_1$ and $P_2$ are arranged in the predetermined positions on the mask 14 and at a predetermined spacing.

FIG. 1I-1 is a section showing a pattern of the mask 14 in the region wherein the aforementioned circuit pattern $P_1$ is formed, and FIG. 1I-2 is a section showing a portion of the mask 14 in the region wherein the aforementioned circuit pattern $P_2$ is formed.

The light $L_1$ immediately after having passed through the transparent regions B of the circuit pattern $P_1$ and the light $L_2$ immediately after having passed through the transparent regions B of the circuit pattern $P_2$ are opposed in phase to each other, as shown in FIGS. 1I-1' and 1I-2'. Moreover, the composed light $L_1$ of the two lights $L_1$ and $L_2$ have their boundaries close to each other, as shown in FIG. 1I-3. As a result, if the composed light L' is guided to irradiate the wafer 3, it interferes and is weakened at the boundary of the original lights $L_1$ and $L_2$, as shown in FIG. 1I-4. As a result, as shown in FIG. 1I-5, the contrast of the image projected on the wafer 3 is drastically improved to improve the resolution and focal depth drastically.

Although our invention has been specifically described on the basis of its embodiments, it should not be limited to the aforementioned embodiments but can naturally be modified in various manners within the scope thereof.

The description thus far made is directed mainly to the case, in which our invention is applied to the mask used in the process for fabricating a semiconductor integrated circuit device or its background field of application. Despite of this description, however, the present invention should not be limited thereto but can be widely applied to the exposure technology for transferring a predetermined pattern formed on a mask by irradiating a specimen with the light having passed through said mask.

The effects to be attained by the representative of the invention disclosed herein will be briefly described in the following.

Thus, there is provided the following exposure method. When a predetermined pattern, which is formed on a mask and composed of a shielding region and a transparent region, is to be transferred onto a specimen to be illuminated, by irradiating the mask with a light and irradiating the specimen with the light having passed through the transparent region of said mask, the light emitted from a light source is divided into two lights, and the phases of the two lights immediately after having passed through different portions of said mask are opposed to each other by changing the individual optical lengths for said two lights to reach said mask. After this, said two lights are composed to illuminate said specimen.

According to this exposure method, one light having passed through the predetermined transparent regions on the mask and the other light having passed through the other transparent regions on the mask interfere with each other and are weakened at the portions, in which they are arranged close to each other on the specimen, so that the contrast of the projected image can be remarkably improved.

As a result, the transfer precision of the pattern can be improved with neither long time nor much labor for fabricating the mask.

(2) Embodiment 2

The representative of the invention to be disclosed in the present embodiment will be briefly described in the following.

According to the first mode of the present invention, there is provided a mask including first and second patterns each having a shielding region and transparent regions, so that a desired pattern may be formed on a specimen to be irradiated, by irradiating said two kinds of patterns with two lights having a phase difference and at least a partial coherence and by composing the transmitted patterns of said lights, wherein the improvement resides in that said first pattern and said second pattern are formed on either a common substrate or two separate substrates so that the light having passed through the transparent regions of said first pattern and the light having passed through the transparent regions of said second pattern may interfere with each other and be weakened.

According to the second mode of the present invention, there is provided an exposure system comprising: a light source for emitting a luminous flux having at least a partial coherence; luminous flux dividing means for said coherent luminous flux into two halves; an optical phase shifting member disposed in either of the optical paths for composing the luminous fluxes again from said luminous flux dividing means; an optical system for composing the luminous fluxes having passed through a first pattern and a second pattern into a single luminous flux; and an optical system for reducing and projecting said single luminous flux on a specimen to be irradiated, wherein the improvement resides in that the phases of the light having passed through the first pattern and the light having passed through the second pattern are shifted as long as 180 degrees by said optical phase shifting member to form a composed desirable pattern on said specimen.

According to the third mode of the present invention, there is provided an exposure system wherein the first and second patterns on said first mask are irradiated with two lights having a phase difference and at least a partial coherence so that the desired pattern is formed on said specimen by composing the transmitted patterns of said lights.

Incidentally, the luminous flux having at least a partial coherence is intended herein to mean the luminous flux having such coherency as can achieve the interfering and weakening effects.

In the present embodiment, moreover, the boundary is intended to include not only the boundary of the sections forming the aforementioned desired pattern but also the region contained by the two sections.

According to the aforementioned means, in order that the light having passed through the transparent regions of the first pattern and the light having passed through the transparent regions of the second pattern may interfere with each other and be weakened at the boundary required to have the precision of the desired pattern, the first and second patterns on the mask are irradiated with the two lights having a phase difference and at least a partial coherence, so that the desired pattern may be formed on the specimen by composing the transparent patterns of those lights. As a result, it is possible to improve the transfer precision of the boundary which is required to have the precision of the desired pattern.

Figure 2A:
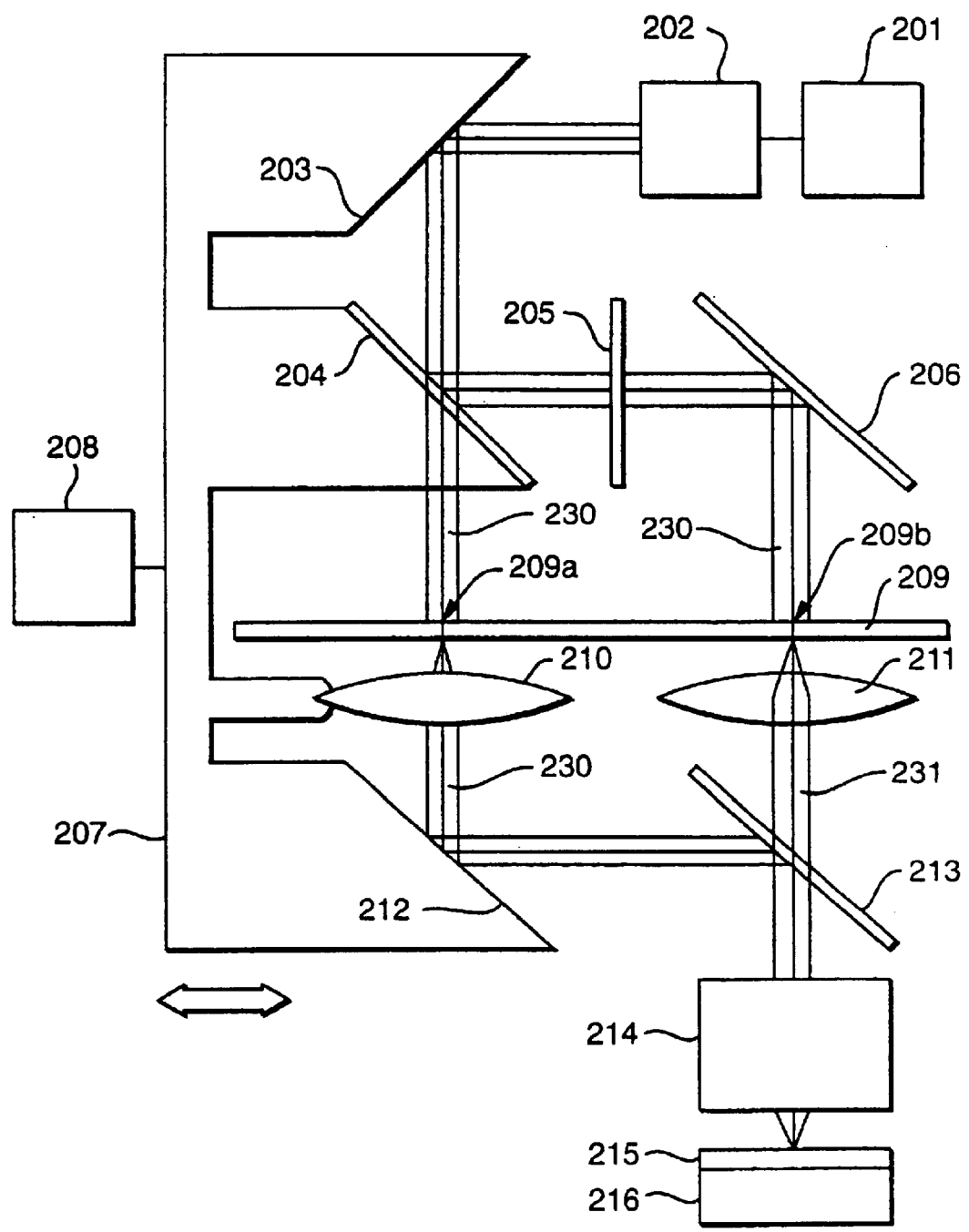
FIG. 2A is a diagram showing the structure of an essential portion of the exposure optical systems according to Embodiment 2 of the present invention.

FIG. 2A is a diagram showing the structure of an essential portion of an exposing optical system according to one embodiment of the exposure system using the mask of the present invention; FIGS. 2B-1 to 2D-3 are top plan views showing an essential portion of the mask of the present invention using the aforementioned exposing optical system; and FIGS. 2E-1 to 2G-5 are explanatory diagrams corresponding to FIGS. 2B-1 to 2D-3 respectively, and showing the amplitudes and intensity of the lights having passed through the mask.

The exposure system of the present embodiment is roughly divided into four functional elements. The first is the (first) element for irradiating a mask 209 with two luminous fluxes having a phase difference; the second is the (second) element made of the mask 209; the third is the (third) element for composing the two lights having passed through the mask 209 to reduce them and irradiate a specimen 215 with the reduced lights; and the fourth is the (fourth) element including an alignment mechanism for adjusting the composition of a single luminous flux.

The first element is constructed to include: a light source 201 for emitting a partially coherent light; an expander 202 for expanding the light emitted from the light source 201; mirrors 203 and 206 for folding the optical path; a half mirror 204 for transmitting an incident light partially and reflecting it partially; and a phase shifting member 205 for changing the phase of the light. On the other hand, the third element is constructed to include: lenses 210 and 211 for arranging two lights having passed through the mask 209 into parallel lights; a mirror 212; a half mirror 213; a size-reducing lens 214 for reducing the light; the specimen 215; and a movable specimen table 216. The fourth element is constructed to include: an alignment mechanism 207 for moving the mirror 203, the half mirror 204, the lens 210 and the mirror 212; and a control circuit 208 for the alignment mechanism 207.

In the aforementioned structure, the mirror 203 is provided for reducing the size of the system in its entirety but may be dispensed with by introducing the light directly from the expander 202. The half mirror 204 has a function to divide the light coming from the expander 202 into two halves and is arranged over the first pattern 209a on the mask 209. The phase shifting member 205 is interposed between the half mirror 204 and the mirror 205 or between the mirror 212 and the half mirror 213 and has an action to shift the phase to a predetermined extent. The phase shifting member 205 is made of a synthetic quartz having a refractive index of 1.47, for example. If the mask 209 is arranged so that a first luminous flux 230 coming from the mirror 212 and a second luminous flux 231 coming from the lens 211 have their phase difference reduced to 0 in the state without the phase shifting member 205, the phase shifting member used has the following thickness d:

$$d = m\lambda/2(n-1) \quad (m\text{: an integer}),$$

wherein: the light source has a wavelength k;
and the member has a refractive index n.

The reason why the phase shifting member 205 is used is to establish the phase difference of 180 degrees at the time of exposure between the lights having passed through the two transparent regions, i.e., the light having passed through the phase shifting member 205 and the light not having passed through the phase shifting member 205. In case, for example, the light to be emitted for the exposure time has a wavelength of $\lambda=0.365$ $\mu$m (i.e., the i-line) whereas the phase shifting member 205 has a refractive index of n=1.5, the phase shifting member 205 may be given a thickness $X_1$ of m (i.e., an integer) times as large as 0.365 $\mu$m.

The mirror 206 is one for guiding the light having passed through the half mirror 204 and the light having passed through the phase shifting member 205 in parallel. Incidentally, the mask 209 has its two patterns 209a and 209b arranged thereon at a right angle with respect to the two lights 330 and 331.

The lenses 210 and 211 are arranged to have their optical axes aligned with the centers of the patterns 209a and 209b, respectively. The half mirror 213 is one for composing the two lights 230 and 231. For this composition, the mirror 212 has a function to fold the light 230.

The alignment mechanism 207 for the fourth element is constructed to include a mechanism for moving that portion of the optical system of the exposure system, which is necessary for the positioning, and is exemplified by a piezoelectric element. In FIG. 2A, the alignment mechanism is constructed to move the mirror 203, the half mirror 204, the lens 210 and the mirror 212. Depending upon the structure of the exposure system, however, the kinds and numbers of the optical elements to be moved are naturally varied. Incidentally, the method of controlling the movement of this alignment mechanism 7 will be described hereinafter.

Next, the structure of the mask 209 or the second element of the present invention will be described in the following.

Figures 1, 2B:
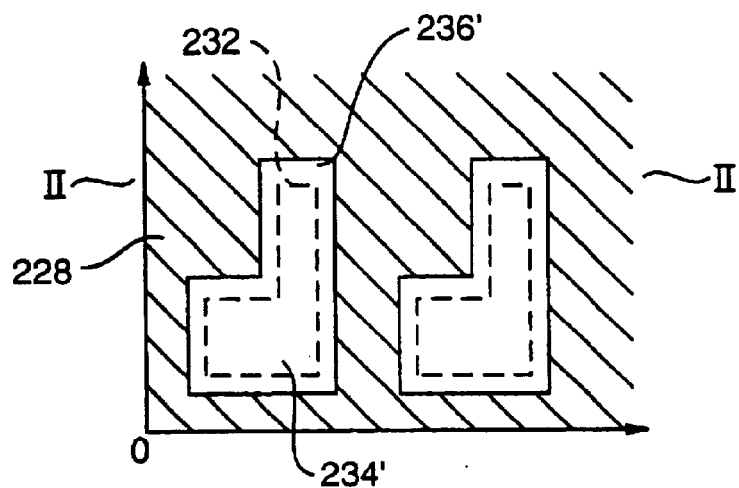
Figures 2, 2B:
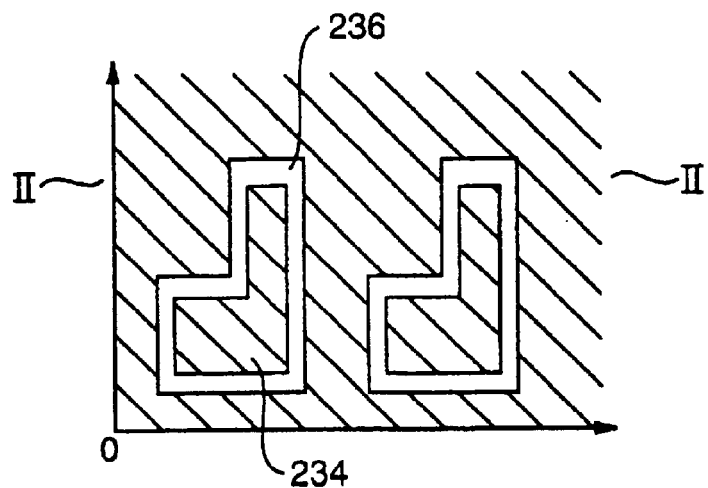
Figures 2, 2B, 3:
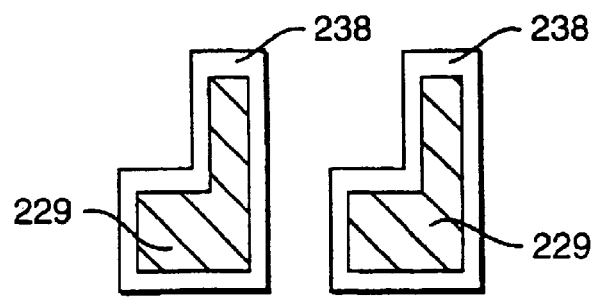

First of all, it is assumed that the (desired) pattern to be formed on the specimen 215 be a pattern having a shape of inverted letter "L" and a two-dimensional extension, as shown in FIG. 2B-3. FIGS. 2B-1 and 2B-2 are top plan views showing individual examples of the first pattern 209a and the second pattern 209b, which are formed on the mask 209 so as to form such desired pattern. These examples are arranged while holding the relative positional relation by considering the desired pattern to be composed by the specimen 215, as shown in FIG. 2B-3.

The first pattern 209a and the second pattern 209b are individually formed by combining the shielding regions and the transparent regions. These patterns may be formed on a single substrate but separately on two glass substrates. In this case, however, even the difference between the thicknesses of the glass substrates is corrected in terms of the thickness of the aforementioned phase shifting member. Incidentally, the transparent regions are indicated by blanks, and the shielding regions are hatched, as shown in FIGS. 2B-1 to 2B-3.

A transparent pattern 232 in FIG. 2B-1 has a transparent region having a shape of inverted letter "L", and a transparent pattern 236 in FIG. 2B-2 has a shielding region 234 having a shape of inverted letter "L", which is made slightly smaller and arranged in the transparent region of the inverted letter "L", so that it takes a band-shaped transparent region 236.

Next, the operations of the present invention will be described in the following.

The light emitted from the light source 201 to have at least a partial coherence is expanded by the expander 202 and has its optical path folded by the mirror 203 until it is divided into two luminous fluxes by the half mirror 204. The half mirror 204 used usually has a transmittance of 50% and a reflectivity of 50% (i.e., equal reflectivity and transmittance). The phase shifting member 205 is arranged in the optical path of one of the two optical systems for the two divided luminous fluxes. The light having passed through the phase shifting member 205 is given a phase difference of 180 degrees and is then guided by the mirror 206 to irradiate the second pattern 209b of the mask 209. On the other hand, the light having passed through the half mirror 204 irradiates the first pattern 209a of the mask 209.

The two luminous fluxes having passed through the two patterns 209a and 209b on the mask 209 are guided again into parallel ones by the lenses 210 and 211 and are then composed. Specifically, the first light 230 having passed through the first pattern 209a has its optical path folded by the mirror 212 and is then composed into a single luminous flux with the second light 231 having passed through the lens 211 by the action of the half mirror 213.

After this, the specimen 215 held on the movable specimen table 216 is irradiated by the size-reducing lens 214 with the composed one of the patterns 209a and 209b at the two portions on the mask 209, to form the desired pattern on the specimen 215.

Here, when the desired pattern shown in FIG. 2B-3 is to be projected, the transfer precision of the pattern of the mask 209 is improved if the transmitted lights of the first pattern 209a and the second pattern 209b are composed with the phase difference of 180 degrees. The reason for that improvement will be described in the following.

First of all, as has been described hereinbefore, by considering the size-reducing ratio, the first pattern 232 of the mask 209 is formed into the pattern 232 which has a slightly larger outer circumference than that of the desired pattern 229 and having the transparent region in its inside. By considering the size reducing ration, moreover, the second transparent pattern 236 is formed into the band-shaped transparent pattern which is prepared by subtracting the shielding pattern 234 having the same size as that of the desired pattern 229 from the first pattern 232.

With this structure, in the peripheral region 238 of the desired pattern 229 to be determined, the transmitted light coming from the second transparent pattern 236 and the transmitted light coming from the band region 236' inside of the first transparent pattern 232 can be weakened as a result of their interference to sharpen the boundary of the desired pattern 229. Since, moreover, the desired pattern 229 is the composition of the shield region 234 at the side of the second pattern and the transparent region 234' having the same size and formed at the side of the first pattern so that it is finally formed like the usual exposure. Incidentally, as shown in FIG. 2B-3, the hatched portions indicate those irradiated with the lights, and the blank regions 238 indicate those which are weakened by the interference, as contrary to the patterns shown in FIGS. 2B-1 and 2B-2.

Figures 1, 2C:
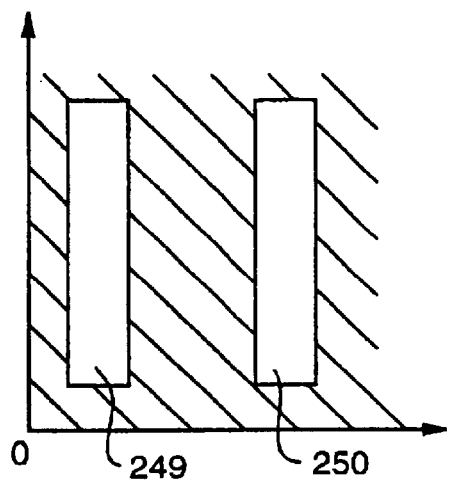
Figures 2, 2C:
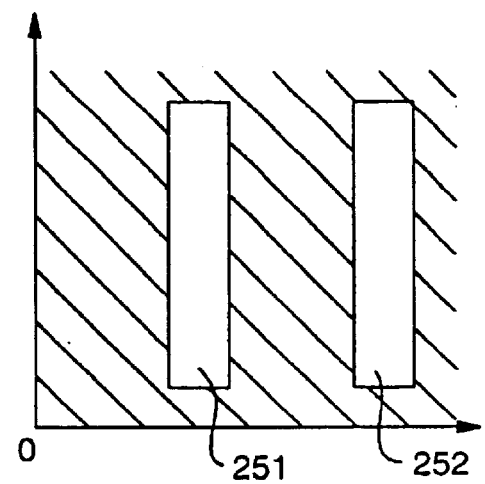
Figures 2, 2C, 3:
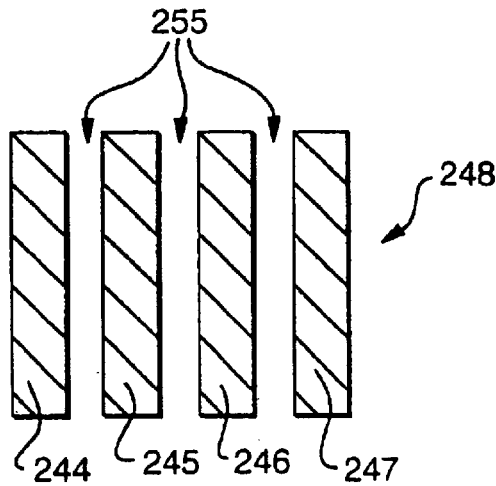
Figures 1, 2D:
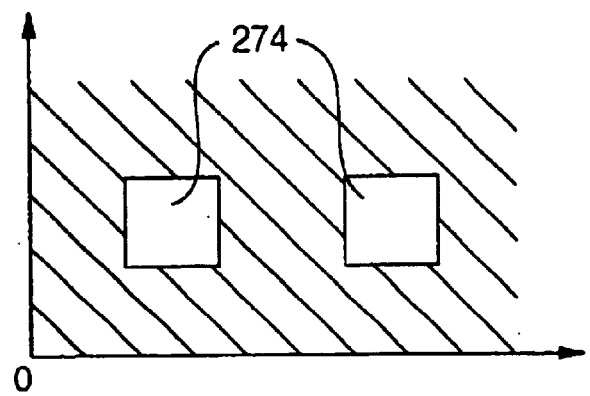
Figures 2, 2D:
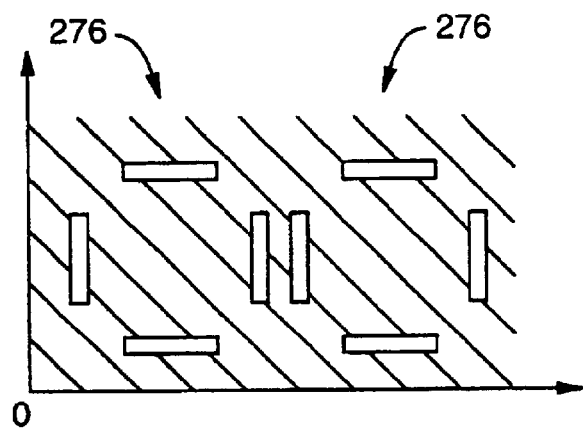
Figures 2, 2D, 3:
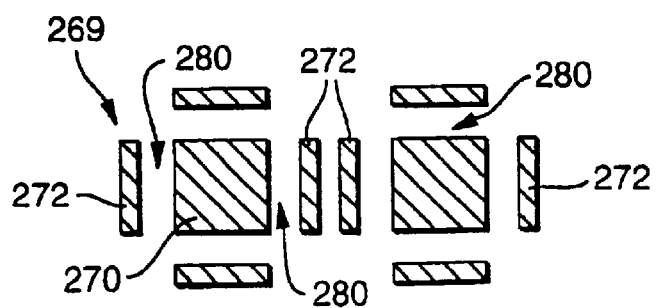
Figures 1, 2E:
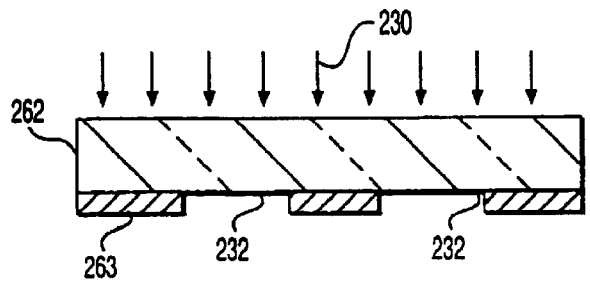
Figures 1, 2E:
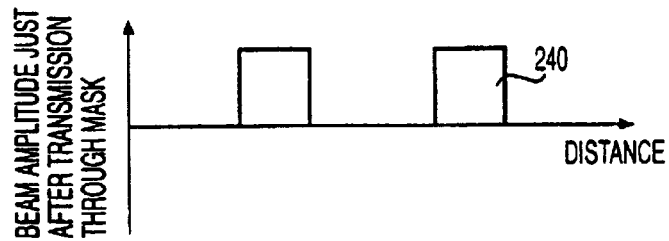
Figures 2, 2E:
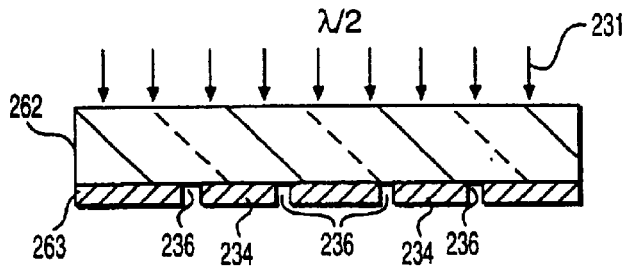
Figures 2, 2E:
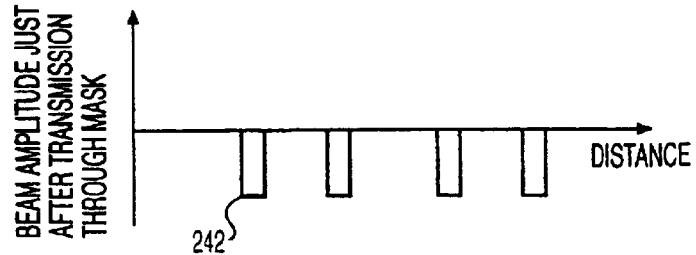
Figures 2, 2E, 3:
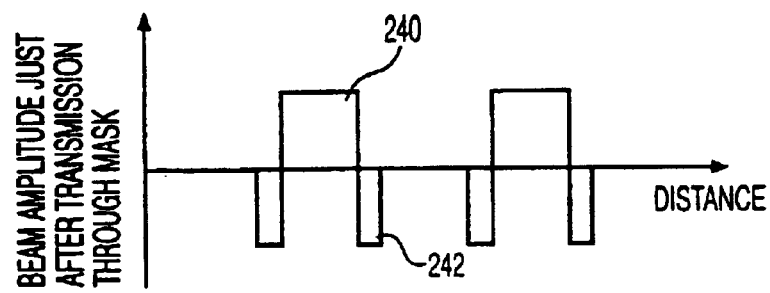
Figures 2, 2E, 3, 4:
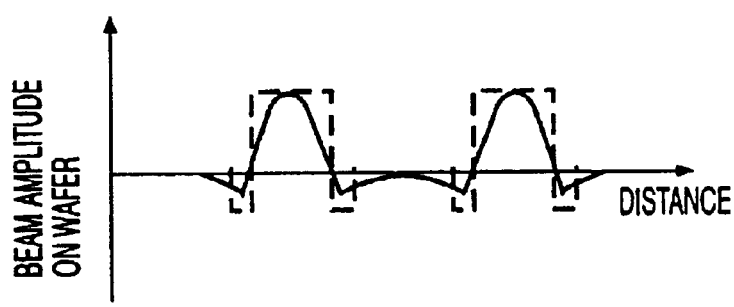
Figures 2, 2E, 3, 4, 5:
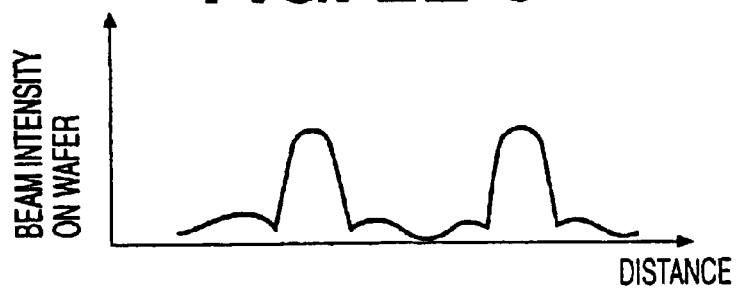

FIGS. 2E-1 and 2E-2 are Y—Y sections showing the first pattern 209a and the second pattern 209b on the mask 209, respectively. Reference numeral 262 designates a substrate, and numeral 263 designates the shielding members. FIGS. 2E-1' and 2E-2' show the amplitudes of the lights immediately after having passed through the mask, respectively. In the transparent regions 232 and the transparent regions 236 of the mask it is found that the phase difference of 180 degrees is established between the light (2E-2') having passed through the phase shifting member and the light (2E-1') not having passed through the phase shifting member 205. FIG. 2E-3 is a diagram showing the amplitudes of the lights immediately having passed through the first pattern and the second pattern and having been composed.

If the irradiation is made with the first pattern 232 only, the amplitude of the line on the wafer is given a gentle slope in the peripheral portion of the pattern by the diffraction of the light so that a shape boundary cannot be achieved. In the present embodiment, however, a light 242 having passed through the transparent region 236 of FIGS. 2B-1 to 2B-3 and having the phase difference of 180 degrees is arranged in the periphery of a light having passed through the transparent region 232 of FIGS. 2B-1 to 2B-3. As a result, the lights interfere with each other and are weakened at the boundary of the desired pattern 229 to be determined, so that the amplitudes of the lights are remarkably reduced. As a result, the blur of the contour of the image to be projected on the wafer is reduced to improve the contrast of the projected image drastically so that the resolution and the focal depth are remarkably improved (as shown in FIG. 2E-4). Incidentally, the optical intensity is a square of the optical amplitude so that the waveform of the optical amplitude on the wafer at the negative side is inverted to the positive side, as shown in FIG. 2E-5.

Thus, according to the mask of the present embodiment, when the desired pattern to be determined is one having a two-dimensional extension, the first pattern is slightly expanded from the outer periphery of the two-dimensional pattern (or the desired pattern) to form a transparent pattern having a transparent region inside thereof, and the second pattern is slightly expanded into a band-shaped transparent pattern having a slightly larger outer periphery than that of the first pattern, so that only the boundary of the desired pattern having the two-dimensional extension can be sharpened.

Incidentally, the mask 209 is formed with a positioning mark for positioning the first pattern 209a and the second pattern 209b. By this positioning mark, the drive of the aforementioned alignment mechanism 207 is controlled.

FIGS. 2I-1 to 2I-3 show examples of the mark for positioning the two separate patterns. This mark pattern is given the absolutely identical structures, relative positions and sizes at (a) and (b) (that is, patterns to the left and right in FIGS. 2I-1 and 2I-2). The shape of the mark to be used should not be limited to the square, as shown, but may be changed into an L- or cross-shape. In order to enhance the precision, however, it is advisable to provide a plurality of marks having an identical shape in separate directions. On principle, moreover, these positioning marks are formed on the mask 209 in such dimensions as are required for positioning the alignment mechanism 207. If the two-dimensional positioning on X-Y directions are required, those marks are required in the two-dimensional directions on the X-Y axes, but one dimension is frequently sufficient for the usual system of FIG. 2A.

The transmitted light having passed through the mark is identical, as if it is wholly shielded, in case the lights have the phase difference of 180 degrees and are correctly registered in the positions. Therefore, this shielding state is monitored by the CRT or the like so that the positioning is completed if the conditions are satisfied.

In case, on the contrary, the shielding is not complete at the initial setting, the alignment mechanism 207 may be driven to effect the shielding thereby to accomplish the positioning of patterns (a) and (b).

Next, the process for fabricating the mask 209 according to the present embodiment will be described in the following with reference to FIG. 2H.

The mask 209 of the present embodiment, as shown in FIG. 2A, is one (or rectile) used in the predetermined step of fabricating the semiconductor integrated circuit device. Incidentally, the mask 209 of the present embodiment is formed with an original of the integrated circuit pattern having a size of five times as large as the actual one and is formed with the shielding regions A and the transparent regions B.

For fabrications, the transparent substrate 262 made of quartz or the like has its surface polished and rinsed at first. After this, the surface is formed with the metal layer 263 having a thickness of about 500 to 3,000 Å and made of Cr or the like by the sputtering method. Next, a photo resist (which will be shortly referred to as the "resist") having a thickness of 0.4 to 0.8 $\mu$m is applied to the upper surface of the metal layer 263. Subsequently, the resist is pre-baked and is then irradiated at its predetermined portions with an electron beam E by the electron beam exposing method on the basis of that integrated circuit pattern data of the semiconductor integrated circuit device, which are coded in advance in the magnetic tape or the like. Incidentally, the integrated circuit pattern data are recorded with the positional coordinates, shapes and so on of the patterns.

Next, the patterns (a) and (b) are transferred to the resist by the electron beam exposing method on the basis of the pattern data (a) and (b) of FIG. 2B, for example.

The pattern data (a) and (b) are automatically prepared by enlarging or reducing the pattern widths of the shielding regions A or the transparent regions B of the aforementioned integrated circuit pattern data. In the present embodiment, for example, the pattern (a) can be automatically prepared by enlarging the pattern width of the shielding regions to about 0.5 to 2.0 $\mu$m, for example, and the pattern (b) can be automatically prepared by taking the logical product between the data of the pattern (a) and the inverted data of the original data.

After this, through the steps of the development, the etching of the predetermined portions, the removal of the resist, the rinsing, the inspections and so on, the mask 209 having the patterns (a) and (b) is fabricated.

The integrated circuit pattern on the mask 209 is transferred onto the specimen (which will be shortly referred to as the "wafer") having the resist applied thereto, by using the mask 209 thus prepared, as will be described in the following.

Specifically, the size-reducing projection exposing system of FIG. 2A is arranged with the mask 209 and the wafer, and the original image of the integrated circuit pattern on the mask 209 is optically reduced in size to one fifth and projected on the wafer. Each time the wafer is sequentially moved stepwise on the movable specimen table 216, the projection and exposure are repeated to transfer the integrated circuit pattern on the mask 209 to the whole surface of the wafer.

Next, another example of the mask according to the present embodiment will be described in the following.

FIGS. 2C-1 and 2C-2 are sections showing the essential portions of the mask according to the present invention, respectively. The patterns (a) and (b) are the first and second patterns of the mask 209 of FIG. 2A, respectively, and show the mask patterns in sections while holding and separating the relative positional relations by taking the desired pattern into consideration. Incidentally, the pattern (c) shows the top plan view of the desired pattern composed. FIGS. 2F-1 to 2F-5 are diagrams for explaining the amplitudes and intensity of the lights having passed through the transparent regions of the mask shown in FIGS. 2C-1 to 2C-3. Incidentally, the exposure system and the method to be used are similar to those of the foregoing embodiment.

When a desired pattern 248 is a one-dimensional pattern having lines 244 to 247 arrayed transversely on line, according to the embodiment shown in FIGS. 2C-1 to 2C-3, the pattern on the mask is constructed to sharpen its boundary. In this case, in the relative arrangement of the mask, there are alternately arranged; transparent regions 249 and 250 of the first pattern constituting the lines 244 and 246 of the aforementioned lines 244 to 247; and transparent regions 251 and 252 of the second pattern constituting the lines 245 and 247. Then, the regions to be weakened as a result of the interferences are located at the intermediate regions 255 of the individual lines constituting the aforementioned desired pattern 248 so that the individual lines are sharpened.

Figures 1, 2F:
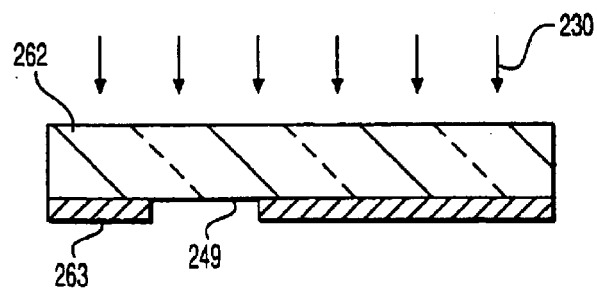
Figures 1, 2F:
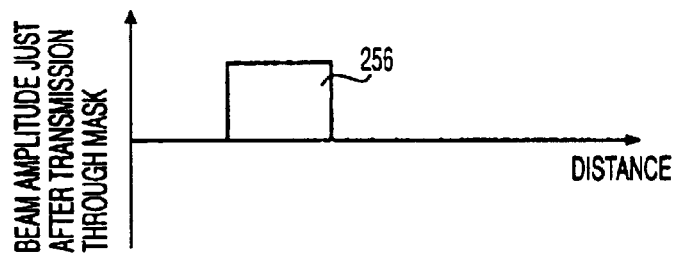
Figures 2, 2F:
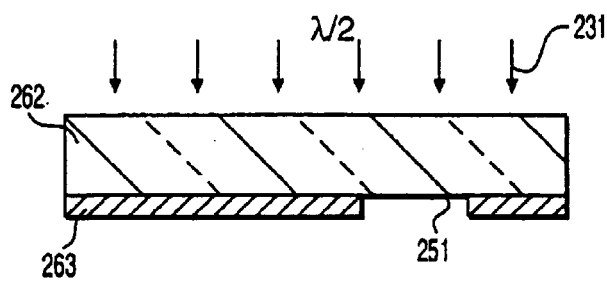
Figures 2, 2F:
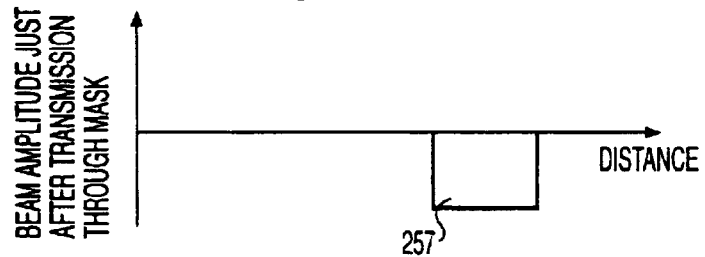
Figures 2, 2F, 3:
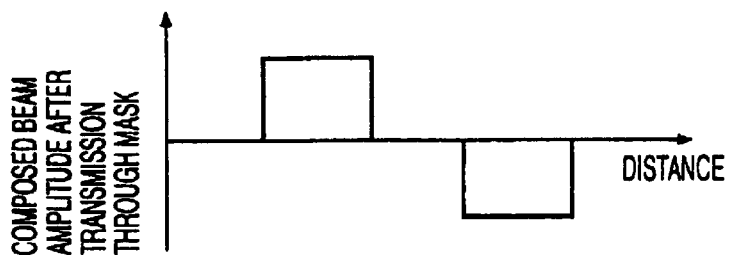
Figures 2, 2F, 3, 4:
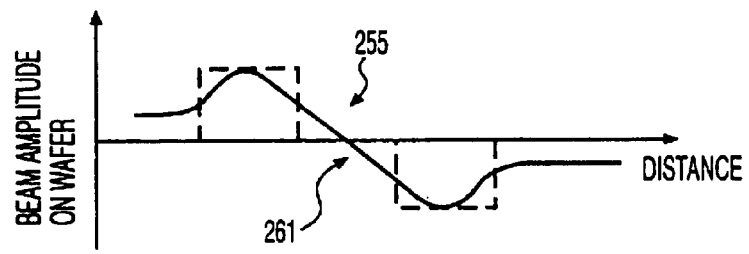
Figures 2, 2F, 3, 4:
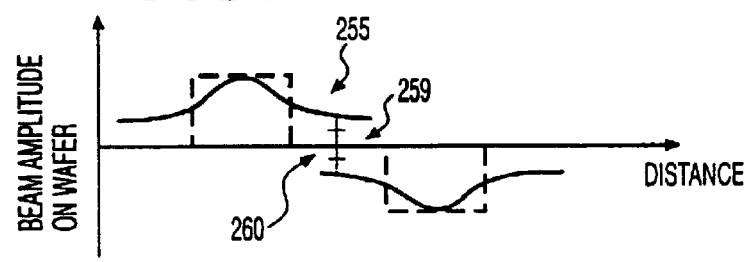
Figures 2, 2F, 3, 4, 5:
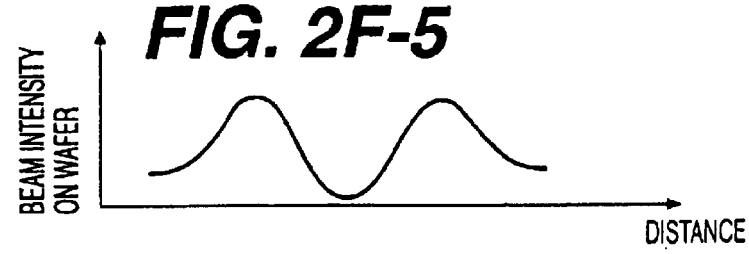

With reference to FIGS. 2F-1 to 2F-5, the relations will be described in the following in case only the lines 244 and 245 are extracted from the desired pattern. In this case, too, the phase difference of 180 degrees is established (as shown in FIGS. 2F-1' and 2F-2') between the light 256 having passed through the transparent region 249 of the first pattern and the light 257 having passed through the transparent region 251 of the second pattern. As a result, these lights have their components 259 and 260 interfering with each other and deleted at the regions 255 between the two lines 244 and 245 in the desired pattern on the wafer so that the optical amplitude has its gradient 261 enlarged, as shown in FIG. 2F-4. As a result, a sharp boundary can be formed in the region between the lines 244 and 245, as shown in FIGS. 2C-1 to 2C-3. Incidentally, FIG. 2F-4' is a schematic diagram showing the amplitude of the light on the wafer before the interference.

As a result, the contrast of the projected image of the one-dimensional pattern can be drastically improved to improve the resolution and the focal depth remarkably (as shown in FIG. 2F-5).

According to the present embodiment, if the desired pattern is a one-dimensional one having lines arranged transversely on line, the transparent regions of the first pattern and the second pattern forming the aforementioned lines are alternately arranged in the relative positions on the mask, and the aforementioned regions for interfering and weakening the lights are arranged at the intermediate portions of the individual lines forming the aforementioned desired pattern, so that the transfer precision can be drastically improved in case the plural lines are arranged in such a narrow region as cannot take the aforementioned two-dimensional pattern method.

Next, other examples of the mask according to the present invention will be described in the following.

FIGS. 2D-1 and 2D-2 are diagrams showing the essential portions of the masks according to the present invention. The diagrams 2D-1 and 2D-2 are top plan views showing the first and second patterns of the mask 209 of FIG. 2A, respectively, such that the mask pattern is divided while holding the relative positions by considering the desired pattern thereof. FIGS. 2G-1 to 2G-5 are diagrams for explaining the amplitudes and intensity of the lights having passed through the transparent regions of the mask shown in FIGS. 2D-1 to 2D-3. Incidentally, the exposure system and method to be used are similar to those of the foregoing embodiments.

The desired pattern 269 of the present embodiment has square mask patterns 270 arranged there around with fine sub-patterns 272.

Figures 1, 2G:
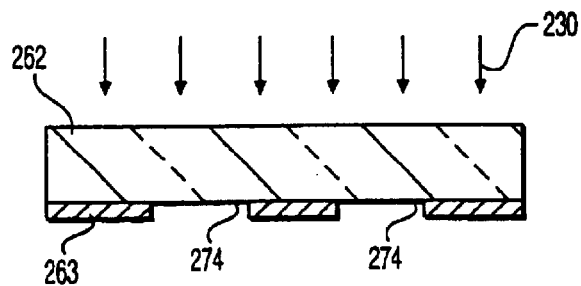
Figures 1, 2G:
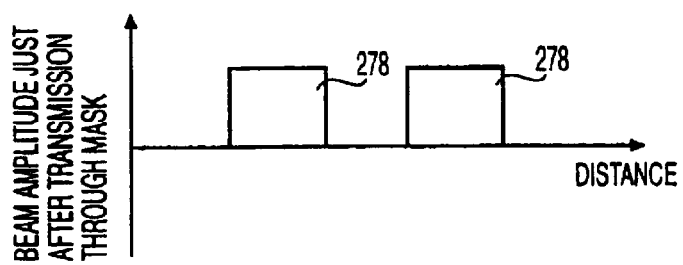
Figures 2, 2G:
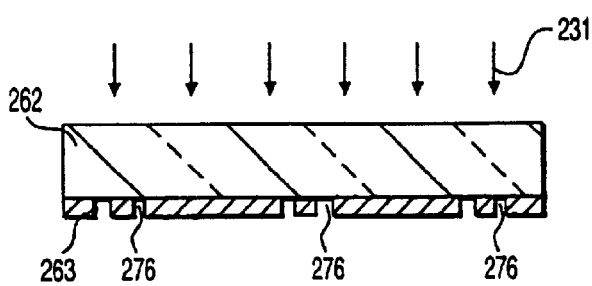
Figures 2, 2G:
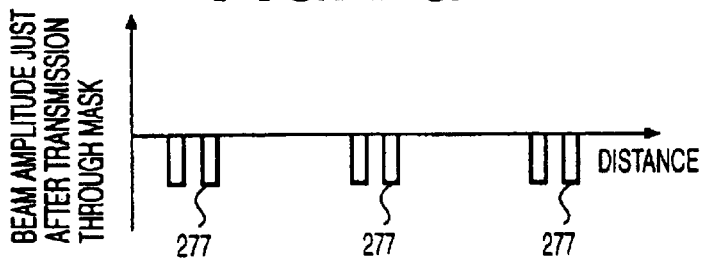
Figures 2, 2G, 3:
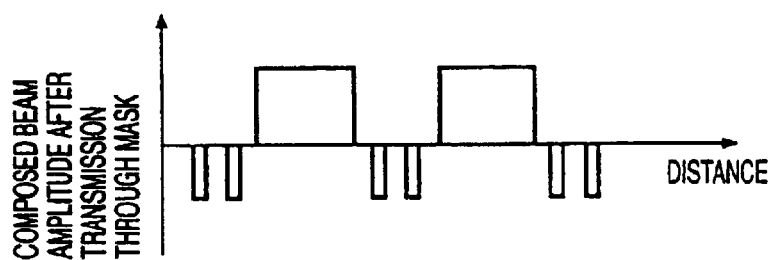
Figures 2, 2G, 3, 4:
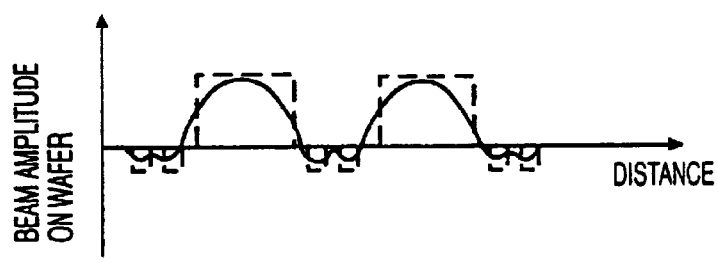
Figures 2, 2G, 3, 4, 5:
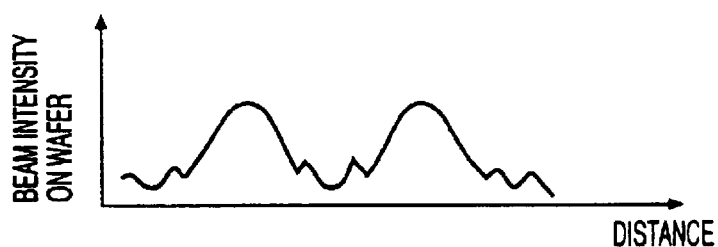
Figure 2H:
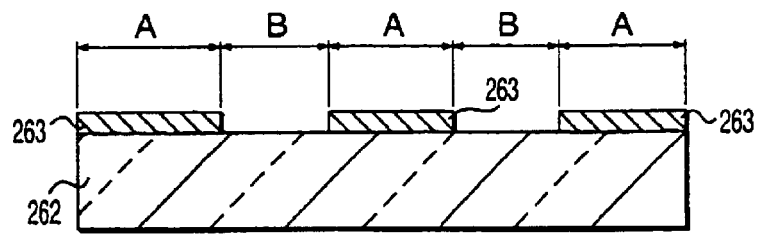
FIG. 2H is a section showing the mask.
Figures 1, 2I:
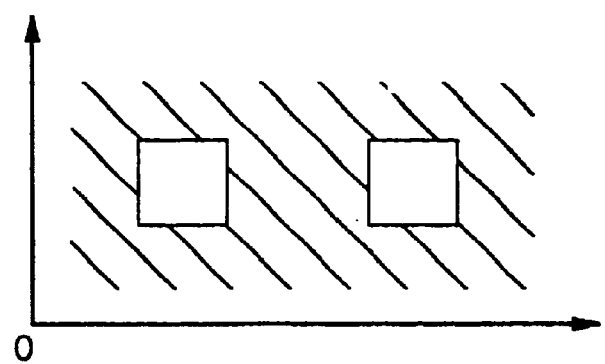
Figures 2, 2I:
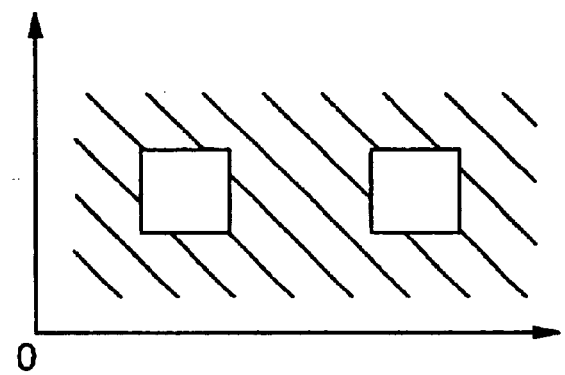
Figures 2, 2I, 3:
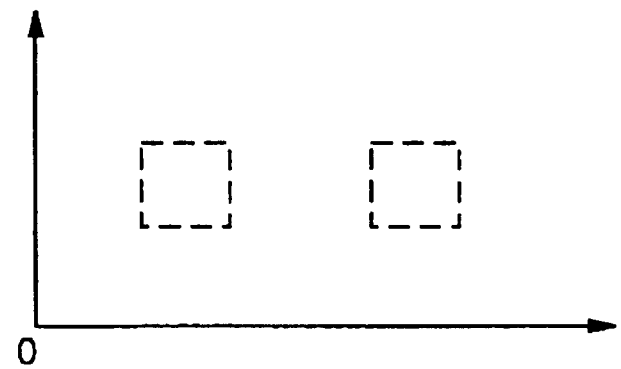

The precise transfer of the fine sub-patterns 272 around the two-dimensional patterns 270 is difficult to perform by the method of applying the phase transparent film to the mask according to the prior art. According to the present invention, however, the desired excellent pattern 269 can be easily formed according to the present invention. In the mask of the present embodiment shown in FIGS. 2D-1 to 2D-3, too, in the relative positions on the mask, the first pattern is formed into a pattern 274 which is given transparent regions as wide as the two-dimensional pattern 270 by considering the size-reducing ratio, and the second pattern is formed into the aforementioned fine pattern 276, so that the phase difference (as shown in FIGS. 2G-1' and 2G-2'B) of 180 degrees is established in the individual transparent regions of the mask between a light 277 having passed through the phase shifting member 205 and a light 278 not having passed through the phase shifting member 205. These lights can interfere with each other in a region 280 between the two-dimensional pattern and the fine pattern to reduce the blur of the image to be projected on the wafer. As a result, the contrast of the projected image can be remarkably improved to improve the resolution and the focal depth drastically (as shown in FIG. 2G-5).

The following effects can be achieved from the mask according to these embodiments.

At the time of exposure, in the boundary required for the desired pattern to have a precision, the first pattern and the second pattern are constructed such that the light having passed through the transparent regions of the first pattern and the light having passed through the transparent regions of the second pattern may interfere and be weakened. As a result, the blur of the contour of the image to be projected on the wafer can be reduced to improve the contrast of the projected image drastically thereby to improve the resolution and the focal depth remarkably. As a result, the resolution limit can be remarkably enhanced even with the same projection lenses and wavelength as those of the prior art. Even if the pattern on the mask is as complex and fine as the integrated circuit pattern, the pattern transfer precision is not partially dropped so that the transfer precision of the whole pattern formed on the mask can be remarkably improved.

Since, moreover, the two patterns are prepared to achieve the effect of the phase shift with the composed pattern, no transparent film exists on the mask surface so that no trouble arises in the inspections unlike the case of the prior art, in which the transparent film is formed on the mask.

Without the step of forming the transparent film, furthermore, the time period of fabricating the mask can be remarkably shortened from the mask in which the phase shifting means is exemplified by the transparent film on the mask substrate.

Although our invention has been specifically described in connection with the embodiments thereof, it should not be limited to those embodiments but can naturally be modified in various manners within the scope of the gist thereof.

According to the exposure method using the mask of the present invention, for example, there is neither restriction upon the specific structure of the system nor the structure of the aforementioned embodiment using the two split luminous fluxes, but the means may divide the luminous flux into plurality and give them individual phase differences so that the patterns of the plural masks may be composed and exposed.

In the description thus far made, our invention has been described on the technology of fabricating the semiconductor device according to the background field of application thereof but should not be limited thereto. The present invention can naturally be widely applied to the technological field of exposure, to which the form improving effect according to the phase shifting method can be applied.

The effects to be attained by the representative mode of the invention to be disclosed in the present embodiment will be briefly described in the following.

In order that the light having passed through the transparent regions of the first pattern and the light having passed through the transparent regions of the second pattern may interfere with each other and be weakened at the boundary in which the precision of the desired pattern is required, the first and second patterns on the mask are irradiated with two lights having a phase difference and at least a partial coherence, and the transparent patterns of those lights are composed to form the desired pattern on the specimen to be irradiated, so that the transfer precision of the boundary requiring the precision of the desired pattern can be improved.

The method of composing and exposing the ordinary main pattern, the main pattern for giving a phase shift of $\pi$ or an equivalent phase shift or a fine shift (or accompanying) pattern on the two masks, as has been described in connection with Embodiments 1 and 2, will be called hereinafter the "multi-mask phase shifting method" or the "multi-mask phase inversion shifting method".

Embodiment 3

Figure 3A:
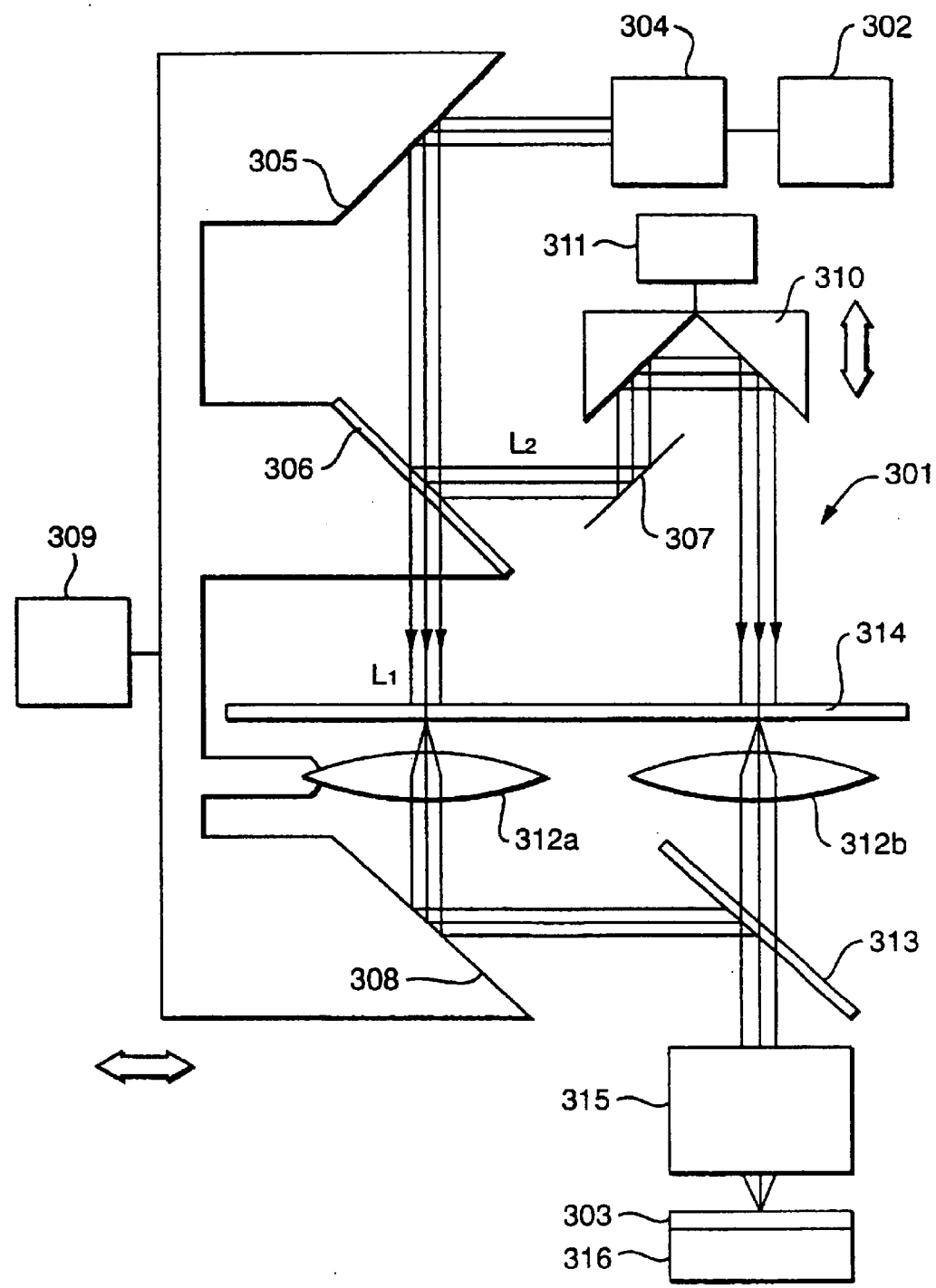
FIG. 3A is a schematic front section showing the summary of an exposure optical system of a step-and-repeat type 5:1 size-reducing projection exposure system according to Embodiment 3 of the present invention.
Figure 3B:
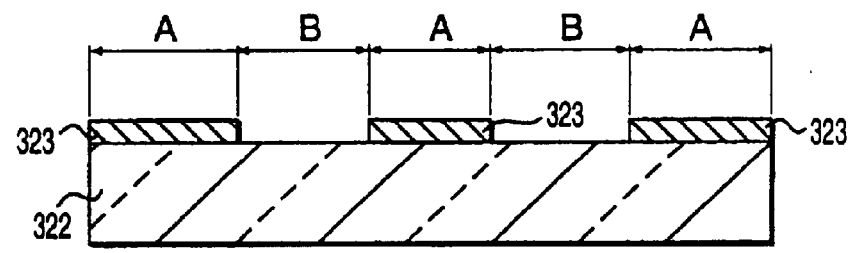
FIG. 3B is a section showing a mask which corresponds to the periodic or pseudo-periodic line-and-space pattern of the aforementioned embodiment of the present invention.

FIG. 3A shows a phase shifting mechanism 301 of the exposure system (of 1:5 size-reducing projection/step-and-repeat type) of Embodiment 3 of the present invention.

In the same Figure, the phase shifting mechanism 301 is constructed of an optical system which is interposed between a light source 302 of the exposure system and a specimen 303 (e.g., wafer) to be irradiated and which includes: a beam expander 304; mirrors 305, 307 and 308; half mirrors 306 and 313; an optical axis shifter 309; a corner mirror 310; an optical path varying mechanism 311 for driving the corner mirror 310 finely; a pair of relay lenses 312a and 312b; and a size-reducing lens system 315. In the alignment system of this optical system, there is positioned a mask 314 (or rectile) which is formed with the original image of a pattern to be transferred to the aforementioned specimen 303. The mask 314 is one (or rectile) to be used in the process for fabricating the semiconductor integrated circuit device, for example, and the specimen 303 is a semiconductor wafer made of single crystal of silicon, for example.

The light L such as the i-line (having a wavelength of 365 nm) emitted from the light source 302 is expanded by the beam expander 304 and is then refracted through the mirror 305 in a direction normal to the principal plane of the mask 314. After this, the refracted light is divided through the half mirror 306 disposed midway of the optical path into a straight line $L_1$ and a light $L_2$ advancing at a right angle with respect to the former. The light $L_2$ is refracted through the mirror 307 and the corner mirror 310 so that it passes through a path different from that of the light $L_1$ to irradiate another portion of the mask 314. The two lights $L_1$ and $L_2$ thus having passed through the different portions of the mask 314 pass through the lenses 312a and 312b and are then composed into one light L' through the mirror 308 and the half mirror 313. After this, the light L' has its size reduced by the size-reducing lens 315 and is focused to irradiate the specimen 303 which is positioned on an X-Y table 316.

In the aforementioned phase shifting mechanism 301, the lights $L_1$ and $L_2$ having passed through the half mirror 306 have different optical paths so that a desired phase difference can be established between the lights $L_1$ and $L_2$ having reached the wafer 303 by changing the height (i.e., the optical path of the line $L_2$) from the principal plane of the mask 314 to the corner mirror 310. The vertical movement of the aforementioned corner mirror 310 is accomplished by using the optical path varying mechanism 311 resorting a piezoelectric control element, for example.

FIG. 3A is an enlarged section showing the aforementioned mask 314. This mask 314 is made of transparent synthetic quartz 322 having a refractive index of about 1.47, for example, and has its principal plane formed with a metal layer 323 of Cr (chromium) having a thickness of about 500 to 3,000 Å. At the time of exposure, the metal layer 323 provides the shielding regions A allowing no optical transmission, whereas the remaining regions provide transparent regions B allowing optical transmissions. The integrated circuit pattern is formed of the aforementioned shielding regions B and has a size of five times as large as the actual size (i.e., the size on the wafer), for example.

Figure 3D:
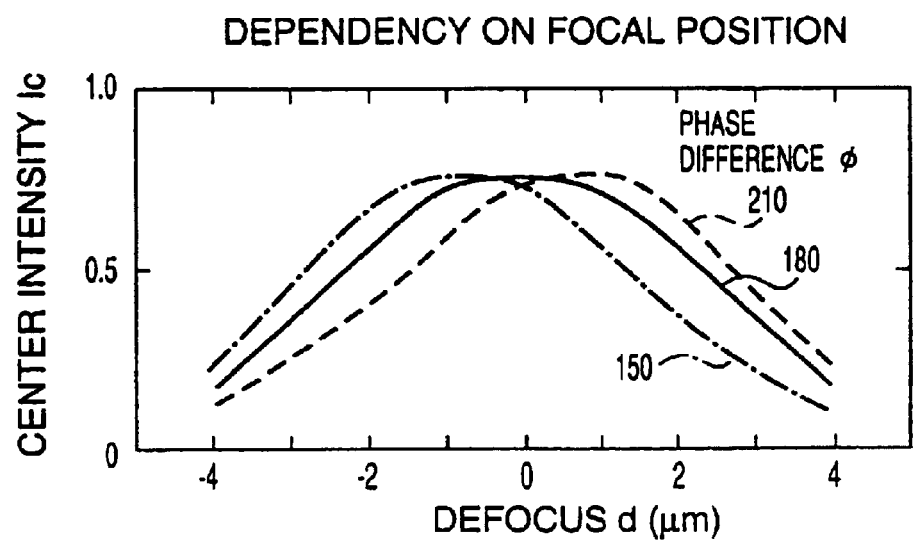
FIG. 3D is a diagram showing the behavior of the displacements of an image plane corresponding to the main and sub-patterns in case the phase difference $\phi$ of $L_1$ and $L_2$ of the foregoing embodiment is displaced back and forth from $(2n+1)\pi$.
Figures 1, 3C:
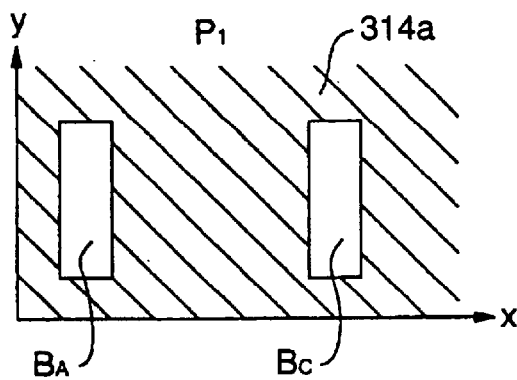
Figures 2, 3C:
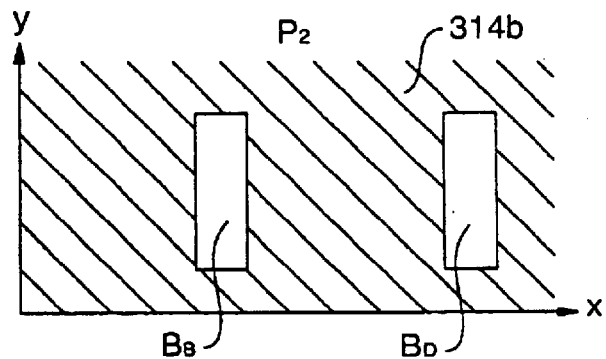
Figures 3, 3C:
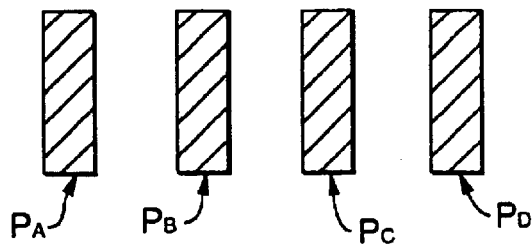
Figures 3, 3C, 4:
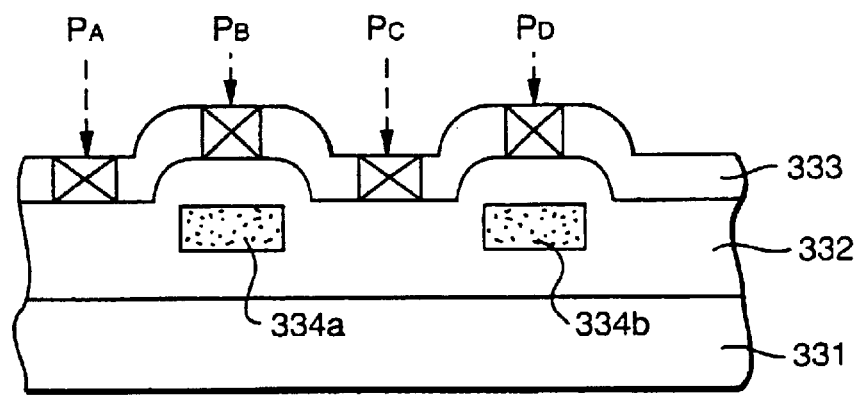

FIGS. 3C-1 and 3C-2 show examples of the integrated circuit pattern formed on the aforementioned mask 314. The circuit pattern $P_1$, as shown in FIG. 3C-1, is a portion of the composed pattern (c) after transfer and is extracted from the lower portion of the step of the specimen surface. The circuit pattern $P_2$, as shown in FIG. 3C-2, is a portion of the composed pattern shown in FIG. 3C-3 after the transfer and is extracted from the higher portion of the step of the specimen surface. The patterns $P_1$ and $P_2$ are arranged in predetermined portions of the mask 314 and at a predetermined spacing. In FIGS. 3C-1 to 3C-4: reference numeral 331 designates either a substrate of a single crystal of Si or a semiconductor substrate of epitaxial (Si) layer; numeral 332 designates a $SiO_2$ film; numerals 334a and 334b designate gate electrodes or wiring lines which are made of poly-Si, polycide, silicide or refractory metal; numeral 333 designates a positive type resist film applied to the film 332; letters $B_A$ and $B_C$ designate opening patterns over the main mask 314a; letters $B_B$ and $B_D$ designate opening patterns on the sub-mask 314b; letters $P_A$ and $P_C$ designate the positions on the resist film corresponding to the lower pattern; and $P_B$ and $P_D$ designate the positions on the resist film corresponding to the higher pattern.

Next, the method of preparing the aforementioned masks 314a and 314b will be briefly described in the following. First of all, synthetic quartz has its surface polished and rinsed, and a Cr film having a thickness of about 500 to 3,000 Å is then deposited on the whole surface of the principal plane by the sputtering method. Subsequently, an electron beam resist is applied to the whole surface of the Cr film. Next, on the basis of the integrated circuit pattern data coded in advance in a magnetic tape or the like, the integrated circuit pattern is drawn on the electron beam resist by the electron beam exposure method. After this, the exposed portion of the electron beam resist is removed by the development, and the exposed Cr film is removed by the wet etching to form the integrated circuit pattern. The pattern data of the aforementioned paired circuit patterns $P_1$ and $P_2$ can be automatically prepared by expanding or reducing the data of the shielding regions A or the transparent regions B of one circuit pattern or by taking a logical product between the inverted data of one circuit pattern and the data of the other circuit pattern. For example, the pattern data of the circuit pattern $P_2$ can be automatically prepared by taking a logical product between the data enlarged from the pattern of the transparent regions B of the circuit pattern $P_1$ and the inverted data of the transparent regions B of the circuit pattern $P_1$.

Figures 1, 3E:
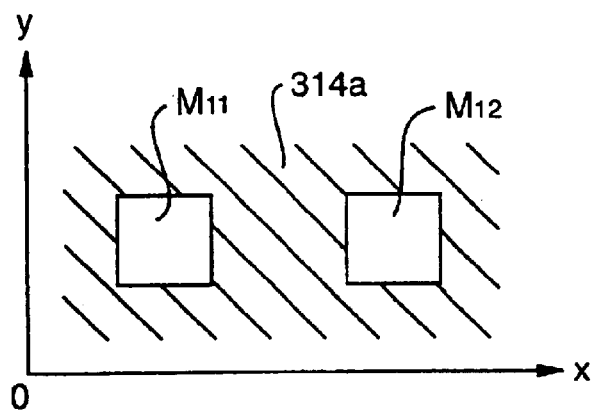
Figures 2, 3E:
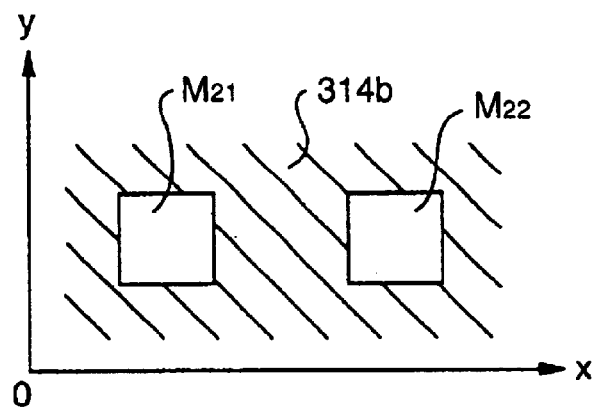
Figures 3, 3E:
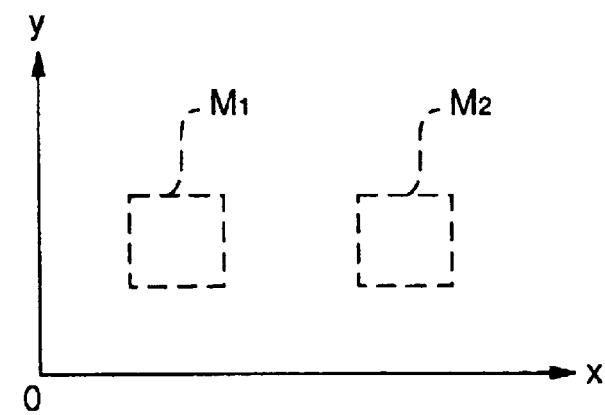
Figure 4:
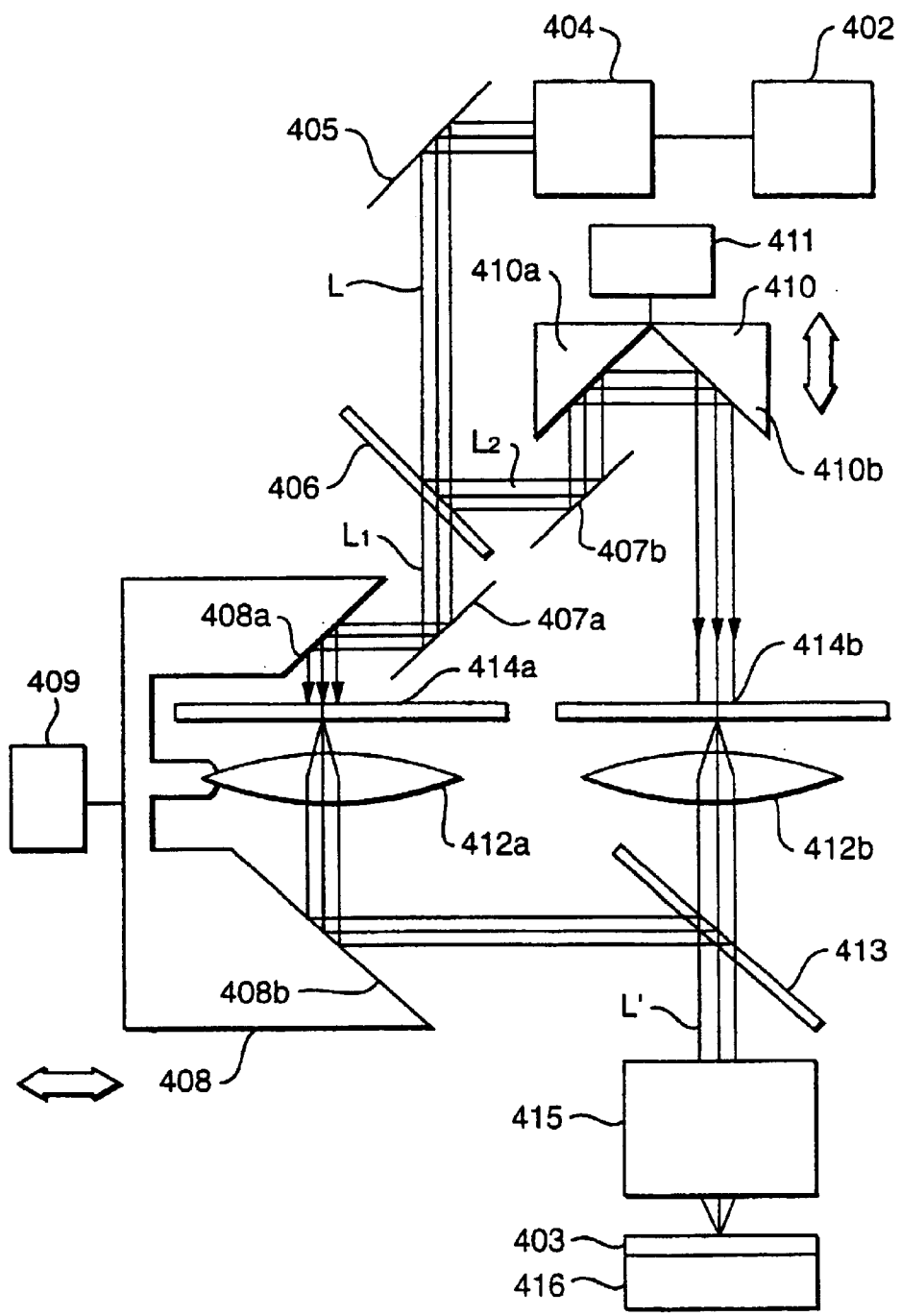

In order that the integrated circuit pattern formed on the aforementioned mask 314 may be transferred onto the wafer 303 (as shown in FIG. 3A), the wafer 303 having the photo resist applied to its surface is positioned at first on the X-Y table 316 of the exposure system shown in FIG. 3A, and the mask 314 (e.g., 314a and 314b) is positioned in the alignment system. The mask 314 is positioned such that, when one light $L_1$ divided by the half mirror 306 is guided to irradiate one $P_1$ of the aforementioned paired circuit patterns $P_1$ and $P_2$, the other light $L_2$ is precisely guided to irradiate the other circuit pattern $P_2$. Next, the corner mirror 310 is vertically moved to adjust the phase difference such that the two lights $L_1$ and $L_2$ may have their phases reversed when composed again. At this time, the difference of the two optical paths is minimized by considering the interference distance of the light source. In order accomplish the positioning of the mask 314 and the adjusting of the phase difference of the two lights $L_1$ and $L_2$ precisely, use is made of a pair of positioning marks $M_{11}$, $M_{12}$, $M_{21}$ and $M_{22}$ (all of which will be referred to "Mln"), which are formed on the mask 314, for example, as shown in FIGS. 3E-1 and 3E-2. These marks Mln are formed of openings which are arranged equidistantly in the shielding region, as hatched, and which have identical shapes and arrangements. In short, all the marks $M_{11}$, $M_{12}$, $M_{21}$ and $M_{22}$ have identical gaps and sizes. In case the positioning of the mask 314 (or 314a and 314b) and the adjustment of the phase difference between the lights $L_1$ and $L_2$ are precisely accomplished, the light $L_1$ having passed through the mark Mln and the light $L_2$ having passed through the mark $M_2$n interfere with each other and completely disappear so that the mark images $M_1$ and $M_2$ are not formed on the wafer 303. In other words, by discriminating the existence of the projected images $M_1$ and $M_2$ on the wafer 303, it is possible to easily decide whether or not the positioning of the mask 314 (or 314a and 314b) and the adjustment of the phase difference between the lights $L_1$ and $L_2$ are precisely accomplished.

The positioning of the patterns $P_1$ and $P_2$ on the mask is accomplished by using the alignment mechanism 309. Next, the phase difference is adjusted in a manner to correspond to the surface step (as shown in FIGS. 3C-1 to 3C-4) of the specimen 303. This adjustment is performed by controlling (or making a program) the piezoelectric control element of the optical path varying mechanism 311 with a computer. Specifically, since the focal point can be shifted to correspond to the phase difference, as shown in FIG. 3D, the specimen can be focused at its upper and lower portions even in case it has a surface step.

After the positioning of the mask 314 and the adjustment of the phase difference between the lights $L_1$ and $L_2$ have thus been accomplished, the original image of the integrated circuit pattern formed on the mask 314 has its size optically reduced to one fifth and is projected on the wafer 303. The operations thus far described are repeated while moving the wafer 303 sequentially stepwise.

Figures 1, 1K:
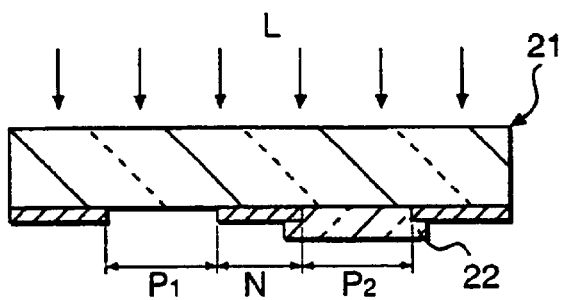
Figures 1, 1K, 2:
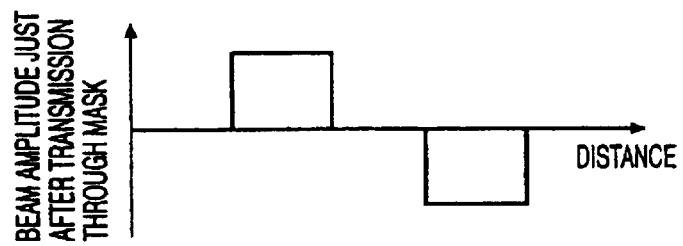
Figures 1, 1K, 2, 3:
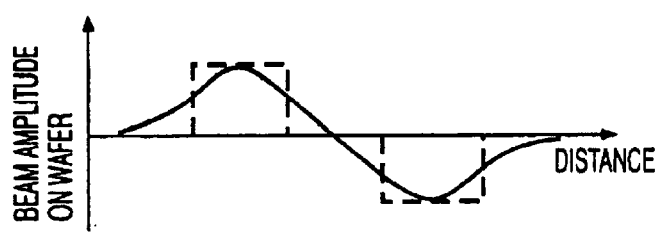
Figures 1, 1K, 2, 3, 4:
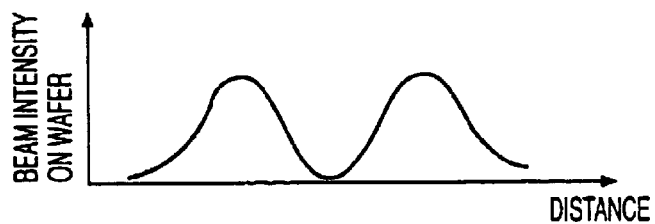

According to the data of FIG. 3D, the transparent shifter layer on the mask is formed and exposed to give phase differences of 150 degrees, 180 degrees and 210 degrees by the on-mask phase shifting method, as shown in FIG. 1K. The experimental conditions are: the minimum pattern size of 0.35 $\mu$m; the exposure wavelength of $\lambda$=365 nm (i.e., i-line); NA=0.42; the partial coherency of $\sigma$=0.3; the resist of "RI17000P (of Hitachi Kasei"; and the exposure system of the 5:1 i-line stepper "RA101 of Hitachi, Ltd.".

Incidentally, the principle of the present invention can be realized not only by the pair-mask phase shifting method composing the aforementioned two mask patterns but also the on-mask phase shifting method of exposing one mask to a single luminous flux. In this case, the thickness of the phase shift film 22 of FIGS. 1K-1 to 1K-4 has to be formed such that the phase difference $\phi$ may take a desired value ranging from 150 degrees to 210 degrees.

In the "phase shifting method", as has been described in the present embodiment, the method, in which projections are accomplished on a plurality of image planes by setting the shift at other than $(2n+1)\pi$ (wherein n: an integer), will be called the "multi-image plane phase shifting method", and the method of using the two masks will be called the "multi-mask multi-image plane phase shifting method".

Incidentally, the exposure method, in which the simultaneous focusing operations are accomplished on the plural planes having the steps without being accompanied by the phase shift, as will be described in the following embodiments, and the present embodiment will be totally called the "multi-image plane projection exposure method".

(4) Embodiment 4

The present embodiment relates to a modification of the step-and-repeat type 5:1 size reducing projection exposure system (or stepper) which can be applied to Embodiments 1 to 3 and other embodiments, as will be described hereinafter. The present embodiment is effective in case the coherence length is relatively short because an exposing light having a low coherency is used from the requirement of the process or the like.

FIG. 4 is a schematic sectional front elevation showing the exposing optical system of the stepper according to the present embodiment. In the same Figure: reference numeral 402 designates an exposure light source such as the i-line (having a wavelength of 365 nm) of a mercury arc lamp or mercury xenon arc lamp, or an excimer laser (having a wavelength of 249 nm or 308 nm); numeral 403 designates a wafer to be exposed; numeral 404 designates an illuminating optical system including a beam expander, a condenser lens and so on; numeral 405 designates a mirror such as a cold mirror; numeral 406 designates a light dividing half mirror for dividing the light L into substantially equal halves; numerals 407a and 407b designate mirrors for reflecting the divided lights $L_1$ and $L_2$, respectively; numeral 408 designates a corner mirror block for controlling the optical path of the light $L_1$ and the positioning with the mask; numeral 408a designates a front corner mirror; numeral 408b designates a rear corner mirror; numeral 409 designates drive control means for the corner mirror block 408; numeral 410 designates a corner mirror block for controlling the optical path of the light $L_2$; numeral 410a designates a front mirror; numeral 410b designates a rear corner mirror; numeral 414a designates a main mask; numeral 414b designates a sub-mask; numerals 412a and 412b front projection lens systems corresponding to the lights $L_1$ and $L_2$, respectively; numeral 411 designates a drive control system for the corner mirror 410; numeral 413 designates a composing half mirror for composing the lights $L_1$ and $L_2$ into the light L7; numeral 415 designates a rear projection lens system for focusing the composed light L'; and numeral 416 designates an X-Y stage and wafer sucking table for traversing the wafer 403 in the X and Y directions.

The operations of the present system are substantially identical to those of the aforementioned individual systems, and their repeated descriptions will be omitted here.

(5) Embodiment 5

The present embodiment relates to the step-and-repeat type 5:1 size-reducing projection exposure system which is characterized in that the optical distance from the main mask to the wafer and the optical distance from the sub-mask to the wafer are substantially equal, and in that the optical distance from the main mask to the light source and the optical distance from the sub-mask to the light source are substantially equal. However, it is natural that these characteristics are not essential to the present invention.

Figure 5A:
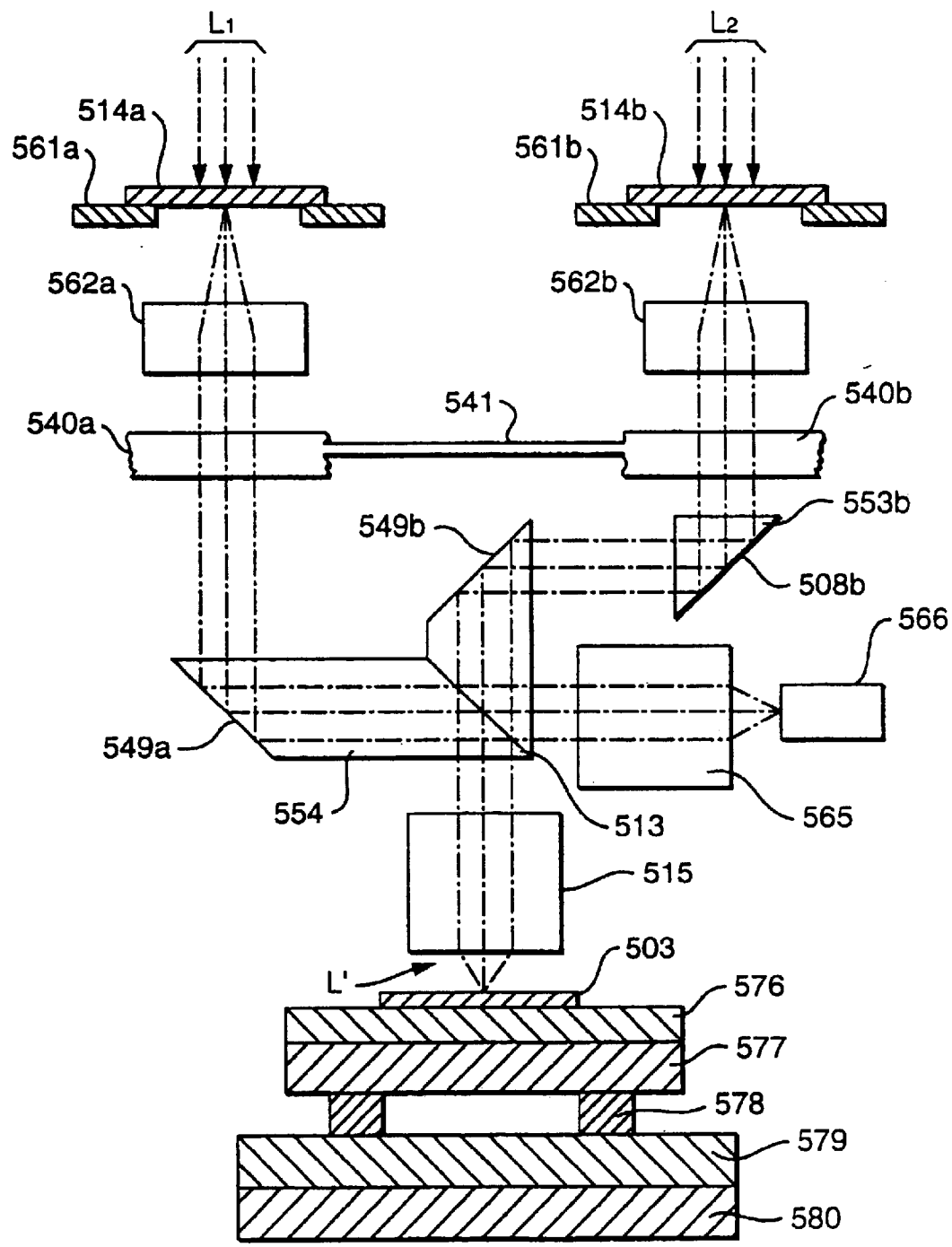
FIG. 5A is a schematic front section showing the exposure projection optical system of a step-and-repeat type 5:1 size-reducing projection exposure system of Embodiment 5 of the present invention.
Figure 5B:
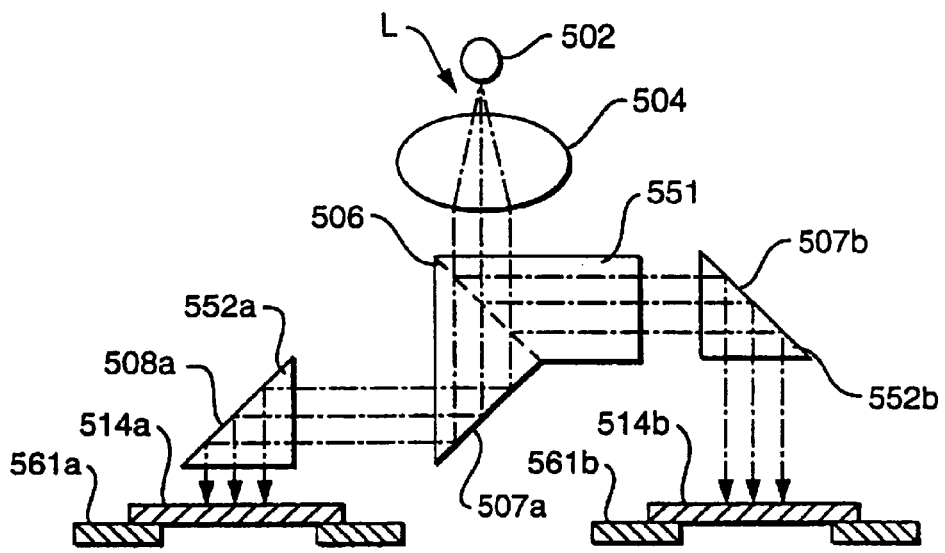
FIG. 5B is a schematic front section showing an exposure light source and illumination (or exposure) optical system of the same system.

FIGS. 5A and 5B are a section showing the i-line exposure system of the present embodiment and an additional explanatory diagram showing a representative optical beam, respectively.

In these Figures, reference numeral 502 designates a light source which is constructed to include: an ultraviolet lamp such as a high-pressure Hg arc lamp or a Xenon Mg lamp; and a filter group or mirror for extracting only a substantially monochromatic i-line (having a wavelength of 365 nm) from the emission spectrum. Numeral 504 designates a condenser lens or a lens system composed of a group of plural lenses (made of synthetic quartz) to form a kohler illumination for the mask. Reference numeral 551 designates a first prism (made of synthetic quartz) applied to the half mirror face for adjusting the optical path, and numeral 506 designates a half mirror plane for dividing the exposing luminous flux L into the main exposing luminous flux $L_1$ and an auxiliary exposing luminous flux $L_2$. This half mirror is desired to have a substantially equal reflectivity and transmittance in an identical polarization mode. Reference numerals 507a and 508a designate the mirror surfaces for deflecting the main luminous flux $L_1$ at an angle of 90 degrees; numeral 507b designates a mirror surface for deflecting the auxiliary luminous flux $L_2$ at an angle of 90 degrees; and numerals 552a and 552b designate polarizing prisms (made of synthetic quartz) having individual evaporated mirror surfaces. Numerals 514a and 514b designate a main mask (or rectile) and an auxiliary mask (or rectile) having an exposed or transferred pattern, and numerals 561a and 561b designate a mask holder and fine drive means in the Z-axis (i.e., the direction of the optical axis) and in the X-Y directions. Numerals 540a and 540b designate phase difference setting means for setting the phase difference $\phi$ between the two luminous fluxes $L_1$ and $L_2$ by adjusting the optical length in between, and numeral 541 designates a communication pipe. Numerals 562a and 562b designate pre-projection lens groups; numeral 554 designates a second prism (made of synthetic quartz) for adjusting the optical path; numeral 553b designates a deflection prism (made of synthetic quartz) for deflecting the luminous flux $L_2$ at an angle of 90 degrees; numerals 549a, 549b and 508b designate deflecting mirror surfaces; and numeral 513 designates a composing half mirror surface for composing the luminous fluxes $L_1$ and $L_2$ into the (composed) luminous flux L'. The half mirror 513 has characteristics similar to those of the aforementioned dividing half mirror 506. Numeral 515 designate an exposing post-projecting lens group; numeral 565 designates a referring post-projecting lens group; numeral 566 designates optical detection means disposed in the image plane of the referring projection lens group; numeral 503 designates an exposed wafer; numeral 576 designates a wafer chuck for retaining the flatness of the wafer by sucking the wafer by vacuum and a state for θ rotations (i.e., rotations on the vertical axis extending through the center of the wafer); numeral 577 designates a stage for moving in the Z-axis (i.e., vertical axis); numeral 578 designates horizontality adjusting means including three Z-axis drive means; numeral 579 designates an X-stage; and numeral 580 designates a Y-stage.

Figure 5C:
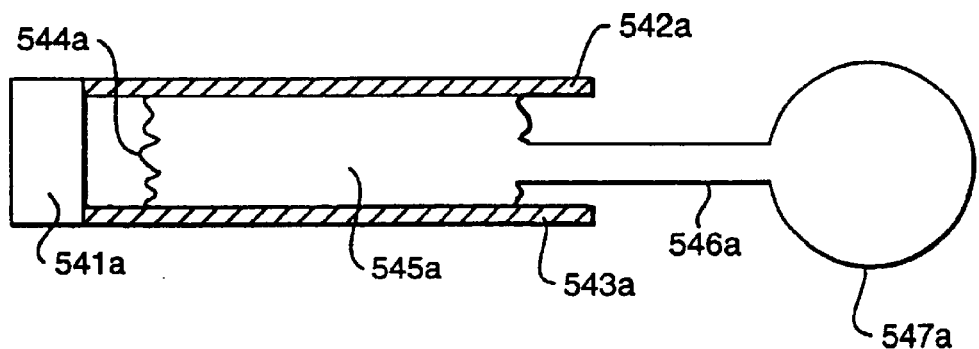
FIG. 5C is an enlarged section showing the phase difference setting means of the same system.

FIG. 5C is a section showing an essential portion of the phase difference setting means 540a of the aforementioned stepper. In the same Figure: reference numerals 542a and 543a designate synthetic quartz glass plates; numeral 541a designates means for adjusting their gap; numeral 544a designates a metal bellows; numeral 547a designates a pressure reservoir; numeral 546a designates a communication pipe made of austenite stainless steel pipe; and numeral 545a designates an optical path control chamber, in which the single or mixed gases having a refractive index different from that of the atmospheric gases in a chamber arranged with the stepper or the major atmospheric gases in the exposing luminous flux passage are held under a constant pressure. Incidentally, this optical path control chamber 545a or 547a can be evacuated by a vacuum pump. In case of this evacuation, it is unnecessary to consider the temperature rise of the gases in the optical path control chamber.

Figure 5D:
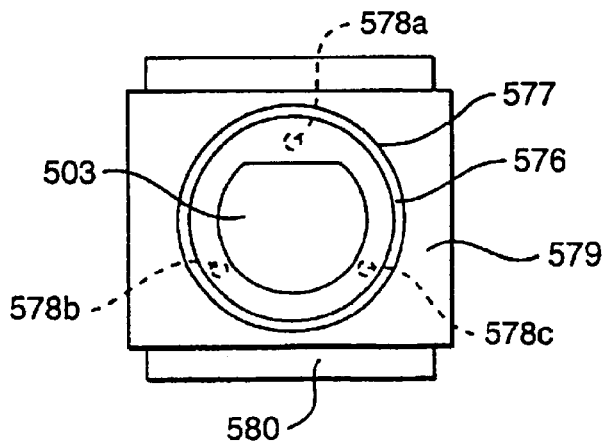
FIG. 5D is a top plan view showing the wafer holding portion of the same system.

FIG. 5D is a top plan view showing the wafer stage portion of the aforementioned stepper. In the same Figure, numeral 503 designates a wafer to be exposed; numeral 576 designates a wafer chuck and θ stage; numeral 577 designates a Z state; numerals 578a to 578c designate individual Z-axis direction drive elements composing the horizontality adjusting means 578; numeral 579 designates an X-table; and numeral 580 designates a Y-table.

Next, the exposing operations of the present stepper will be described in the following. First of all, the optical path between the point on each mask corresponding to the exposure region and the light source is equalized as much as possible by adjusting the gradients of the main mask 514a and the auxiliary mask 514b. Moreover, the optical path between each mask and the corresponding point on the wafer 503 is equalized as much as possible (in terms of the gradient of the wafer). Next, as has been described in connection with Embodiment 3, the positioning mark M is used to accomplish the focusing, the mask registration in the X-Y plane and the adjustment of the phase difference to the phase difference $\phi=\pi$ (after this, the phase difference (which may be a relative one as long as the interference is concerned) $\phi$ is readjusted to correspond to the step so that $\phi$ falls within the range from $3/4\pi$ to $5/4\pi$). After this, the exposure at the same site is executed.

The adjustment of the phase difference is executed by changing the thickness of the optical path control chamber 540a or 540b. Specifically, the distance between the quartz plate 542a and 542b is moved in parallel with one quartz plate.

Moreover, the gradient adjustment of each mask or wafer is executed by the movement in the Z-axis direction by three gradient adjusting means 578a to 578c (in case of the wafer, but by a similar mechanism in case of the mask), as shown in FIG. 5D.

The post-projection lens group 515 (as shown in FIG. 5A) itself has its two sides constructed of the "telecentric" such that the main luminous flux advances in parallel with the optical axis at the two sides of the same lens group. As a result, as in the infinite cylinder length correcting system of a telescope, it is possible to minimize the change of the focusing characteristics as a whole in case a variety of optical elements are interposed between the pre-projection lens group 562a or 562b and the post-projection lens group 515. Since, moreover, the pre-projection lens groups 562a and 562b are disposed separately of the post-projection lens group 515 in the vicinity of the masks 514a and 514b, it is easy to retain the optimum object side numerical aperture.

(6) Embodiment 6

The present embodiment to be described is directed mainly to a mask pattern to be used in the invention, in which a main mask and an auxiliary mask are separately exposed to luminous fluxes and in which these luminous fluxes are composed to have a phase difference of $(2n+1)\pi$ so that the wafer may be exposed to the composed light. In the following description, the main and auxiliary patterns corresponding to identical patterns (on the wafer) on the sub-mask and the main mask are conveniently projected on a common plane, as shown. Moreover, the sizes attached to the identical patterns are converted to those on the wafer in case of the 5:1 size-reducing projection. For the auxiliary pattern, broken lines indicate the boundary between the shielding regions and the opening regions. The opening regions of the auxiliary patterns have their corresponding portions indicated by scattered points.

Figure 6A:
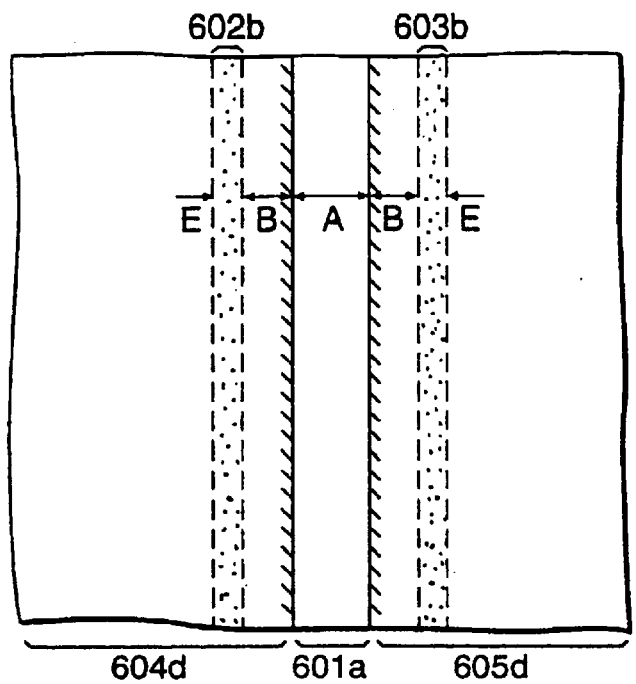
FIG. 6A is a top plan view showing a mask pattern corresponding to an isolated band pattern according to Embodiment 6 of the present invention.

FIG. 6A shows the patterns of main and auxiliary masks in case isolated Al lines (or metal wiring lines, insulating film strips, strip-shaped openings, poly-Si wiring or gate lines, poly-cide wiring lines or gate lines, all of which are represented by the isolated Al lines) are to be exposed by the negative process. (In case linear openings are to be formed, it is naturally necessary to use the positive type resist process in the present mask patterns.) In the same Figure: reference numeral 601a designates that opening on the main mask, which corresponds to the Al line; numerals 604d and 605d designate shielding portions of a chromium film of the same main mask; and numerals 602b and 603b designate the auxiliary patterns (or shift patterns or compensating patterns, which are phase-inverted or merely inverted patterns or inverted slits) on the auxiliary mask. The size A is 0.3 to 0.4 μm; the size B is about 0.2 μm; and the size E is about 0.1 μm.

Figure 6B:
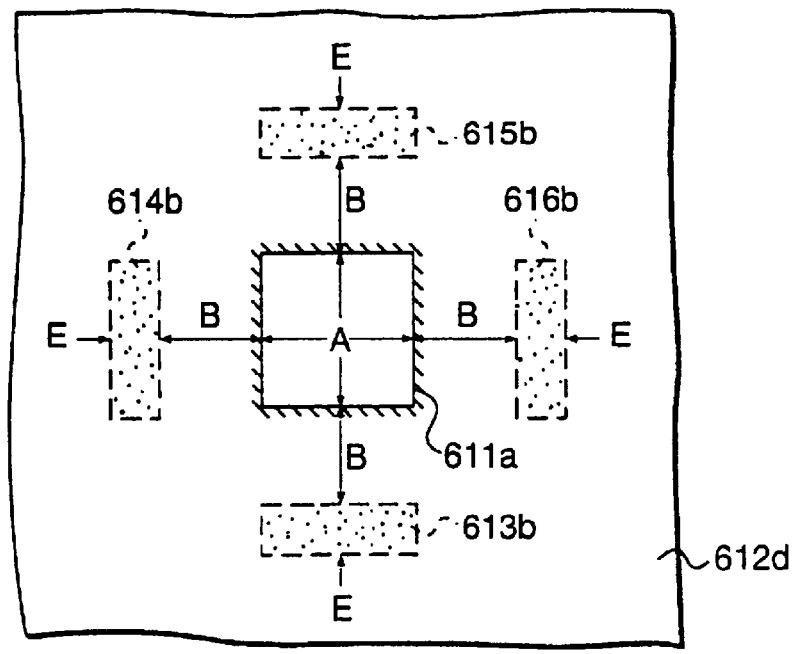
FIG. 6B is a top plan view showing a mask pattern corresponding to the isolated square pattern according to Embodiment 6 of the present invention.

FIG. 6B shows the pattern of the main mask and auxiliary mask of the present Embodiment B. This embodiment corresponds to contact holes, through holes or other isolated holes and uses the positive type resist process (although the negative type resist process is used in case of the isolated film pattern). In the same Figure: reference numeral 611a designates an opening corresponding to the hole (or opening) on the main mask; numeral 612d designates the shielding portion on the same main mask; and numerals 613b, 614b, 615b and 616b designate a group of inverted slits on the auxiliary mask. The sizes are substantially identical for the common symbols to those of the foregoing embodiment.

Figure 6D:
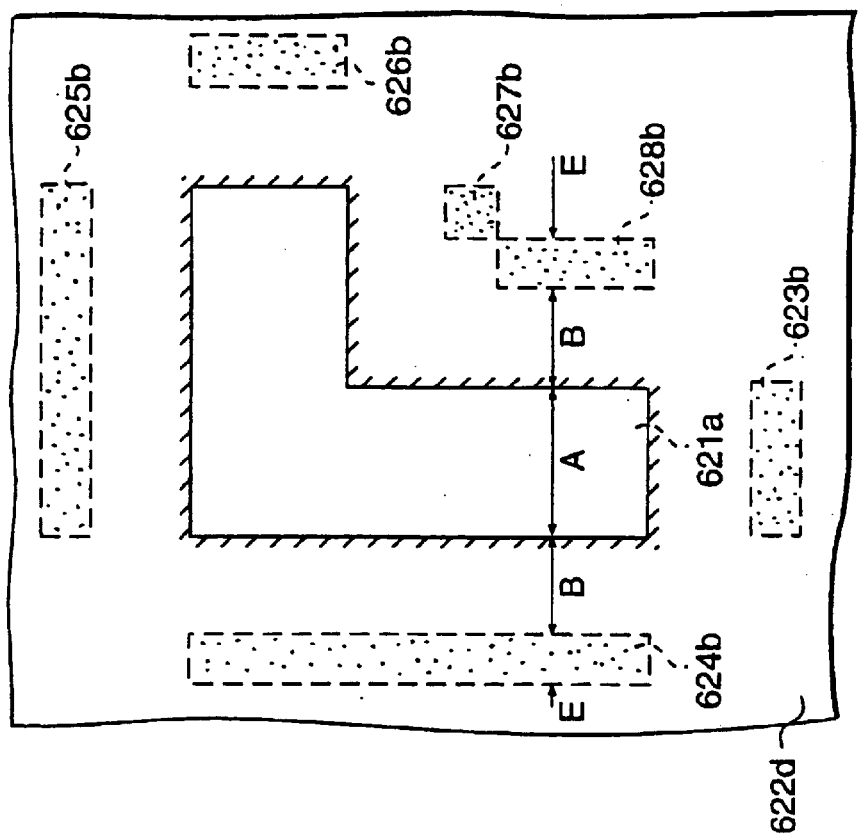
FIG. 6D is a top plan view showing a mask pattern corresponding to an "L"-shaped pattern according to Embodiment 6 of the present invention.
Figure 6C:
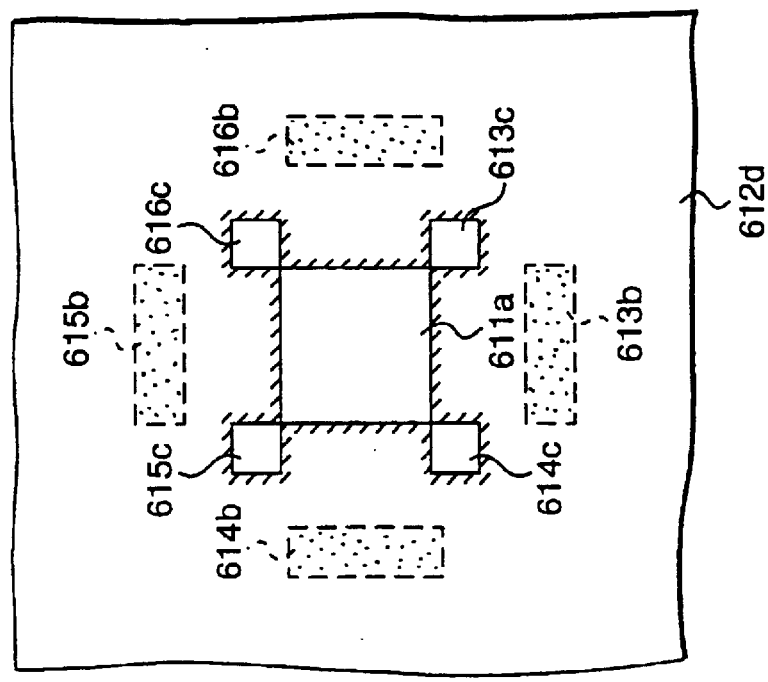
FIG. 6C is a top plan view showing a mask pattern corresponding to a isolated square pattern according to a modification of FIG. 6B.

FIG. 6C shows a mask pattern corresponding the isolated openings or the like of the main and auxiliary masks of Embodiment 6C or a modification of the foregoing Embodiment 6B. In the same Figure, reference numerals 613C, 614C, 615C and 616C designate auxiliary opening patterns (or corner enhancement patterns or enhancers) for preventing the openings from being rounded, and the remaining numerals are wholly identical to those of the foregoing Embodiment 6B. The enhancers a square of about 0.1 μm. This method is effective according to the foregoing Embodiment 6B for preventing the rounding of the corners from being extraordinarily enlarged.

FIG. 6D shows the main and auxiliary mask pattern in case the "L"-shaped opening pattern having its width corresponding to the minimum line width in said exposure process like the foregoing embodiments is to be treated by the positive resist process. In the same Figure: reference numeral 621a designates an opening on the main mask; numeral 622d designates the shielding portion (i.e., a portion of the shielding portion as the auxiliary mask like before. Namely, the portion other than the inverted shifter portion, as indicated by broken lines, is wholly the screening or shielding portion) on the main mask; and numerals 623b, 624b, 625b, 626b, 627b and 628b designate individual shifter region openings on the auxiliary mask. The sizes are designated at the same symbols as those of FIG. 6B. (These symbols designate the equal sizes, unless otherwise specified.) Incidentally, the present pattern is an isolated film pattern such as the "L"-shaped pattern if the negative type resist process is used.

FIG. 6E shows a modification 6E of the aforementioned Embodiment 6D. In the same Figure, reference numeral 621a' designates that opening pattern on the main mask, which corresponds to that 621a of FIG. 6D, and numeral 621d designates an auxiliary screening pattern (or a corner reduction pattern or a reducer) for preventing an excessive expansion inside of the corners of the "L"-shaped type opening on the same main mask. The sizes are equal to those of the enhancers. Numerals 623c, 624c, 625c, 626c and 627c designate opening patterns corresponding to the enhancers and formed on the main mask so as to prevent the excessive reduction of the corners; numeral 622d designates the shielding portion on the main mask; and numerals 623b, 624b, 625b, 626b, 627b and 628b designate individual shifter patterns (or inverted openings).

FIG. 6F designates main and auxiliary patterns corresponding to the negative type resist process of the isolated and bent Al wiring pattern of Embodiment 6F. In the same Figure: reference numeral 631a designates that opening on the main mask, which corresponds to the Al wiring line; numerals 638d and 639d designate the shielding portions on the main mask; and numerals 633b, 634b, 635b and 636b designate shifters running along the Al wiring line. The individual sizes are equal to the others on principle. This pattern can be applied to the formation of band-shaped openings if applied to the positive type resist process.

Figure 6G:
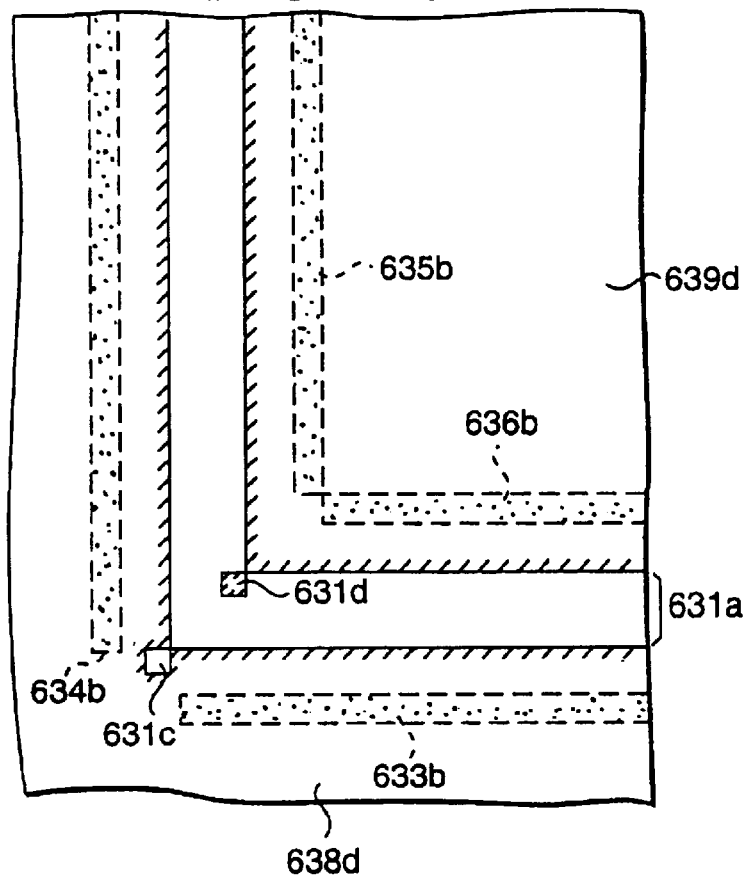
FIG. 6G is a top plan view showing a mask pattern corresponding to a bent isolated band pattern according to a modification of FIG. 6F.

FIG. 6G shows the main and auxiliary mask pattern (corresponding to the negative process of the isolated Al bent pattern or the like) of Embodiment 6G. The present embodiment corresponds to a modification of the foregoing Embodiment 6F.

In the same Figure, reference numeral 631c designates an opening pattern acting as the enhancer, and numeral 631d designates a shielding pattern acting as the reducer. Both of these patterns are formed on the main mask and have sizes equal to those of similar patterns of FIG. 6E. The remaining portions are absolutely identical to those of the foregoing Embodiment 6F.

Figure 6H:
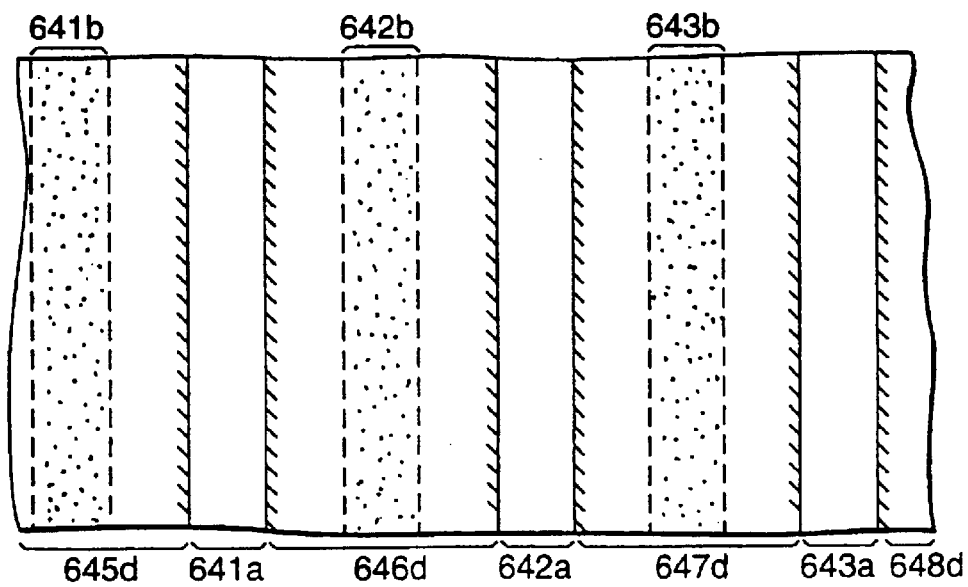
FIG. 6H is a top plan view showing a mask pattern corresponding to an equal-period band pattern according to Embodiment 6 of the present invention.

FIG. 6H shows the main and auxiliary mask patterns for the line-and-space pattern of Embodiment 6H. In this case, the negative resist process is adopted. In the same Figure: reference numerals 641a, 642a and 643a designate those band-shaped opening pattern portions on the main mask, which correspond to the Al line patterns; numerals 641b, 642b and 643b designate those band-shaped shifter opening pattern portions (or complementary line patterns) on the auxiliary mask, which correspond to the Al line pattern portions; and numerals 645d, 646d, 647d and 648d designate shielding portions on the main mask. The sizes are 0.3 μm for both the lines and spaces (as converted on the wafer). Incidentally, in the positive case, it is necessary, as shown, to replace the shielding portions between the opening on the main mask and the opening on the auxiliary mask by their adjacent openings. In other words, the opening of the main or auxiliary mask has to be located in the portion corresponding to the space. This location is identical to that of the case in which the periodic band-shaped openings are to be formed.

The mask patterns of Embodiments 6A to 6H can be applied not only to the aforementioned multi-mask systems (of Embodiments 1 to 5) but also to the on-mask phase shift (i.e., the phase shifting exposure method using one mask which is formed with both a shifter pattern having an inverted transparent film of a relative phase difference of φ=π and a main pattern of φ=0 on one mask). In this case, the masks may be prepared while leaving the patterns of FIGS. 6A to 6H as they are on the masks.

(7) Embodiment 7

Here will be described the wafer processing and exposure process to be used in the embodiment of the present invention.

Figure 7A:
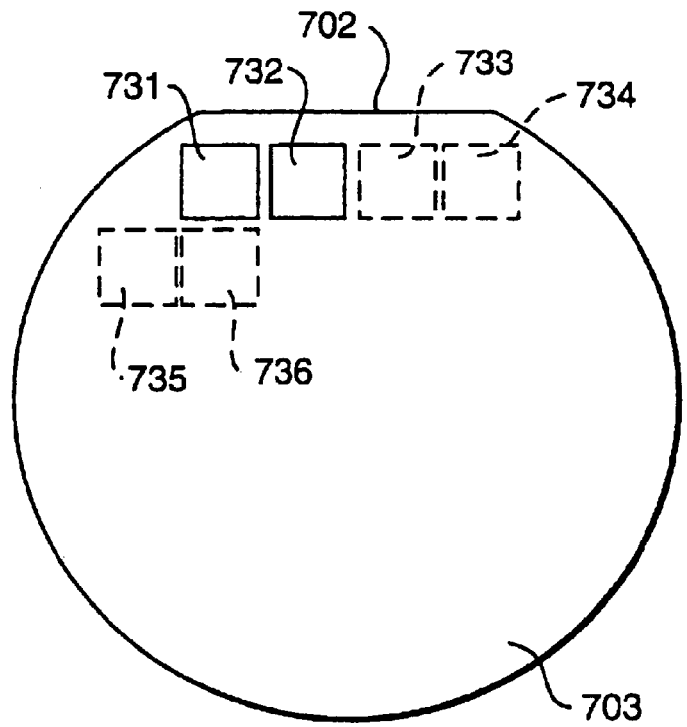
FIG. 7A is a top plan view showing a wafer at an exposure step according to Embodiment 7 of the present invention.

FIG. 7A is a top plan view of the wafer showing the exposure flow of the 5:1 size-reducing step-and-repeat projection exposure. In the same Figure: numeral 703 designates a wafer (e.g., wafer of 8 inches and single crystal Si) to be exposed; numeral 702 designates an orientation flat of the wafer; numerals 731 and 732 designate the exposed regions (i.e., the unit exposure regions which are optically irradiated by a single exposure action); and numerals 733 to 736 designate the individual unit exposure regions to be exposed. These regions cover the substantially whole area of the upper face of the aforementioned wafer 703.

Figure 7B:
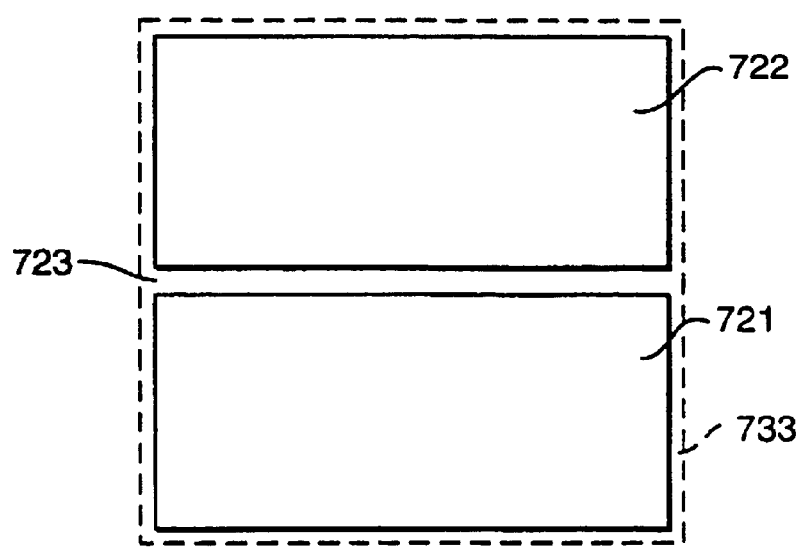
FIG. 7B is a top plan view showing a unit exposure region in an exposure method according to Embodiment 7 of the present invention.

FIG. 7B is a top plan view showing the relations among the unit exposure regions 733, individual chip regions 721 and 722, and an inter-chip region 723 in case of a memory IC.

Figure 7C:
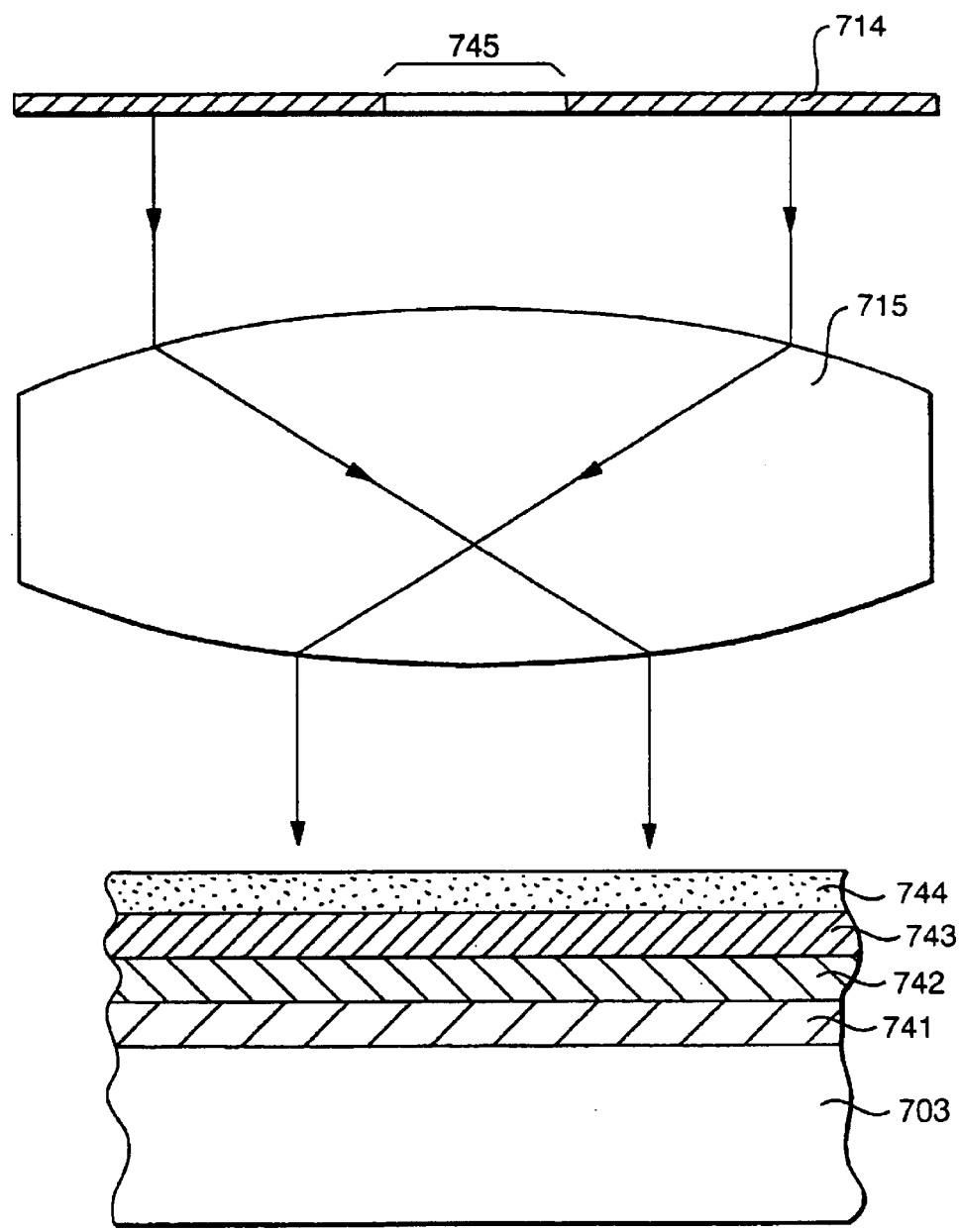
FIGS. 7C to 7E are flow sections showing a positive process according to Embodiment 7 of the present invention.
Figure 7D:
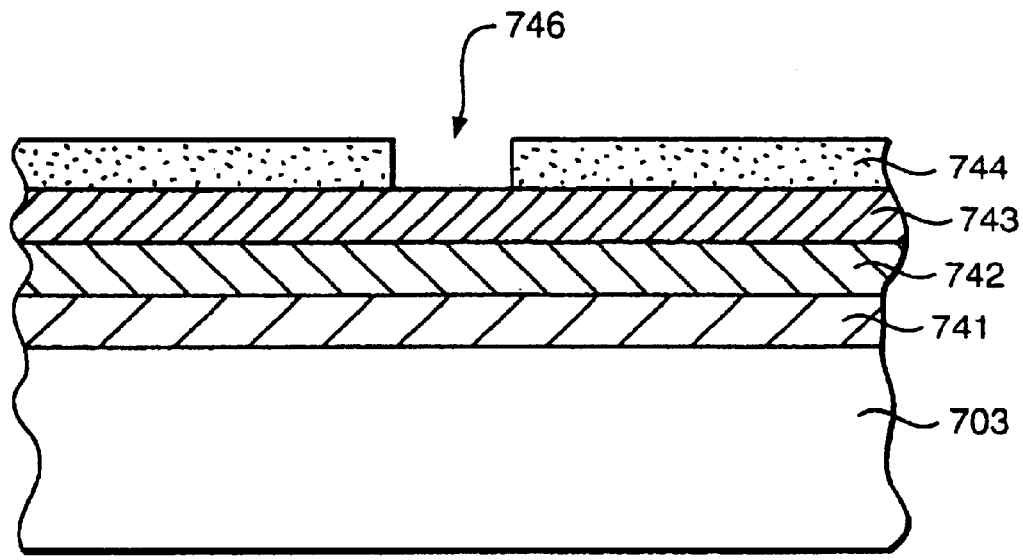
Figure 7E:
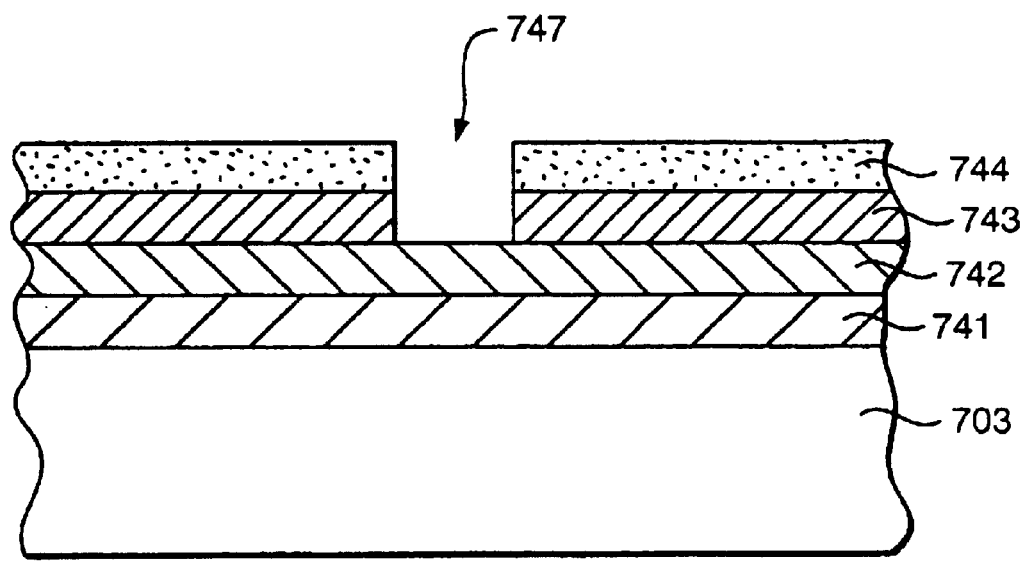
Figure 7F:
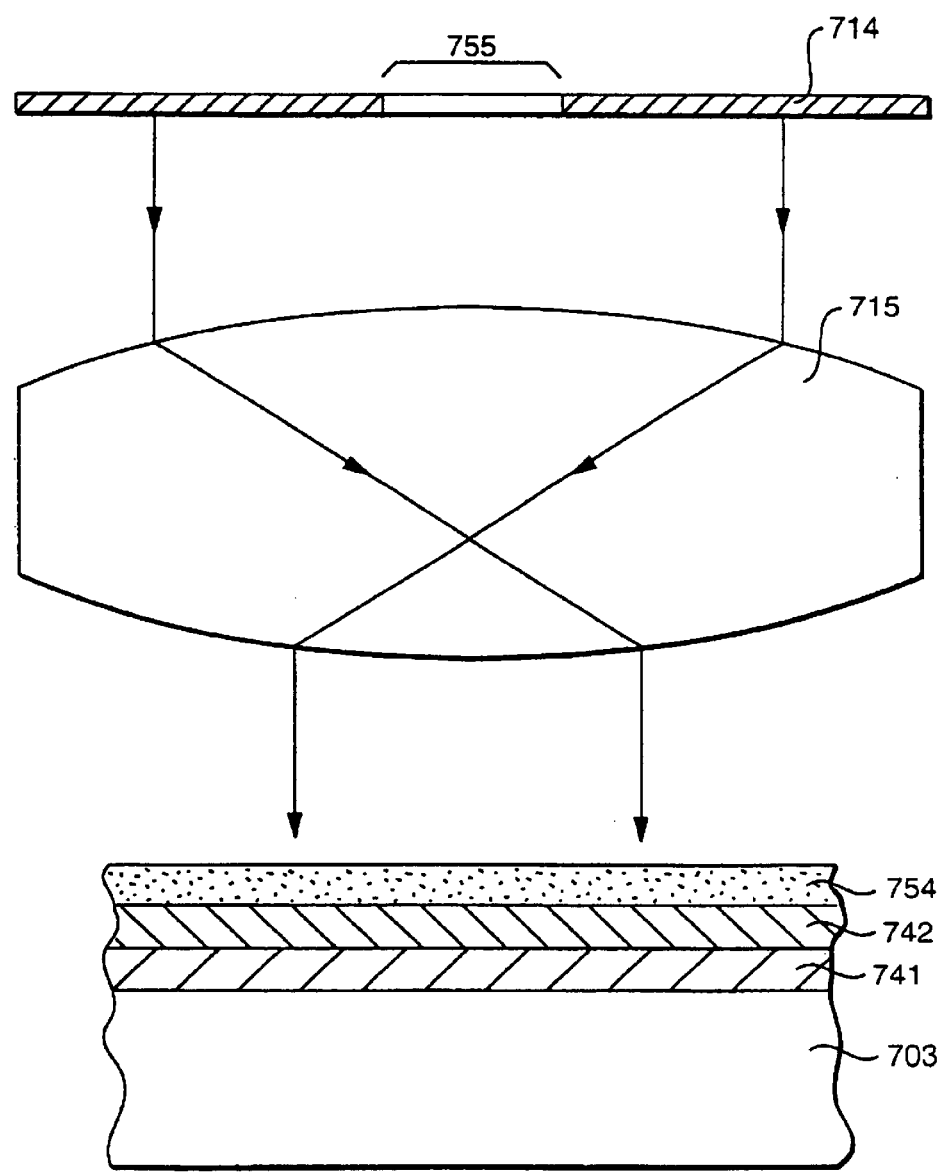
FIGS. 7F to 7H are flow sections showing a negative process according to Embodiment 7 of the present invention.

FIGS. 7C to 7E and FIGS. 7F and 7H are schematic sections for explaining the exposure process using the positive and negative resists of the present invention and the flow of the wafer process. FIGS. 7C and 7F show optical diagrams and examples of the on-mask phase shift (i.e., the phase shifting method using one mask, which shows the main pattern only but omits the shifter) as to the mask. In the multi-mask case, the presentation is absolutely identical to this because the optical path is divided midway into two halves which are composed into one on the wafer surface.

In FIGS. 7C to 7E: reference numeral 714 designates a positive type mask; numeral 745 designates the opening of the mask 714; numeral 714 designates a size-reducing projection lens system which is shown in another embodiment; numeral 703 designates a wafer to be processed, which is sucked by the vacuum onto the wafer stage of the stepper; numeral 741 designates a first oxide film on the principal plane of the semiconductor wafer; numeral 742 designates an Al wiring pattern formed thereover; numeral 743 designates a second oxide film formed all over the former; and numeral 744 designates a positive type resist (which should be referred to Embodiment 16) film applied (to a thickness of 0.6 µm) to the whole surface of the former by the spinner.

In FIG. 7D, reference numeral 746 designates an opening formed in a predetermined portion in the resist film 744.

In FIG. 7E, reference numeral 747 designates a through hole of the second oxide film, which is formed as the mask of the resist film 744.

Figure 7G:
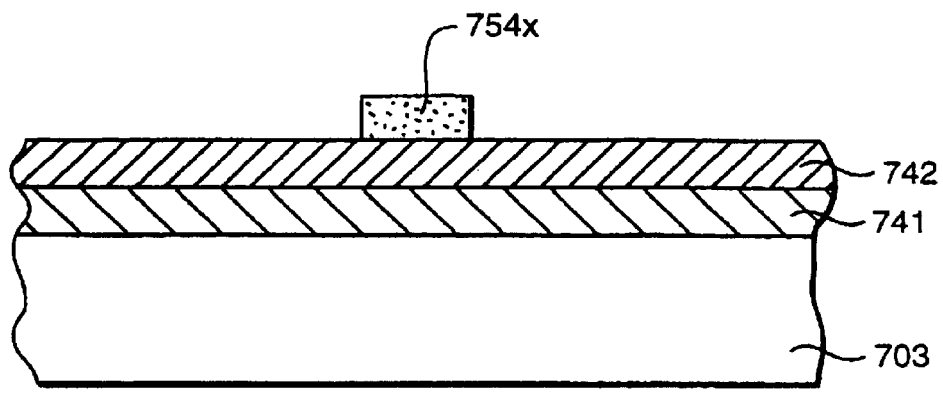
Figure 7H:
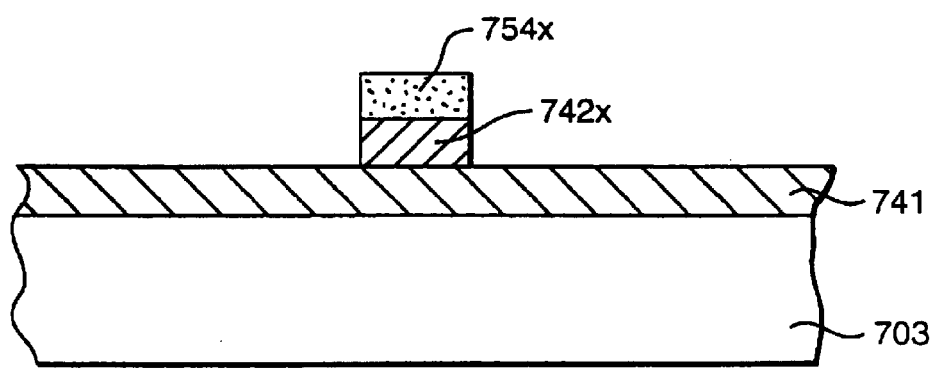

In FIGS. 7F to 7H: reference numeral 714 designates a negative type mask; numeral 744 designates an opening or transparent pattern of the mask 714; numeral 715 designates the same size-reducing projection lens system as the foregoing one; numeral 703 designates the semiconductor wafer which is sucked onto the wafer stage of the stepper, as before; numeral 741 designates an oxide film formed over the principal plane of the wafer; numeral 742 designates an Al film applied to cover the whole surface of the oxide film by the sputtering; and numeral 754 designates a negative type photo resist film formed on (or applied to) the Al film and having a thickness of about 0.6 µm.

In FIG. 7G, reference numeral 754x designates a patterned resist film.

In FIG. 7H, reference numeral 742x designates an Al wiring pattern which is patterned by using the resist film 754x as the mask.

Figure 7I:
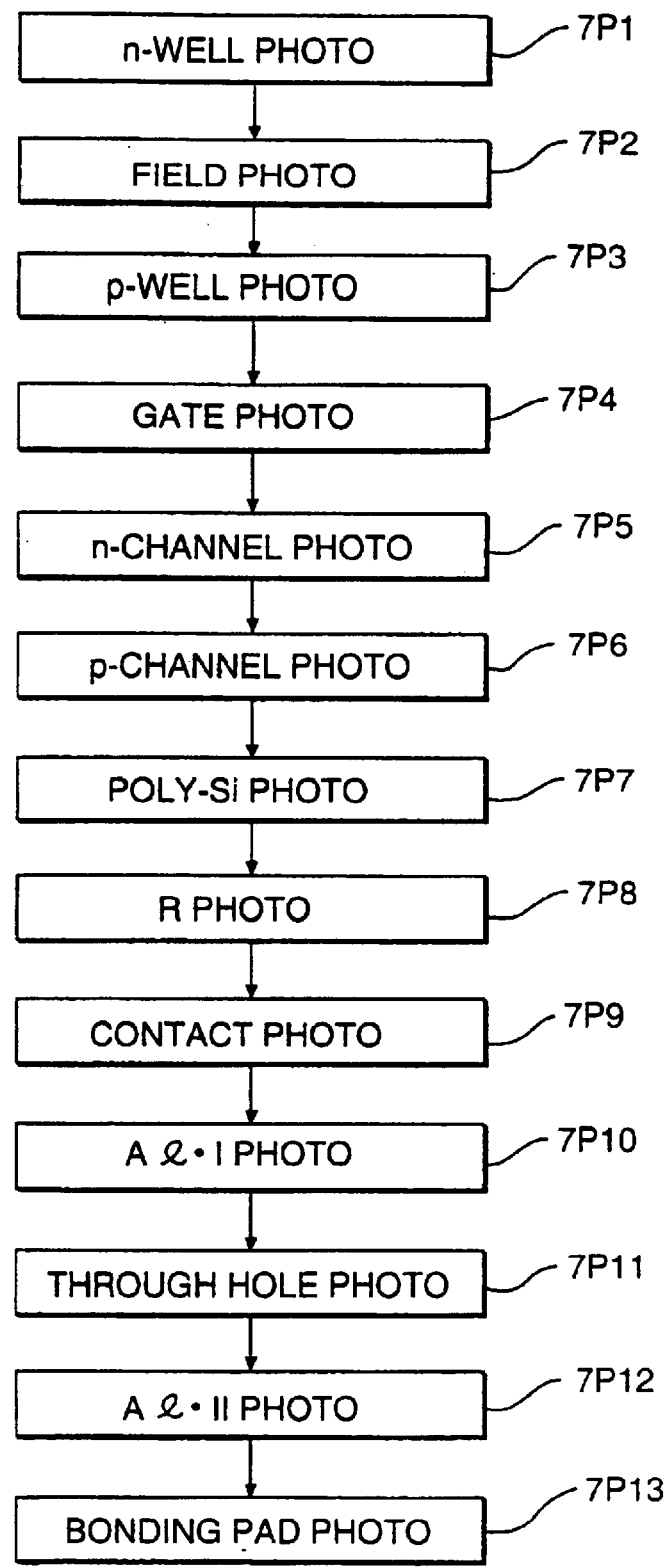
FIG. 7I is an overall flow chart showing a photolithography step in a twin-well SRAM according to Embodiment 7 of the present invention.
Figure 7P:
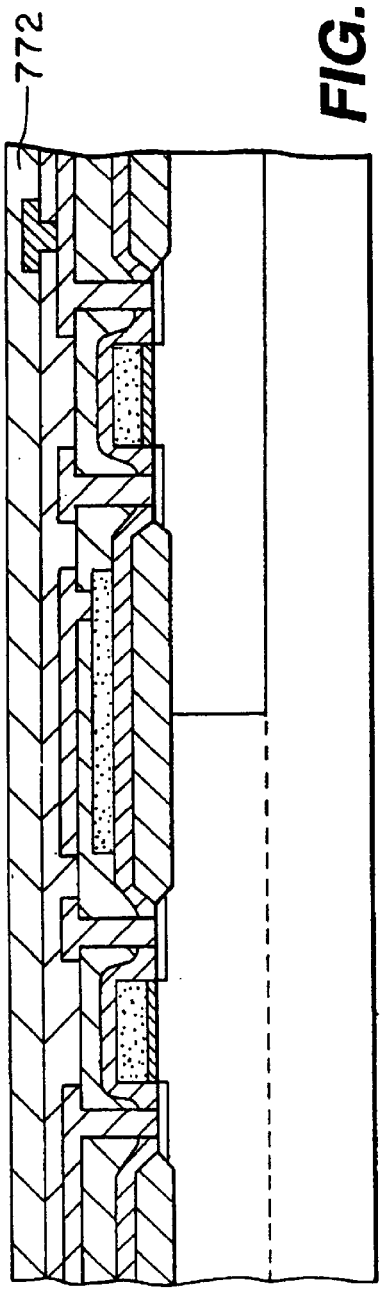
Figure 7Q:
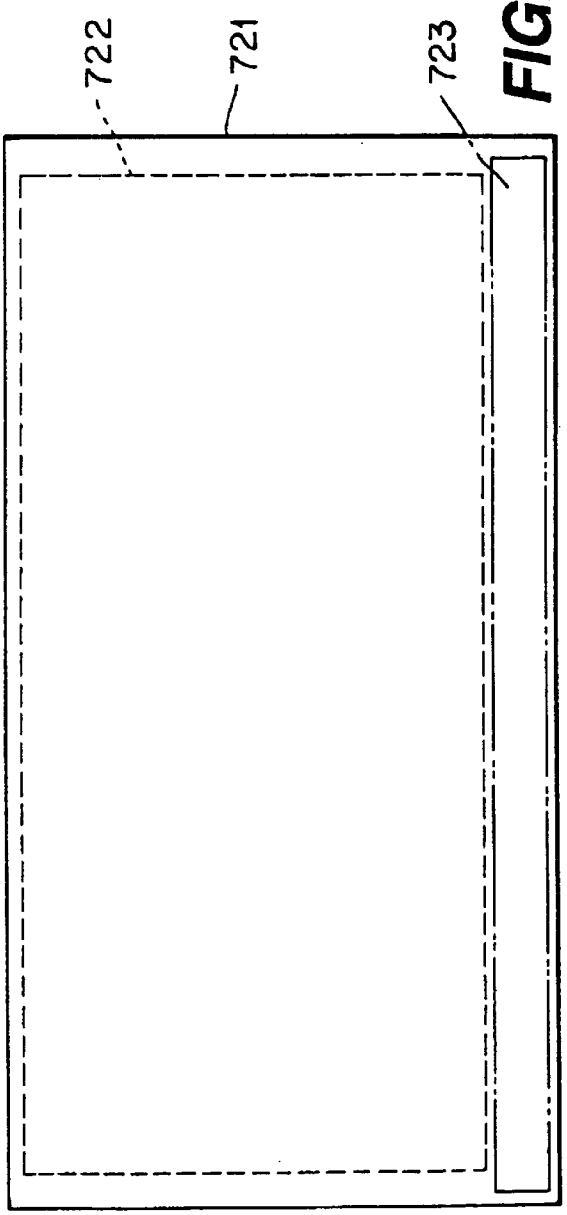
FIG. 7Q is a top plan layout showing a chip region of the aforementioned SRAM.

FIGS. 7J to 7P are sections showing the process flow for fabricating a CMOS static RAM (i.e., SRAM) according to the twin well method, and FIG. 7Q is a layout showing the chip. The structure will be sequentially described in the following.

FIG. 7J shows a process for forming n- and p-wells according to the twin well process. In the same Figure: reference numeral 703 designates an n$^-$-type Si single crystal wafer (or substrate); numeral 760n designates the n-type well region; and numeral 760p designates the p-type well region.

FIG. 7K shows a subsequent gate forming process and a process for forming the source and drain of each FET by the ion implantation in a self-alignment manner by using the formed gate as the mask. In the same Figure: reference numerals 761a to 761c designate LOCOS oxide films; numerals 762p and 762n designate gate oxide films; numerals 763p and 763n designate polysilicon gate electrodes (of polycide); and numerals 764p and 764n designate p- and n-type highly doped source and drain regions, respectively.

FIG. 7L shows an inter-layer PSG film forming process and a second-layer poly-Si wiring line and high resistor forming process. In the same Figure: reference numeral 765 designates an inter-layer PSG film; numeral 766 designates a second-layer poly-Si wiring line; and numeral 766r designates a poly-Si high resistor acting as a load resistor of the SRAM memory cell.

FIG. 7M shows a flattening process by an SOG and a contact hole or through hole forming process. In the same Figure: reference numeral 767 designates an SOG film; numerals 768a, 768b, 768d and 768e designate contact holes with the Si substrate; and numeral 768c designates a through hole in the second-layer poly-Si wiring line and the upper layer.

FIG. 7N shows a first-layer Al wiring line forming process. In the same Figure, reference numerals 769a to 769e designate the first-layer Al wiring line.

FIG. 7O shows a process for forming an inter-layer insulating film over the first-layer Al wiring line and a second-layer Al wiring line forming process. In the same Figure, reference numeral 770 designates an inter-layer insulating film over the first-layer Al wiring line, and numerals 771a and 771b designate second-layer Al wiring line connected with the underlying Al wiring line through holes.

FIG. 7P shows a process for forming a final passivation film over the second-layer Al wiring line. In the same Figure, reference numeral 772 designates a final passivation film.

FIG. 7Q is a top plan view showing the layout of the aforementioned SRAM at the unit of a chip. In the same Figure: numeral 721 designates the chip; numeral 722 designates a memory cell mat; and numeral 723 designates a peripheral circuit including an address decoder and a read/write circuit.

FIG. 7I is a flow chart showing a process for photolithography in the aforementioned SRAM fabricating process, i.e., an exposure process in the flow form. In the same Figure, an n-well photo step 7P1 is one for forming a resist pattern over a $Si_3N_4$ film (or substrate) so as to cover those other than the portion to be formed into the n-well, and a field photo step 7P2 is one for covering and patterning a photo resist film so that the $Si_3N_4$ may be patterned to cover the P-channel and N-channel active regions. A p-well photo step 7P3 is one for patterning the resist film to cover the n-well so as to form the p-well channel stopper region, and a gate photo step 7P4 is one for patterning the resist film over the poly-Si or polycide layer covering the whole surface so as to pattern the gate electrodes 763p and 763n. The detail of the process till this step has been briefly described because it will be described in more detail with reference to FIGS. 8A-1 to 8E-2. An n-channel photo step 7P5 is one for patterning the resist film at the p-channel side so as to implant the n-channel side with ions of n-type impurity by using the gate 763n as the mask; a poly-Si photo step 7P7 is one for forming a resist pattern over the poly-Si film covering all over the surface, so as to pattern the second-layer poly-Si film to be formed into the second layer wiring line 766 or high resistor 766r (as shown in FIG. 7L); an R photo step 7P8 is one for patterning the resist film acting as the mask by the negative process so as to implant the remaining portions with impurity ions such that the poly-Si high resistor 766r (as shown in FIG. 7L) is covered with the resist film; a contact photo step 7P9 is one for covering and patterning a resist pattern by a positive process for forming the contact holes 768a to 768e (as shown in FIG. 7M) to provide contacts between the substrate, the source/drain regions, the first-layer poly-Si layer and the second-layer poly-Si layer, and the first-layer Al wiring line (Al-I); and Al-I photo step 7P10 (as shown in FIG. 7N) is a resist patterning process for patterning the Al-I; a through hole photo step 7P11 is one for forming a resist pattern for opening through holes to connect the Al-I and the second-layer Al wiring line; an Al-II photo step 7P12 (as shown in FIG. 7O) is a resist patterning step for patterning the All-II; and a bonding pad photo step 7P13 is one for covering the final passivation film other than the pads with a resist film so as to form openings of squares of about 100 µm corresponding to the bonding pads in the final passivation film 772.

Of these steps for the exposure process, the n-well photo 7P1, the n-channel photo 7P5, the p-channel photo 7P6 and the bonding pad photo 7P13 have relatively large minimum sizes so that the phase shifting method need not be generally used.

On the other hand, the remaining steps of the exposure process of FIG. 7I are effective if the "phase inverted shifting method" of the individual embodiments of the present invention is applied. This "phase inverted shifting method" is a concept containing both the "multi-mask phase shifting method" and the "on-mask phase shifting method".

Incidentally, in case there is a considerable step between the individual planes of the memory mat 722 of FIG. 7Q and the peripheral circuit portion.

(8) Embodiment 8

FIGS. 8A-1 to 8O-2 are process flows of 16 MDRAMs according to the present invention. The fundamental design rules are 0.6 µm, the stack type memory cell and the LOCOS oxide film separation, and the fundamental features are the twin well CMOS structure, the $WSi_2$ poly-cide bit lines, and the two-layered Al wiring line using $WSi_2$/TiN lines. In the following process, the photo resist removing step, the pretreatment (e.g., rinsing) and post treatment steps, the inspection step and the back treating step will be omitted.

Figures 2, 8A:
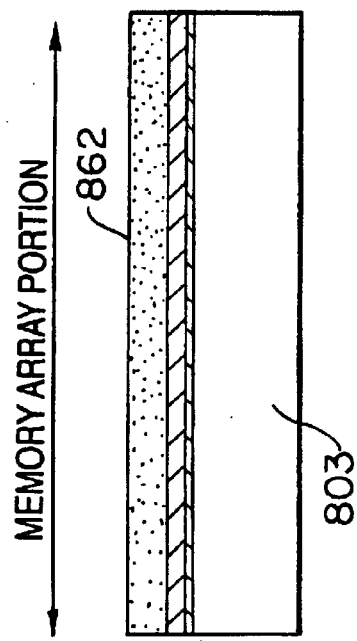
Figures 1, 8A:
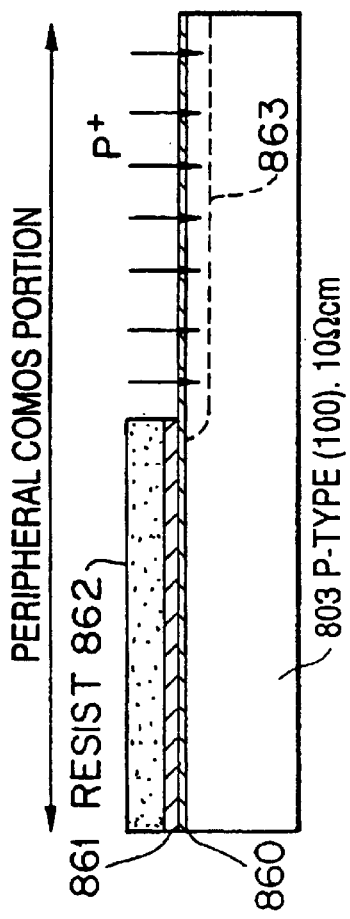

FIGS. 8A-1 to 8A-2 are sections showing an n⁻-type well forming process using the ion implantation. In the same Figures, reference numeral 803 designates a Si single crystal wafer of P type, which has a resistivity of 10 Ω·cm (in which the dopant is boron) and has its principal plane located in the mirror plane (100). Numeral 860 designates a thin thermal oxide film; numeral 861 designates a $Si_3N_4$ film acting as an oxygen resisting mask; and numeral 862 designates a patterned resist layer acting as the ion implanting mask. Numeral 863 designates an n-well region which is doped with P (phosphor).

Figures 2, 8B:
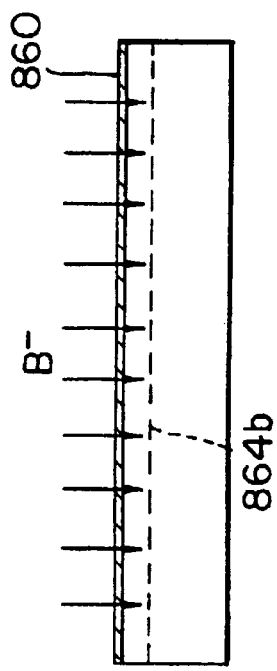
Figures 1, 8B:
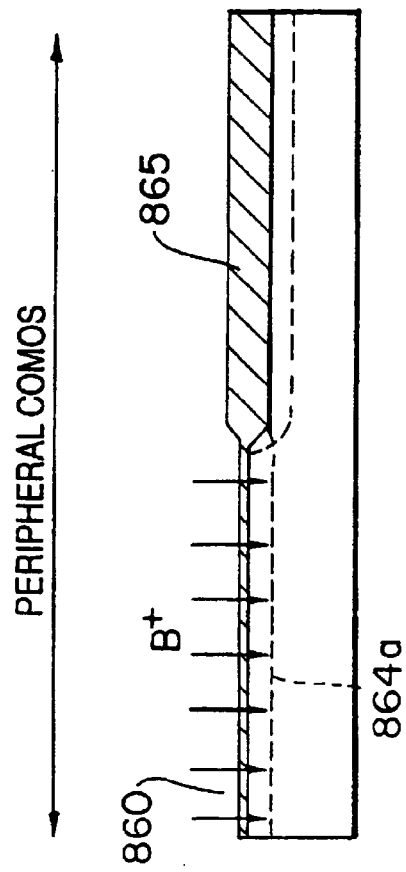

FIGS. 8B-1 to 8B-2 are sections showing a p⁻-type well forming process by an ion implantation. In FIGS. 8B-1 to 8B-2: reference numeral 865 designates a thick Si oxide film ($SiO_2$) formed by the thermal oxidation; numeral 864a designates a p-well region of the peripheral circuit; and numeral 864b designates a p-well region of the memory array portion.

Figures 2, 8C:
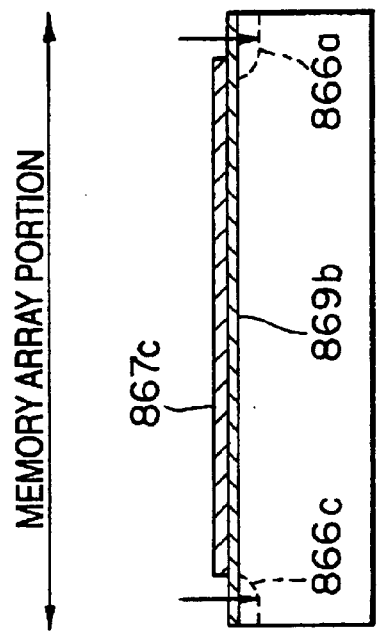

FIGS. 8C-1 and 8C-2 are sections showing a process for forming p⁺-type channel stopper region with B (boron). In the same Figures: reference numerals 866a to 866d designate p⁺-type channel stopper regions; numerals 867a to 867c designate $Si_3N_4$ films acting as an oxygen resisting and ion implanting mask; numeral 868 designates a photo resist film acting as the ion implanting mask; and numerals 869a and 869b designate gas oxide films.

Figures 2, 8D:
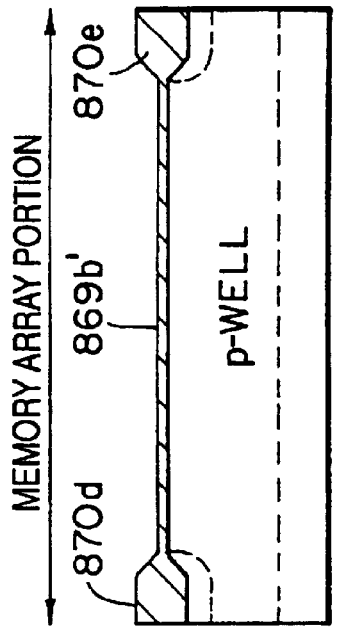
Figures 1, 8C:
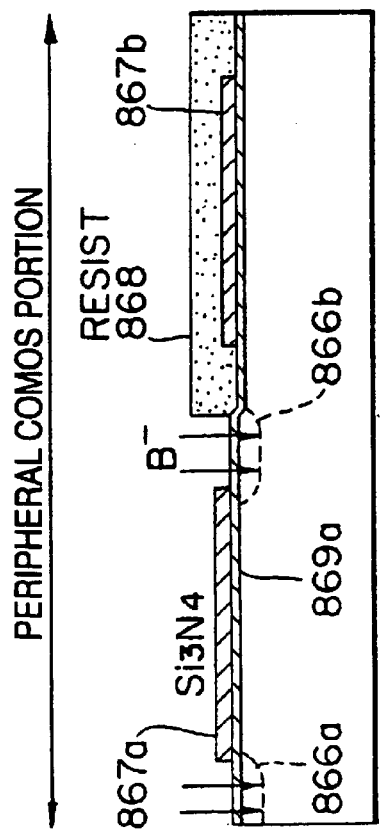
Figures 1, 8D:
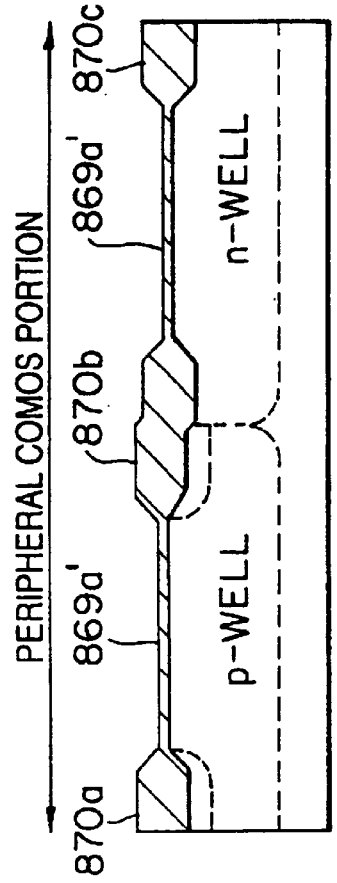

FIGS. 8D-1 and 8D-2 are sections showing the state in which the LOCOS oxide film is formed. In the same Figures, reference numerals 870a to 870e designate LOCOS oxide films.

FIGS. 8E-1 and 8E-2 are sections showing a phosphor added Si gate forming process and n-channel source/drain forming process. In the same Figures: reference numerals 871a, 871c and 871d designate the gate electrodes (of P-doped poly-Si) of an n-channel FET; numeral 871b designates the gate electrode (of P-doped polysilicon) of a p-channel FET; numerals 872a to 872e designate P (phosphor) ion doped regions corresponding to the n-channel sources or drains; and numeral 873 designates a photo resist film acting as an ion implantation resisting mask.

FIGS. 8F-1 and 8F-2 show a process for forming a highly doped n-channel source/drain region after a side wall has been formed. In the same Figures: reference numerals 872x and 872y designate p-channel source/drain regions; numeral 874 designates a photo resist film acting as an ion implantation resisting mask; and numerals 875a to 875d designate side wall insulating films ($SiO_2$).

Figures 1, 8G:
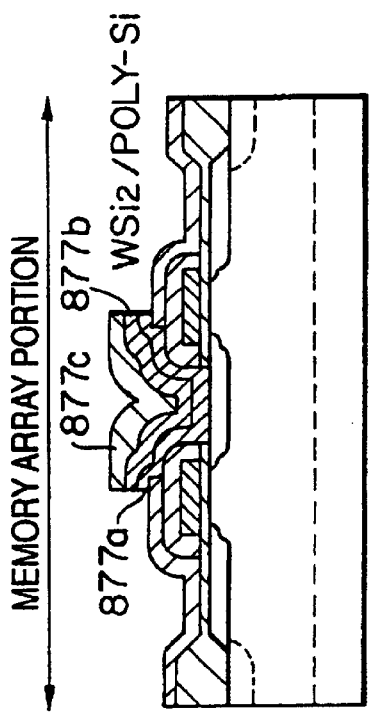
Figures 2, 8G:
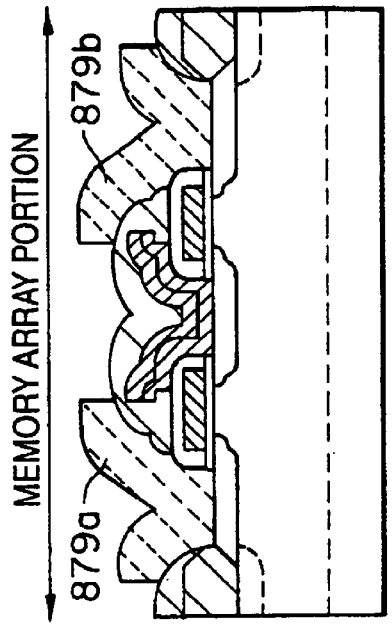

FIGS. 8G-1 and 8G-2 are sections showing an inter-layer $SiO_2$ deposition process and a poly-cide bit line forming process. In the same Figures, reference numeral 877a designates a (phosphor added) poly-Si film, whereas numeral designates a silicide ($WSi_2$) film, and these films form the bit lines. Numeral 877c designates a $SiO_2$ film by the CVD, and numeral 876 designates a $SiO_2$ film formed (or deposited) by the CVD after As (arsenic) has been implanted.

Figures 1, 8H:
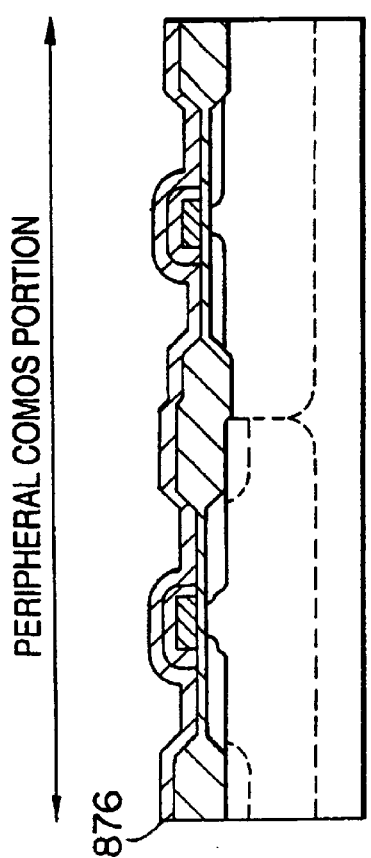
Figures 2, 8H:
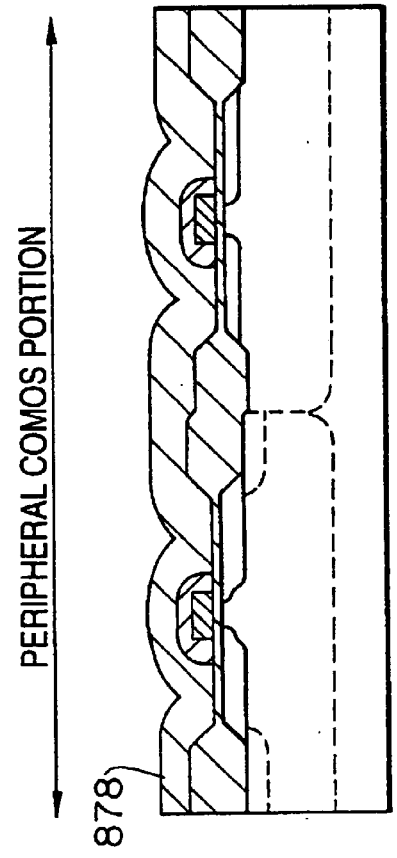

FIGS. 8H-1 and 8H-2 are sections showing a process for forming poly-Si electrodes to be used as the individual electrodes of a memory cell. In the same Figures, reference numeral 878 designates a $SiO_2$ film formed integrally with the $SiO_2$ films 876 and 877c, and numerals 879a and 879b designate poly-Si deposited films to be used as the individual electrodes of the capacitor of the memory cell.

Figures 2, 8I:
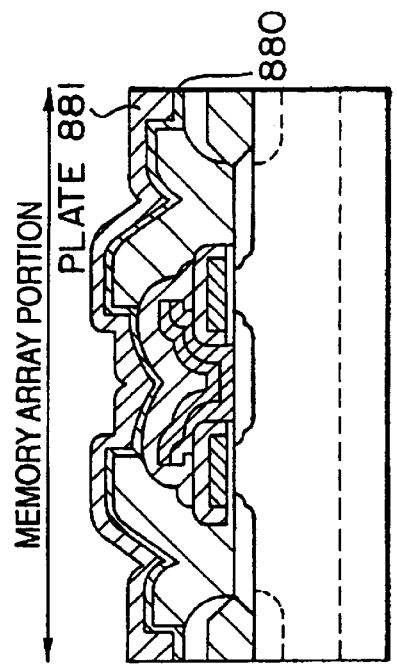

FIGS. 8I-1 and 8I-2 are sections showing a process for forming a capacitor plate to be used as the other common electrode of the capacitor of the memory cell. In the same Figures, reference numeral 880 designates a $Si_3N_4$ film to be used as a dielectric element of the capacitor, and numeral 881 designates a phosphor added poly-Si deposited film to be used as the plate electrode.

Figures 2, 8J:
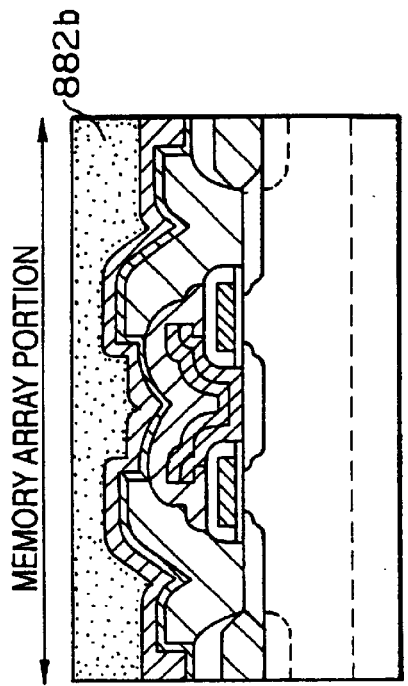
Figures 1, 8I:
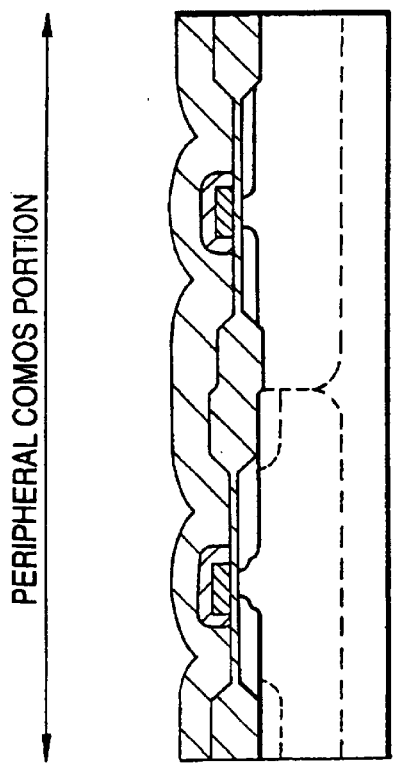
Figures 1, 8J:
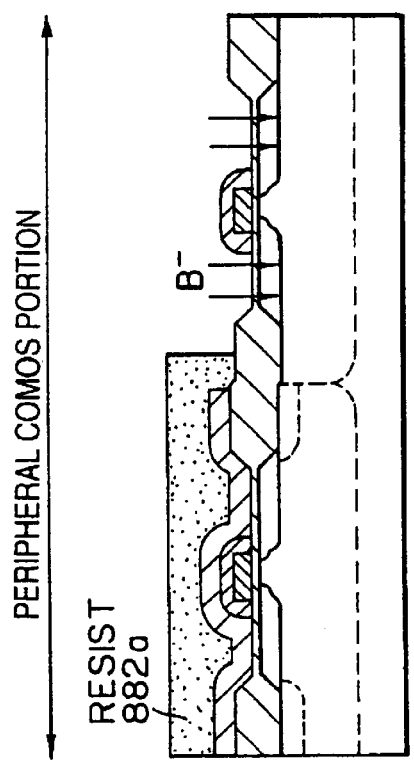

FIGS. 8J-1 and 8J-2 are sections showing a process for forming a highly doped source and drain of a p-channel FET by the implantation of B⁺ (boron). In the same Figures, reference numerals 882a and 882b designate resist films to be used as an ion implantation resisting mask.

Figures 1, 8K:
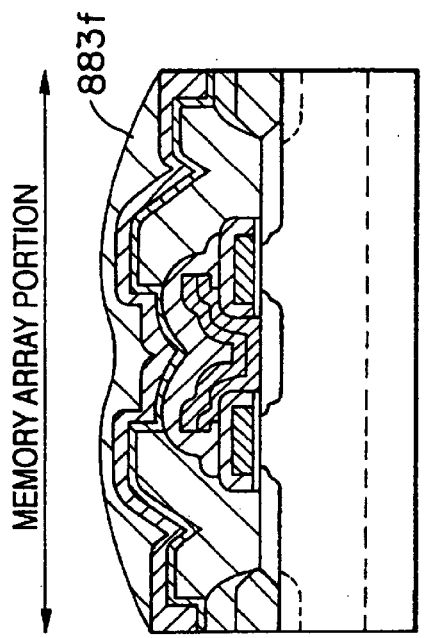
Figures 2, 8K:
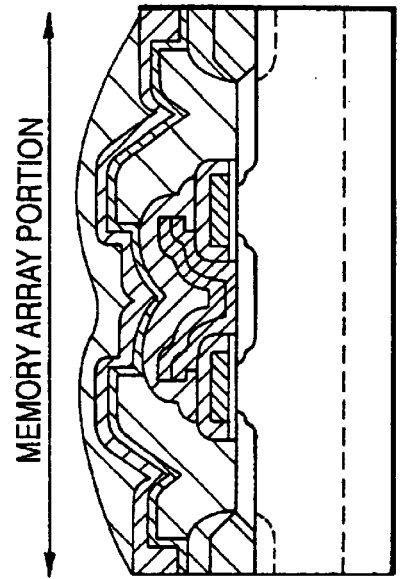

FIGS. 8K-1 and 8K-2 are sections showing a re-flow process of the inter-layer insulating film. In the same Figures, reference numerals 883a to 883f designate re-flow films of BPSG (i.e., Boro-Phospho Silicate Glass) film, and numerals 884a to 884d designate contact holes formed in the former.

Figures 1, 8L:
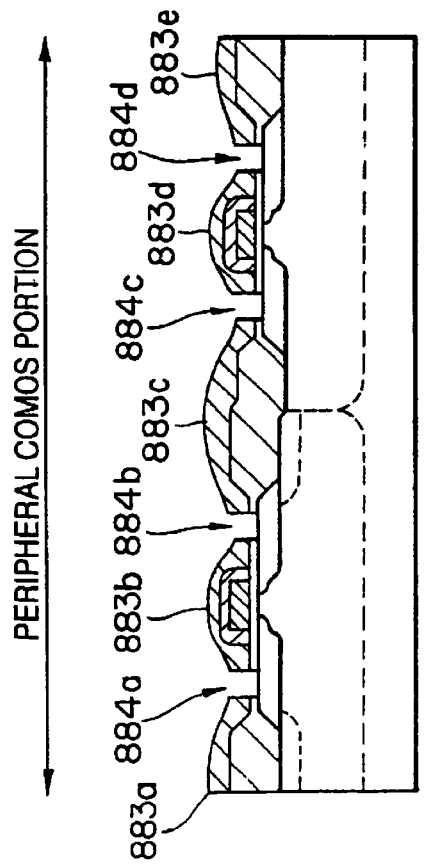
Figures 2, 8L:
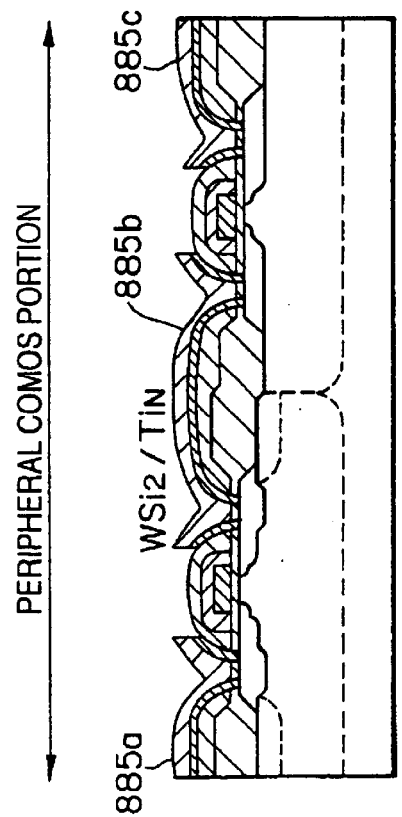

FIGS. 8L-1 and 8L-2 are sections showing a process for forming a silicide ($WSi_2$/TiN) wiring line. In the same Figures, numerals 885a to 885c designate silicide wiring line layers which are formed of two deposited films, i.e., the lower TiN film and the upper tungsten silicide ($WSi_2$) film.

Figures 1, 8M:
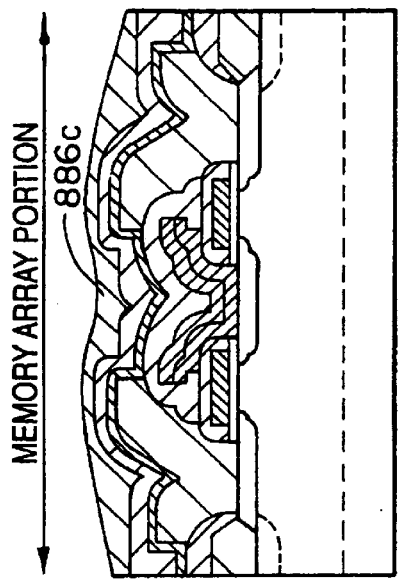
Figures 2, 8M:
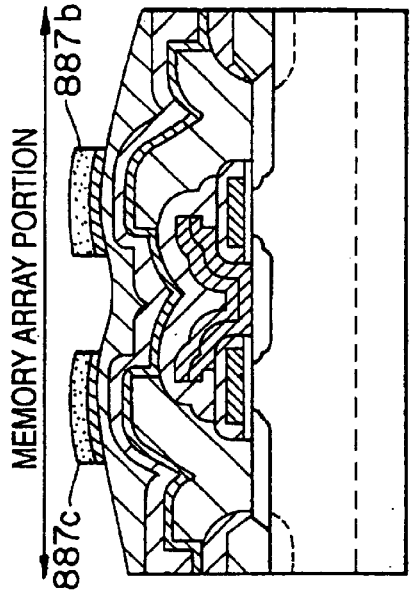

FIGS. 8M-1 and 8M-2 are sections showing a process for depositing an inter-layer PSG (i.e., Phospho-Silicate-Glass) and forming the through holes. In the same Figures, reference numerals 886a to 886c designate inter-layer insulating films of three deposited layers of PSG/SOG/PSG.

Figures 1, 8N:
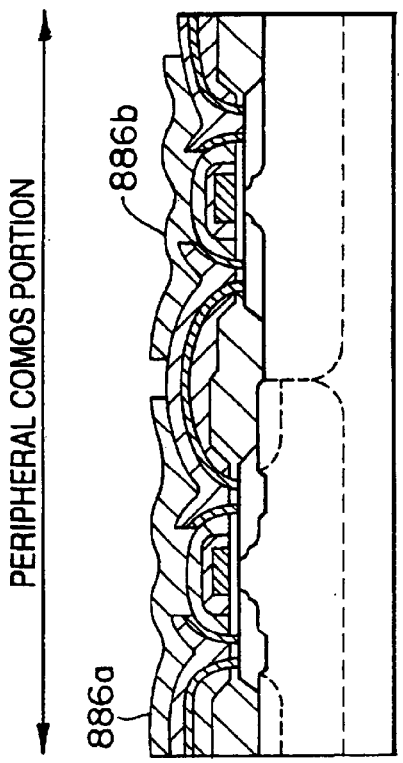
Figures 2, 8N:
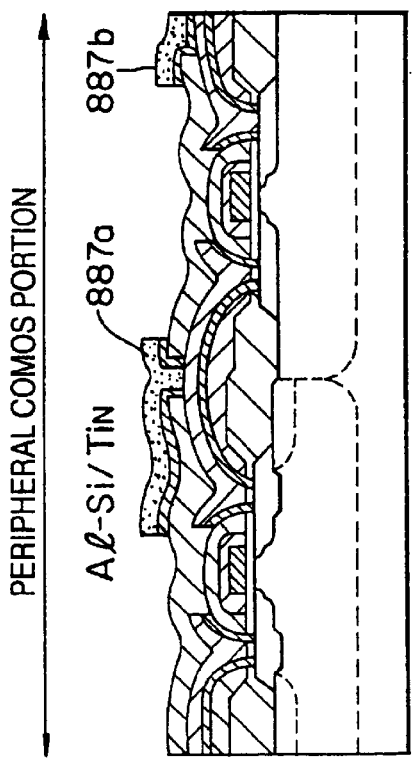
Figures 2, 80:
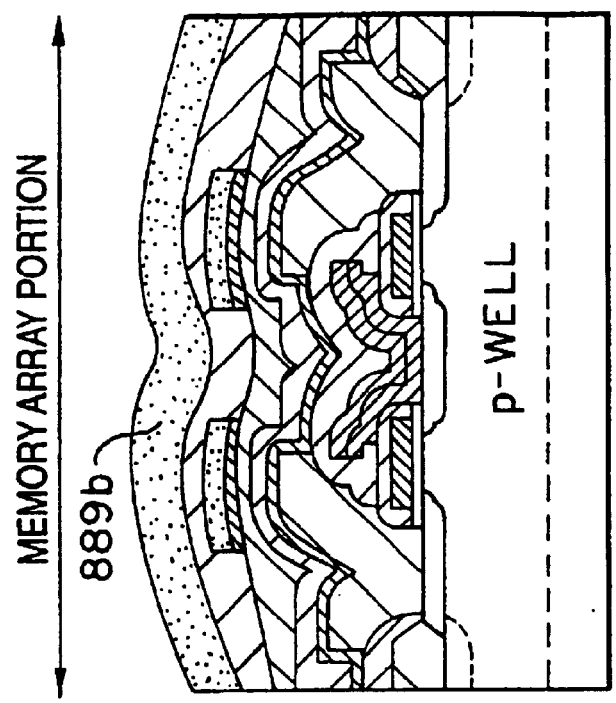
Figures 1, 80:
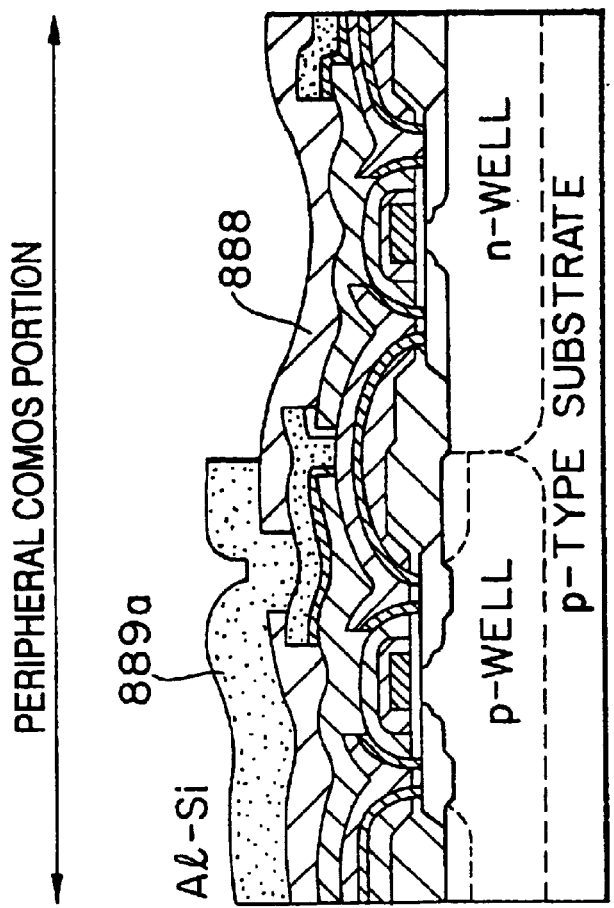

FIGS. 8N-1 and 8N-2 are sections showing a process for forming a first-layer Al wiring line. In the same Figures:

reference numerals 887a to 887d designate a lower TiN buffer layer and an upper Al (containing 99% of Al and about 1% of Si) wiring layer (Al-I).

FIGS. 8O-1 and 8O-2 are sections showing a process for forming an upper inter-layer PSG film and a second-layered All wiring line (Al-II). In the same Figures, reference numeral 888 designates an inter-layer PSG film formed of three deposited films of PSG/SOG/PSG like the foregoing films 886a to 886c. Numerals 889a and 889b designate second-layer Al (Al-II) wiring layers.

Figure 8P:
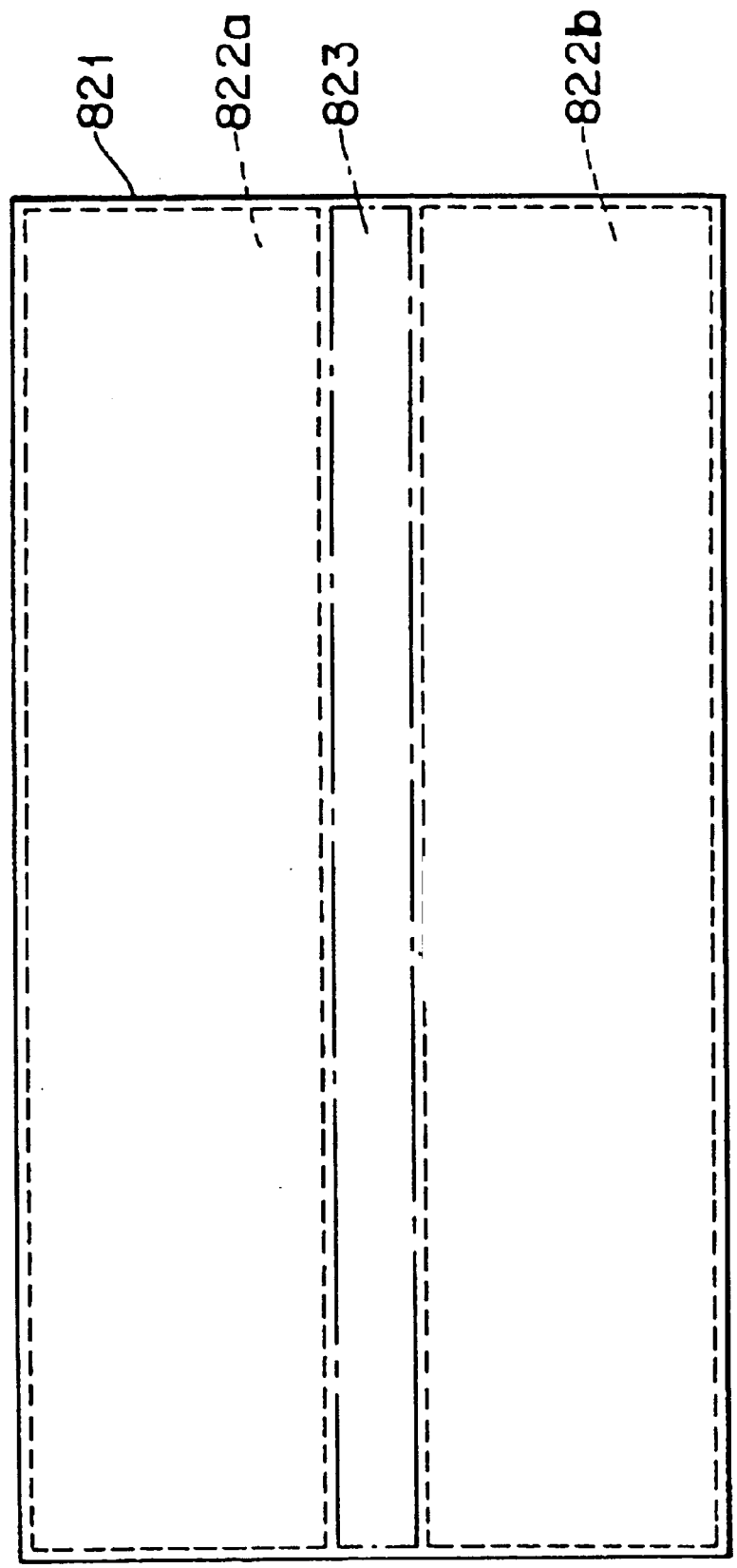
FIG. 8P is a top plan layout showing a chip region of the aforementioned DRAM.

FIG. 8P is a layout showing a circuit on the aforementioned DRAM chip. In the same Figure: reference numeral 821 designates a chip region; numerals 822a and 822b designate a memory array or memory cell mat portion; and numeral 823 designates a peripheral circuit portion (containing the bonding pads).

Figure 8Q:
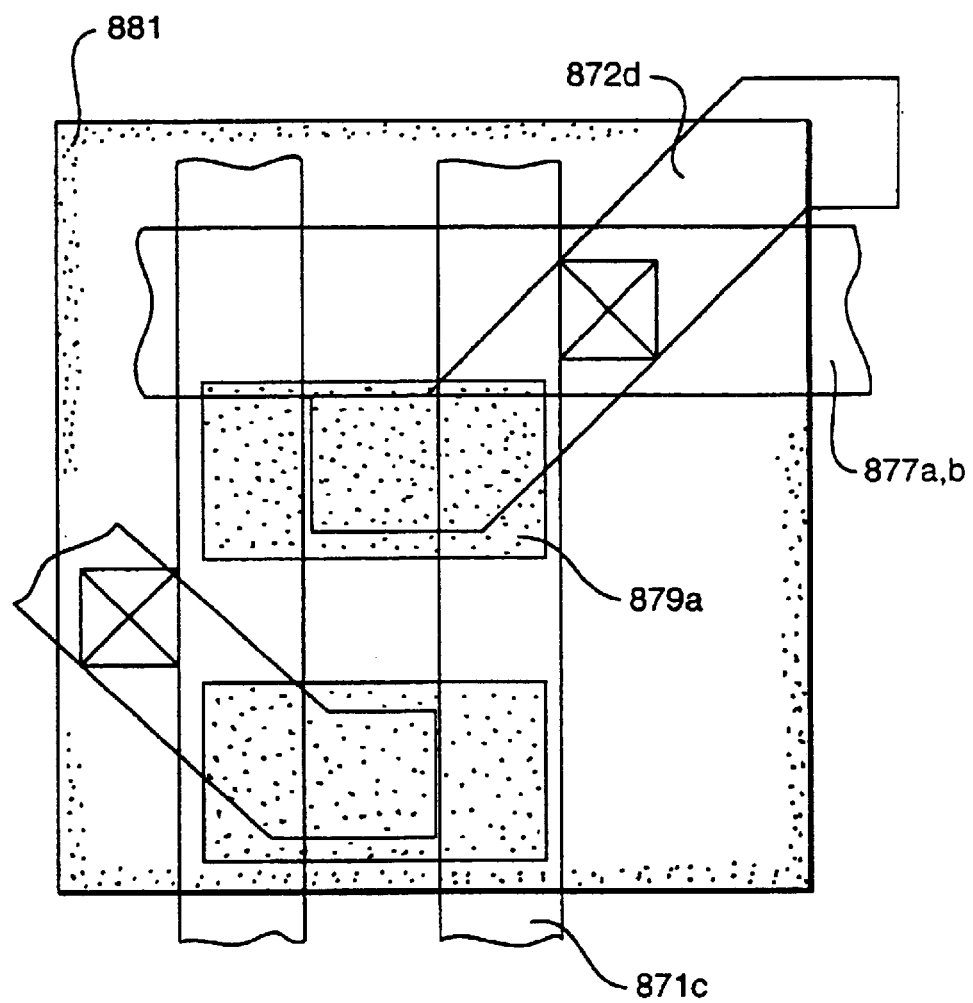
FIG. 8Q is a top plan layout showing a unit rotation period of the memory cell region of the aforementioned DRAM.

FIG. 8Q is a top plan view showing the cell top plan structure of the memory array of the aforementioned DRAM for substantially one period of its rotational symmetry. For brevity, however, the upper wiring line structure is omitted. In the same Figure: reference numeral 871c designates a word line; numeral 872d designates the n-type source or drain region; numerals 877a and 877b designate bit lines; numeral 879a designates a storage node (or capacitor); and numeral 881 designates a plate.

Next, the process flow of the pretreatment process (or wafer process) of the aforementioned DRAM will be described in the following with reference to the foregoing Drawings.

A p-type Si single crystal wafer having a thickness of about 0.7 mm to 1.0 mm, as has been described, is prepared, and is formed all over its (100) plane with a thin buffering thermally oxidized film. Over this film, there is deposited by the CVD the $Si_3N_4$ film which has a thickness sufficient for the oxygen resisting mask. After this, this mask is rotationally applied to the whole surface of the aforementioned principal plane of the wafer. Then, the aforementioned resist is patterned whereas the lower $Si_3N_4$ is etched by the exposure process (i.e., Exposure Process 1) of the present invention. Next, as shown in FIGS. 8A-1 and 8A-2, the portion to be formed into the n-well region is implanted with phosphor by using the resist film 862 or the like as the mask. Next, the resist film 862 is removed from the whole surface, and a thermally oxidized film is selectively formed over the n-well 863 by using the $Si_3N_4$ film 861 as the oxygen resisting mask. Next, the $Si_3N_4$ film 861 is removed from the whole surface, and the portion to be formed into the p-well is implanted with boron ($B^+$) by using the oxide film 865 over the n-well as the mask for the ion implantation. Next, the individual wells are subjected to an extension diffusion (or annealing with $N_2$) and an activation. After this, the oxide films 860 and 865 are removed from the whole surface, and the thin thermally oxidized films 869a and 869b and the $Si_3N_4$ film are formed all over the surface. Next, as shown in FIGS. 8C-1 and 8C-2, the patterning is so accomplished by the exposure process (i.e., Exposure Process 2) of the present invention as to leave the aforementioned $Si_3N_4$ film only in the active region to form the oxygen resisting masks 867a to 867c. After this, the resist is removed. Moreover, the resist film is applied to the whole surface, and an exposure (i.e., Exposure Process 3) is accomplished by any method of the present invention to cover the whole surface of the n-well with the resist 868. In this state, the regions 866a to 866d to be formed into the channel stoppers are implanted with boron ($B^+$) ions. Next, the field oxide films 870a to 870e are selectively formed by the thermal oxidations, as shown in FIGS. 8D-1 and 8D-2, by using the $Si_3N_4$ films 867a to 867c as the mask. Next, these $Si_3N_4$ films 867a to 867c are removed from the whole surface, and the thin oxide films 869a and 869b are also removed from the active regions. Then, the new gate oxide films 869a' and 869b' are formed again by the thermal oxidations (as shown in FIGS. 8D-1 and 8D-2).

Moreover, the whole surface is formed with the phosphor added poly-Si film by the vacuum CVD and is coated with the applied resist. After this, this resist film is patterned (i.e., Exposure Process 4) by any of the methods of the present invention and is used as the mask to pattern the gate electrodes 871a to 871d (as shown in FIGS. 8E-1 and 8E-2). Next, the n-well is coated (i.e., Exposure Process 5) with the resist film 873, and the regions 872a to 872e to be formed into the source/drain of the n-channel FET are doped with phosphor (P) ions in self-alignment with the aforementioned individual gate electrodes by the ion implantation. After this, the resist 871b is removed. Likewise, the p-well region is coated (i.e., Exposure Process 6) thereover with the resist film, and the regions 872x and 872y to be formed into the source/drain of the p-channel FET are doped like before with boron (B) ions (as shown in FIGS. 8F-1 and 8F-2). Moreover, the side walls 875a to 875d are formed in self-alignment around the gates 871a to 871d by the well-known side wall process. As shown in FIGS. 8F-1 and 8F-2, moreover, the p-channel portion is coated (i.e., Exposure Process 7) with the resist 874, which is used as the mask to implant arsenic (As) ions to form the n-type highly doped region of the LDD (Lightly Doped Drain). After this, the resist 874 is removed.

As shown in FIGS. 8G-1 and 8G-2, moreover, the $SiO_2$ film 876 is deposited all over the surface by the vacuum CVD. Next, by the resist pattern having wide opening (i.e., Exposure Process 8), the contact holes for forming the bit lines of the memory cell and the contacts of the substrate are formed in partial self-alignment. Moreover, the poly-Si, $WSi_2$ and the vacuum CVD $SiO_2$ are sequentially deposited all over the surface and are coated (i.e., Exposure Process 9) with the photo resist to pattern the bit lines 877a and 877b. The bit lines are formed, and the resist is removed. After this, the $SiO_2$ is deposited all over the surface by the vacuum CVD, and the bit lines have their sides coated with the insulating film 878 (as shown in FIGS. 8H-1 and 8H-2). Next, the storage node electrodes of the memory and the contact holes of the substrate are coated (i.e., Exposure Process 10) with the photo resist, and the $SiO_2$ film 878 and the lower oxide film are etched to form the openings. Next, the poly-Si film to be formed into the storage node electrodes is deposited all over the surface by the vacuum CVD. Moreover, the poly-Si film of the whole surface is implanted with phosphor P) ions and is subjected to an activating annealing (with $N_2$). This annealed film is coated (i.e., Exposure Process 11) with the photo resist to pattern the storage nodes 879a and 879b, as shown in FIGS. 8H-1 and 8H-2. After this, the resist is removed.

As shown in FIGS. 8I-1 and 8I-2, moreover, the $Si_3N_4$ film to be formed into the capacitor insulating film is deposited by the vacuum CVD. Next, the $Si_3N_4$ film is oxidized to a partial depth. Moreover, the phosphor added poly-Si film to be formed into the capacitor plate is deposited over the $Si_3N_4$ film. Next, the resist film is applied to those films, and the unnecessary poly-Si and $Si_3N_4$ films are removed by their patterning (i.e., Exposure Process 12) mask to form the capacitor insulating film 880 and the plate 881. After this, the resist is removed.

As shown in FIGS. 8J-1 and 8J-2, moreover, the n-channel portion is coated (i.e., Exposure Process 13) with the resist film, and the p-channel portion has its SiO$_2$ film 878 removed. Next, the previous resist is removed, and the n-channel portion is then coated (i.e., Exposure Process 14) with the resist films 882a and 882b, which are used as the mask to implant the regions to be formed into the highly doped source/drain regions of the LDD structure of the p-channel FET with boron (B$^+$) ions. After this, the resist film is removed from the whole surface, and an annealing with N$_2$ is accomplished for activations.

As shown in FIGS. 8K-1 and 8K-2, moreover, the SiO$_2$ film and the BPSG film are deposited all over the surface and are flattened by the re-flow. Next, the flattened films are coated with the photo resist and patterned (i.e., Exposure Process 15) to form the contact holes 884a to 884e. Next, the upper surface of the p-channel portion is coated (i.e., Exposure Process 16) with the photo resist, and the n$^+$-type n$^+$-contact regions are formed by implanting the lower portions of the contacts of the n-type source/drain with (P) ions. The aforementioned resist is removed, and the n-channel portion is coated (i.e., Exposure Process 17) with the photo resist to form the p$^+$-type p$^+$-contact regions by implanting the lower portions of the contacts of the p-type source/drain with (B) ions. The aforementioned resist film is removed to accomplish the N$_2$ annealing for the activation of the ion-doped layer and for the re-flow of the BPSG films 883a to 883f.

As shown in FIGS. 8L-1 and 8L-2, moreover, the whole surface is coated by the CVD with the surfacing TiN buffer layer and the wiring layer WSi$_2$ (tungsten silicide). The photo resist film is applied to those layers and patterned (i.e., Exposure Process 18) to a desired shape, which is used as the mask to form the silicide wiring lines 885a to 885c by the dry etching. After this, the unnecessary resist film is removed and is followed by the N$_2$ annealing.

As shown in FIGS. 8M-1 and 8M-2, moreover, the inter-layer PSG film having the PSG/SOG/PSG structure is deposited, and the portion other than the portions to be formed into the through holes is coated with the resist by the positive type resist process (i.e., Exposure process 19). The dry etching is accomplished in this state to form the through holes. After this, the resist film is removed.

As shown in FIGS. 8N-1 and 8N-2, moreover, the surfacing TiN film to be formed into the Al-I and the Al wiring layer (containing 99 wt. % of Al and 1 wt. % of Si) are deposited, and the resist is left only over the portion to be formed into the Al wiring line by the negative process (i.e., Exposure Process 20) to form the Al-I wiring lines 887a to 887d by the dry etching. After this, the resist film is removed.

As shown in FIGS. 8O-1 and 8O-2, moreover, the inter-layer insulating film 888 formed of the three layers, i.e., the plasma SiO$_2$/the SOG (Spin-On-Glass)/the plasma SiO$_2$ is deposited, and the through holes are formed by the dry etching such that the portion other than the portions to be formed into the through holes is coated with the resist by the positive process (i.e., Exposure Process 21). After this, the resist is removed. Next, the whole surface is coated with the Al wiring layer (containing 99% of Al and 1% of Si) to be formed into the Al-II, and only the overlying portion to be formed into the wiring lines is coated with the resist film by the negative process (i.e., Exposure Process 22). As a result, the Al-II wiring lines 889a and 889b are formed by the dry etching using that resist film as the mask.

Moreover, the atmospheric PSG film (or final passivation) is deposited, and the overlying portion other than the portions to be formed into the bonding pads is coated with the resist film by the positive process (i.e., Exposure Process 23). This resist film is used as the mask to form the openings for the bonding pads by the chemical etching.

Of the individual exposure processes thus far described, the Exposure Processes 2, 4, 9 to 11, 15, and 18 to 22 can effectively adopt the phase shifting methods of the individual embodiments of the present invention. Of these, the multi-image plane projection exposure method, as exemplified in the individual embodiments of the present invention, is effectively exploited in case there is a large step between the planes, to which the memory array portions 822a and 822b and the peripheral circuit 823 belong, as shown in FIG. 8P. For the steps including the periodic wiring lines as in the Exposure Processes 9, 18, 20 and 22, on the other hand, there are effective the phase shifting method (or phase inverted shifting method) which uses the mask of the mutual type opening (as shown in FIG. 6H of Embodiment 6 and FIGS. 15A to 15F of Embodiment 15).

(9) Embodiment 9

The concept for preparing the mask layout of the present invention and the theoretical background will be described in the following.

Figure 9A:
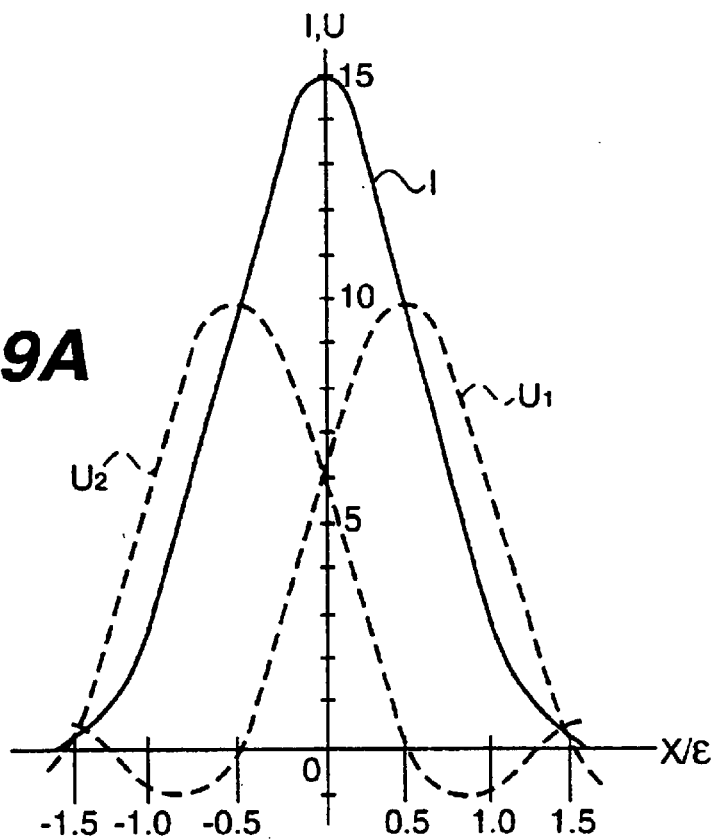
FIG. 9A is a graph for explaining the distributions of the amplitude intensity and the energy intensity of the line in case the adjacent patterns are in phase.
Figure 9B:
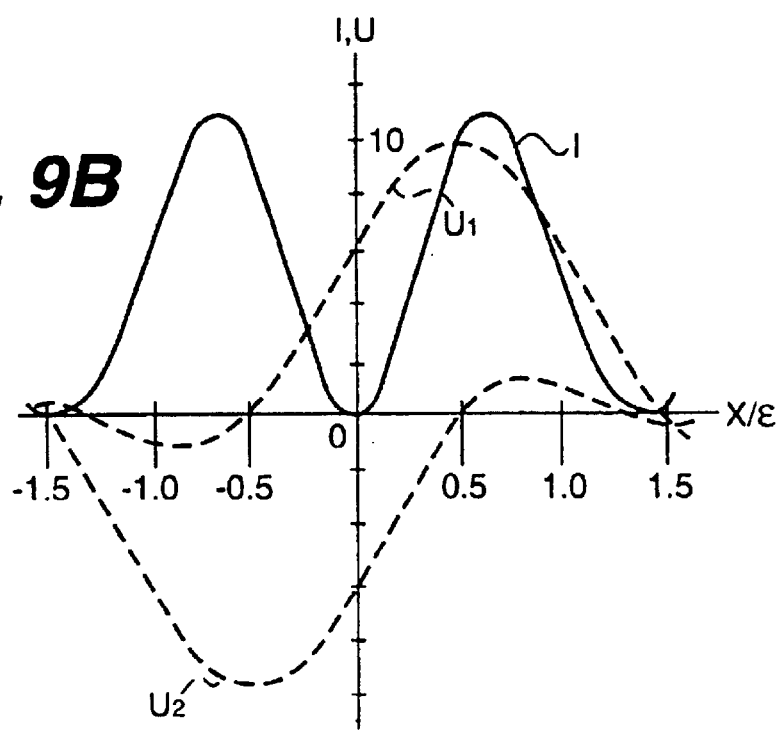
FIG. 9B is a graph showing the same distribution in case the phase is shifted (relatively) by 180 degrees from FIG. 9A.

FIG. 9A plots (in calculated numeral values), against a coordinate X along the principal plane on the wafer, an amplitude intensity u (by broken lines) and an energy intensity I (by solid line) in case of lights coming from those two openings on a mask having no ordinary phase shift, which are spaced by ϵ (i.e., converted distance on the wafer). Thus, at the time of 5:1 size-reducing projection, for example, a constructive interference is caused to give the solid curve I so that the peaks u$_1$ and u$_2$ are not resolved, if the phase difference $\phi_2 - \phi_1 = \Delta\phi$ is 0 or equal to 0.

This problem of resolution of a minute close object by the projection system is given by Rayleigh in the following formula, if the distance (converted on the wafer) between two close points is δ:

$$\delta = 0.61 \times \lambda / NA_1 \qquad (9.1),$$

wherein: λ: wavelength of exposing light; and $NA_1$:NA (i.e., numerical aperture) of the projection system at the image side.

If the case of i-line is taken into consideration, for example, λ=0.365 μm or NA=0.4, and the resolution limit δ=about 0.56 μm. As a result, if a pattern having a size equal (e.g., 200 to 50% of λ) to that of the wavelength is to be projected, as shown in FIG. 9A, there arises a problem that two lines merge into each other so that they cannot be separated.

If, on the other hand, the luminous fluxes between the two close openings, as shown in FIG. 9D, are given a phase difference π (or equal to it) (according to the phase inverted shifting method), a sharp drop of the energy intensity I appears in the vicinity of the origin so that the peak is resolved into two.

Figure 9C:
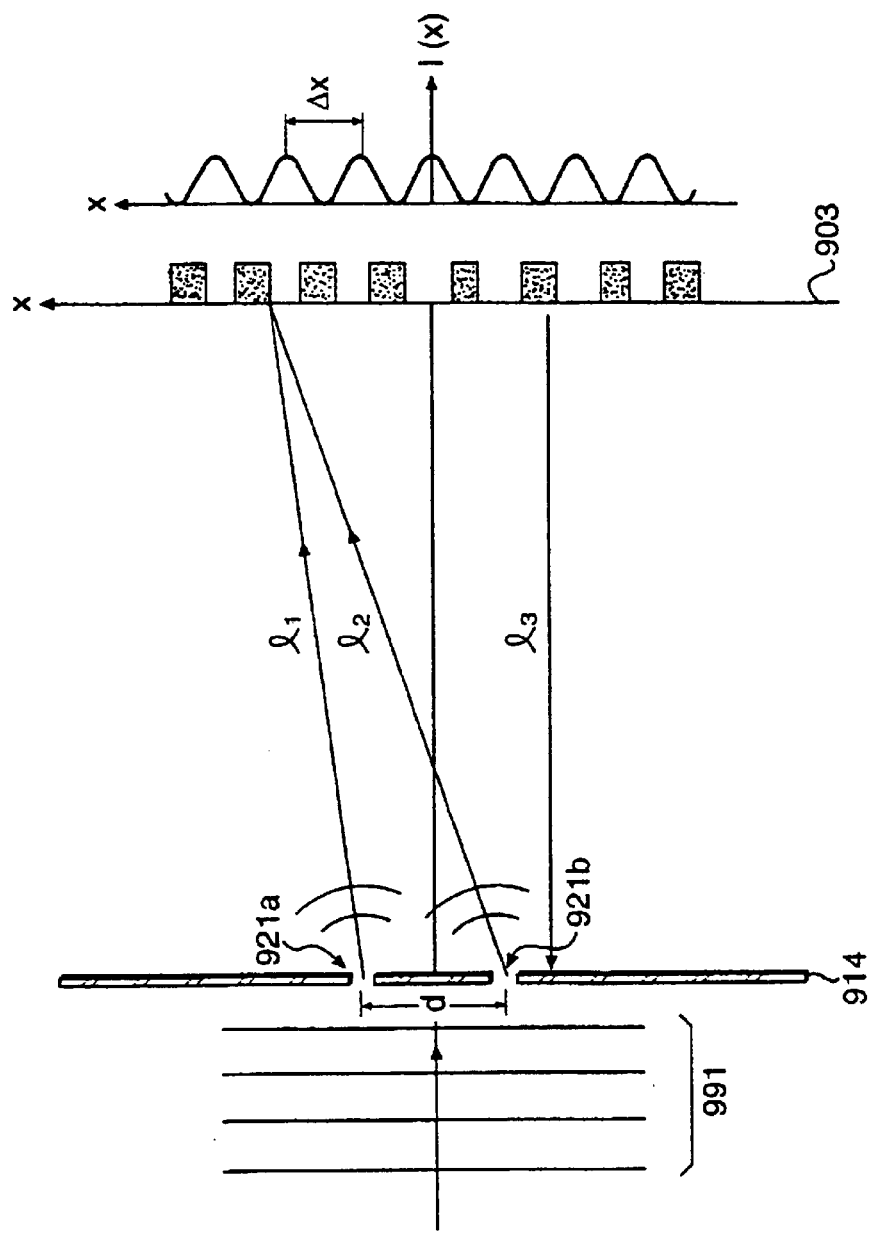
FIG. 9C is a schematic section showing an optical system for explaining the principle of a size-reducing projection of the present invention.

FIG. 9C is a schematic diagram for explaining the principle of the multi-image plane phase shifting method, in which the phase difference Δφ between the main opening and the auxiliary opening is set to other than π or an equivalent value, as in Embodiment 3. This simplifies the optical action of the size-reducing projection system drastically. In the same Figure: reference numeral 991 designates an exposing luminous flux (having the wavelength π; numeral 914 designates a mask; numeral 921a designates a main opening (e.g., B$_A$ of FIG. 3C-1); numeral 921b designates an auxiliary opening (e.g., B$_B$ of FIG. 3C-2); letter d designates the distance (converted on the wafer) between those openings; letter 1 designates the distance between the mask and the image plane; and letters l$_1$ and l$_2$ designate the optical paths from the individual openings to the screen 903 (or the image plane or wafer). The optical intensity I(x) on the screen is determined in the following manner.

The resolution intensities $u_1$ and $u_2$ by the individual openings are expressed by the following formulas, if the wave number is designated at k and if the phases are $\phi_1$ and $\phi_2$:

$$u_1 = A \exp[-i(kl_1 - \phi_1)] \quad (9.2); \text{ and}$$

$$u_2 = B \exp[-i(kl_2 - \phi_2)] \quad (9.3).$$

For the composed light, the following formula holds:

$$I(x) = |u_1 + u_2|^2 \quad (9.4)$$

$$= A^2 + B^2 + 2AB\cos[kxd/1 + \phi_2 - \phi_1],$$

wherein $l_1 - l_2 = xd/l$.
Hence, if the change of l is $\Delta l$ and if $\Delta\phi = \phi_2 - \phi_1$, the following formula holds:

$$\Delta l = 2\lambda d/\lambda \cdot \Delta\phi \quad (9.5).$$

It is understood that the image plane is changed for the change of $\Delta\phi$. However, the present model is rough one and has to be corrected and confirmed by numerical calculations and experiments.

(10) Embodiment 10

In the present embodiment, the projection exposing ultraviolet light source to be applied to each of the exposure processes of the present invention will be described in the following together with its periphery.

FIG. 10 is a diagram enumerating the several characteristics of the exposure illuminating system to be used. In the same Figure, the partial coherence is generally designated at Greek letter "σ" and defined by:

$$\sigma = NA_c/NA_o.$$

Here, letters $NA_c$ designate the numerical number of the illuminating condenser lens at the mask side, and letters $NA_o$ designate the numerical number of the exposure projection lens system at the mask side and are set at $NA_o = 0.4$. Other ultraviolet light sources to be used for the exposure of the present invention are exemplified by: the deep UV spectrum (in the ultraviolet range) of 0.2 to 0.3 μm of a Xe—Hg light source; an excimer laser of around 0.2 μm; and an Hg arc emission other than the enumerated in the same Figure.

Incidentally, the illuminations to be used in the present invention have the so-called "Kohler" structure but can be practiced by other structure.

A specific example of the exposure illuminations will be described with reference to FIG. 19.

(11) Embodiment 11

Here will be described a modification (corresponding to Embodiment 5) of the 5:1 size-reducing projection exposure system to be used for the exposure of the present invention. In the illumination system and exposure projection system, according to the present embodiment, the lens actions for controlling the two split luminous fluxes are individually accomplished by identical lens systems only. This raises an advantage that it is unnecessary to consider the aberration difference in the lens system, which would otherwise become troublesome in case the paired lens systems are individually used for the righthand and lefthand luminous fluxes. The present exposure system is a two-side telecentric system, in which the mask (or object) side and the wafer (or image) side are telecentrically constructed.

Figure 11:
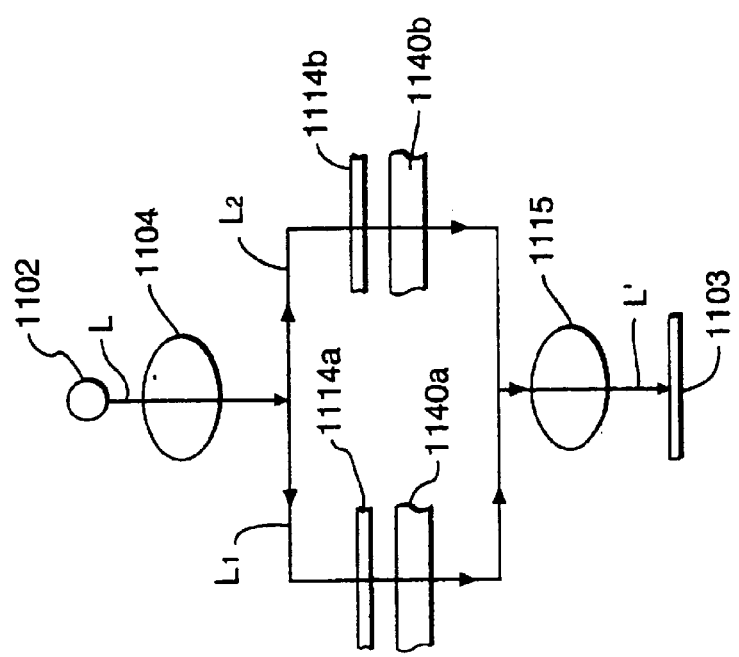
FIG. 11 is a simplified front section showing the 5:1 size-reducing exposure system of Embodiment 11 of the present invention, in which all the projection lens systems are shared by making use of a telecentric structure at an objective side.

FIG. 11 is a simplified schematic section showing the illumination system and exposure projection system of the stepper embodiment. In the same Figure: reference numeral 1102 designates a light source for emitting the i-line of mercury; letter L designates an initial luminous flux; numeral 1104 designates an illuminating optical lens system such as a condenser lens constituting the kohler illumination; letters $L_1$ and $L_2$ designate main and auxiliary luminous fluxes which are separated to have an identical uniform intensity by the half mirror; numeral 1114a designates a main mask; numeral 1114b designates an auxiliary mask; numeral 1140a designates an optical path control chamber (for the main luminous flux); numeral 1140b designates an optical path control chamber for the auxiliary luminous flux; letter L' designates a composed luminous flux; numeral 1115 designates a projection lens system; and numeral 1103 designates an exposed wafer.

Since the lens system liable to establish differences in the various aberrations is commonly shared between the two luminous fluxes $L_1$ and $L_2$ in the present method, it is possible to enlarge the areas to be simultaneously exposed. Moreover, the phase shaft can be adjusted to a desired value all over the field that can be exposed at one time, so that a high resolution can be achieved.

Incidentally, the present embodiment should not be limited to the structure of FIG. 11 but can use two independent light source systems, for example. Since, in this case, the major lens system 1115 is also shared between the main and auxiliary luminous fluxes in the lower half (i.e., downstream of the mask) of the optical system, it is possible to minimize the bad influences based upon the difference in the aberrations of the two optical systems for the transfer characteristics of the patterns on the paired masks.

Moreover, the present system can be applied to all the exposure methods for transferring the patterns on the two masks simultaneously onto one wafer. Moreover, the simplified optical structure in FIG. 11 is substantially identical for FIG. 5A and FIG. 5B. What is different resides in that the present embodiment is equipped with not the pre-lens groups 562a and 562b but the two-side telecentric projection lens system 1115 which is disposed at the position 515 of FIG. 5A.

(12) Embodiment 12

Here will be described a mask defect inspection system for inspecting the mask of the present invention.

Figure 12:
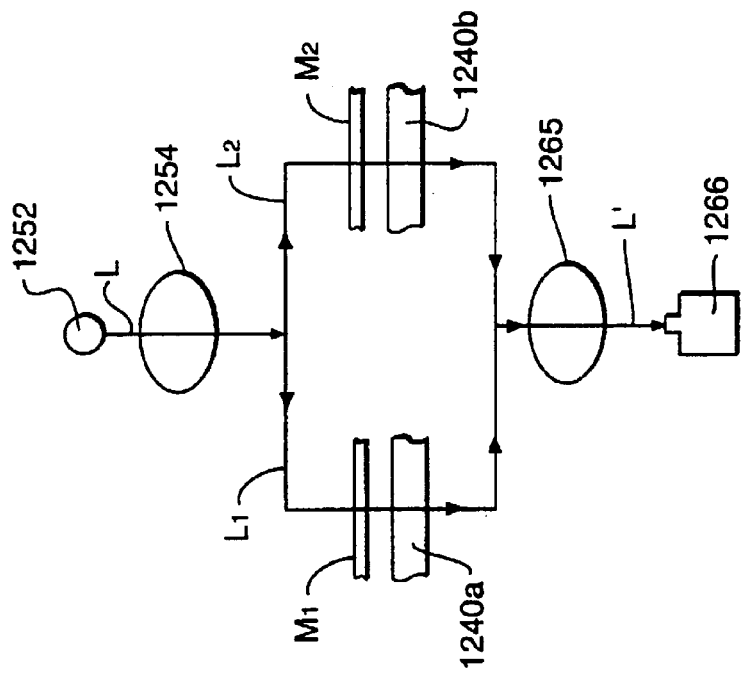
FIG. 12 is a simplified front section showing a mask inspecting system according to Embodiment 12 of the present invention.

FIG. 12 is a simplified schematic section of the mask inspection system. In the same Figure: reference numeral 1252 designates a monochromatic light source of e-line (having a wavelength of 546 nm); letter L designates an initial inspection luminous flux; letters $L_1$ and $L_2$ designate the main and auxiliary luminous fluxes of the divided inspection luminous fluxes which are evenly divided to have an unequal intensity like the foregoing exposure system; letters $M_1$ and $M_2$ designate masks to be inspected; numerals 1240a and 1240b designate optical path control chambers; numerals 1265 designates a 1:1 projection lens system; letter L' designates a composed inspecting luminous flux; and numeral 1266 designates an optical detector.

Incidentally, the projection lens 1265 may have a magnification larger than 1, if necessary, or may have a size-reducing power. In this size reduction case, however, the projection lens system under consideration has to be able to resolve the accompanying pattern.

Next, the operations of the present system will be described in the following. The first operation to be described will be directed to the case, in which the mask $M_1$ to be inspected is an on-mask phase inverted shifting mask whereas the reference mask M$_2$ has an equal opening pattern but has its shifter pattern (including a accompanying pattern and complementary pattern) portion subjected to no phase shifting and having no phase shifting film. If, in this case, the optical path control means 1240a and 1240b are adjusted to equalize the optical paths L$_1$ and L$_2$ (which may have a phase difference of 2nπ), the composed image can visualize no shifter pattern in a normal case. In case, on the other hand, the phase shift film has an abnormal thickness, the abnormal portion is detected as a bright portion by the detector 1266. Since, in this case, the corresponding main pattern is focused as the bright spot, the relations between the defective portion and the main pattern can be clearly caught.

The second operation to be described will be directed to the case, in which the masks M$_1$ and M$_2$ to be inspected are the main mask and the auxiliary mask, respectively, in the mask inspections for multi-mask phase inverted shifts. If, in this case, the optical path control means 1240a and 1240b are adjusted to set the phase difference to 0 or equal to 0 between the two optical paths L$_1$ and L$_2$, there is focused on the image plane the composed pattern of the main pattern and the auxiliary (or accompanying) pattern. As a result, the defect can be totally decided by comparing the composed pattern and the designed pattern data of the mask electrically.

The third operation to be described will be directed to the case, in which both the masks M$_1$ and M$_2$ to be inspected are those having such an accompanying pattern as cannot be resolved in the exposure projection system, in the mask inspections (including those having the phase differences other than π) for the multi-mask phase inverted shift. If, in this case, the optical path adjusting means 1240a and 1240b are adjusted to set the phase difference to π or an equal value, the composed image of the normal accompanying pattern will either disappear or become weaker than that of the existing one. On the other hand, an abnormal pattern, if any, will provide a clear bright portion.

(13) Embodiment 13

The present embodiment relates to a technology which is effective if applied to the size-reducing projection exposure of a wafer having a chip region having a step on the surface, as in the memory IC such as a DRAM.

FIG. 13A is a simplified sectional front elevation (of the optical system) showing the step-and-repeat type 5:1 size-reducing projection exposure system of the same embodiment. In the same Figure: reference numerals 1302a and 1302b designate monochromatic light sources (of i-line) independent of each other and having an equal wavelength; letters L$_1$ and L$_2$ designate main and auxiliary luminous fluxes, respectively; numerals 1304a and 1304b designates main and auxiliary exposure illumination lens systems (or Kohler illumination); numeral 1314a designates a main mask for exposing the basin (e.g., the peripheral circuit in case of the memory IC); numeral 1314b designates an auxiliary mask for exposing the plateau (e.g., the memory cell or memory mat in case of the memory); numerals 1334i and 1334j designate shielding portions corresponding to the plateau on the chip; numeral 1334k designates a main pattern corresponding to the peripheral circuit pattern on the chip; numeral 1344k designates a shielding portion corresponding to the basin on the chip; numerals 1344i and 1344j designate auxiliary pattern portions corresponding to the memory mat on the chip; letter L' designates a composed luminous flux by the half mirror; numeral 1315 designates a size-reducing projection lens system having its object and image sides constructed in the telecentric manner; numeral 1303 designates an exposed wafer; numerals 1313i and 1313j designate plateaus (or the memory mat portions); and numeral 1313k or 1324 designates a basin (or the peripheral circuit portion).

FIG. 13B is a top plan view showing the arrangement of the regions on the wafer, which correspond to the unit steps of exposure. In the same Figure: the region 1313, as enclosed by broken lines, is a total area to be exposed at the unit step, namely, a unit exposure region; numerals 1321 and 1322 designate first and second chip regions, respectively; numerals 1323 and 1324 designate peripheral circuit portions of the individual chip regions; numeral 1313k designates a main exposure portion (i.e., an elongated rectangle defined by broken lines) corresponding to the basin or valley; and numerals 1313i and 1313j designate auxiliary exposure portions corresponding to the higher land or plateau (at the two sides defined by broken lines).

Next, the operations of the size-reducing projection exposure system of the present invention will be described in the following. In the present system, the exposure region 1313 is shared between the two masks 1314a and 1314b, which correspond to the memory mat regions 1313i and 1313j and the peripheral circuit portion 1313k. These regions are usually followed by steps, as shown (in FIG. 13A). In this case, those masks are separately moved on the Z-axis (i.e., the optical axis) so that the images of the individual regions may be simultaneously exposed to be focused on the corresponding lanes of the resist film on the wafer.

In this case, the light source is exemplified by a plurality of light source lamps having an identical wavelength, the chromatic aberration of the projection lens system 1315 is influenced if the two lamps have a difference in wavelength. In order to avoid the influences, the luminous flux from a single light source may be divided, as in Embodiment 12.

Incidentally, the present stepper has its projection lens system 1315 shared between the luminous fluxes L$_1$ and L$_2$ and has its two sides (i.e., object side and image side) formed to have the telecentric structure. Thus, the focal position can be changed without any change in the magnification by moving the individual masks finely in the Z-axis direction.

(14) Embodiment 14

In the present embodiment, the phase shifting exposure method (which will be called the "on-mask phase shifting method" herein) for forming a predetermined portion on the common mask with a transparent film for inverting the phase is applied to the present invention.

Figure 14B:
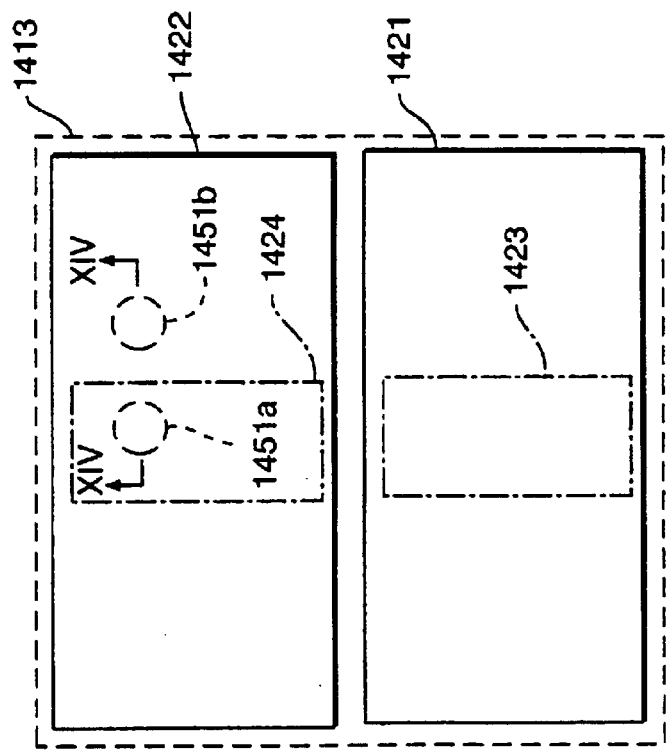
FIG. 14B is a top plan layout showing a unit exposure region (such as the mask or wafer) in the aforementioned method of FIG. 14A.
Figure 14A:
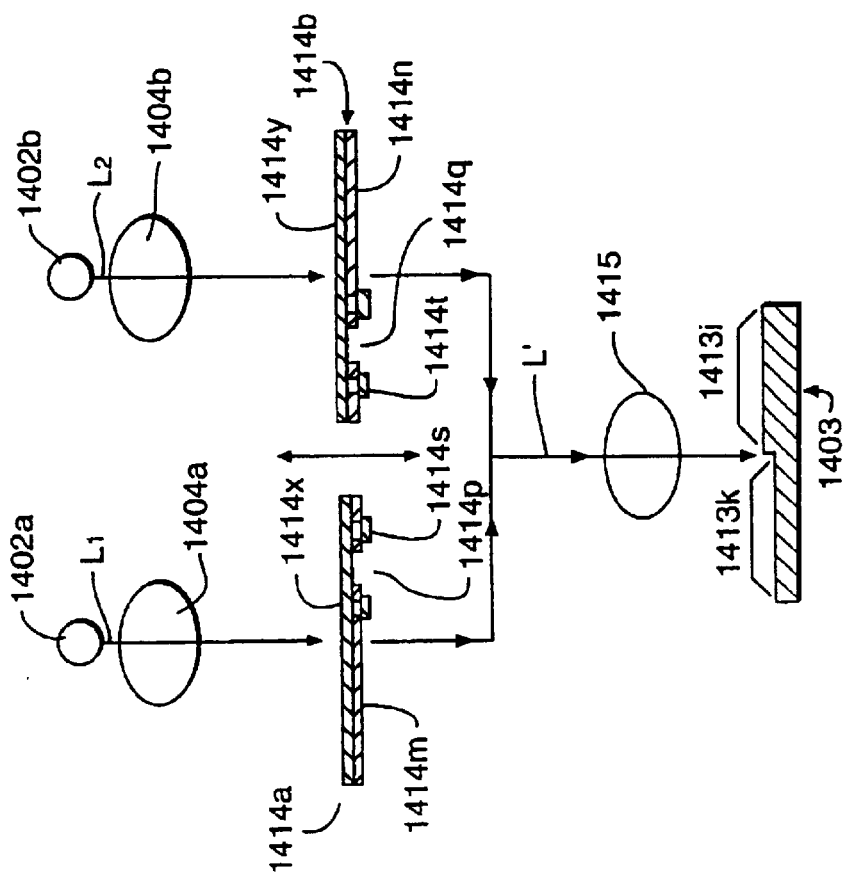
FIG. 14A is a simplified front section showing a step-and-repeat type size-reducing exposure system (using light sources which are not coherent with each other) for explaining the exposing method of Embodiment 14 of the present invention.

FIG. 14A is a simplified sectional front elevation (of the optical system) showing the step-and-repeat type 5:1 size-reducing projection exposure system of the same embodiment. In the same Figure: reference numerals 1402a and 1402b designate monochromatic exposure light sources of i-line, which are independent of each other; letters L$_1$ and L$_2$ designate main and auxiliary luminous fluxes; numerals 1404a and 1404b designate illumination lens systems constituting the Kohler illumination; numerals 1414a and 1414b designate main masks for exposing a predetermined pattern in the lower portion (on the wafer); numeral 1414b designates an auxiliary mask for exposing a predetermined pattern of a higher portion on the wafer; numerals 1414x and 1414y designate synthetic quartz mask substrates; numerals 1414m and 1414n designate chromium screening portions; numerals 1414p and 1414q designate main openings corresponding to the pattern; numerals 1414s and 1414t designate phase inverting transparent films disposed over the openings in a manner to correspond to the phase shifter; letter L' designates a composed luminous flux by the half mirror; numeral 1415 designates the 5:1 size-reducing projection lens system which has its two object and image sides formed to have the telecentric structure; numeral 1413k designates a lower portion on the wafer (at 1403); and numeral 1413i designates a higher portion on the wafer.

FIG. 14B is a top plan view showing the unit exposure region on a wafer 1403 for explaining the exposure method of the present invention. In the same Figure: reference numeral 1413 designates a unit exposure region; numerals 1421 and 1422 designate chip regions corresponding to the chips of the memory; numerals 1423 and 1424 designate peripheral circuit portions corresponding to the lower portions on the individual chips; numeral 1451a designates a portion formed with the opening 1414p, as shown in FIG. 14A; and numeral 1451b designates a portion formed likewise with an opening 1414q.

Figure 14C:
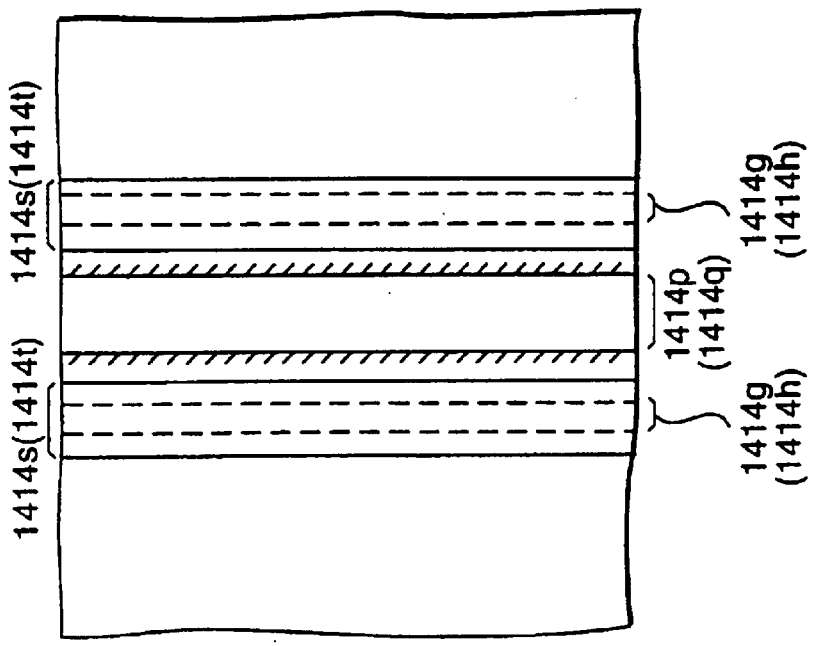
FIG. 14C is a top plan pattern view showing the mask to be used in the aforementioned method of FIG. 14A.

FIG. 14C is a mask top plan view showing a specific example of the mask in case predetermined pattern portions 1451a and 1451b at the aforementioned lower and higher portions having a slender pattern such as an isolated Al wiring line. The present mask corresponds to the negative type resist process. In the same Figure: reference numerals 1414p and 1414q designate opening patterns corresponding to the Al wiring lines, respectively; numerals 1414g and 1414h designate slit-shaped opening patterns corresponding to the shifters, respectively; and numerals 1414s and 1414t designate phase inverted films formed thereon.

The operations of the stepper of the present embodiment will be omitted because they are absolutely identical to those of Embodiment 13. Since, in the present embodiment, the two regions having a step can be simultaneously exposed by the on-mask phase shifting method, the present embodiment can be effectively applied to the exposure step, at which the DRAM having a large step, as in the preceding Embodiment 8, cannot resolve the fine size with the ordinary process. The present method is effective for all types of on-mask phase shifting methods.

(15) Embodiment 15

The present embodiment relates to the method of forming a periodic or generally periodic Al wiring pattern by making use of the multi-mask phase shifting method or the on-mask phase shifting method of the present invention.

Figure 15A:
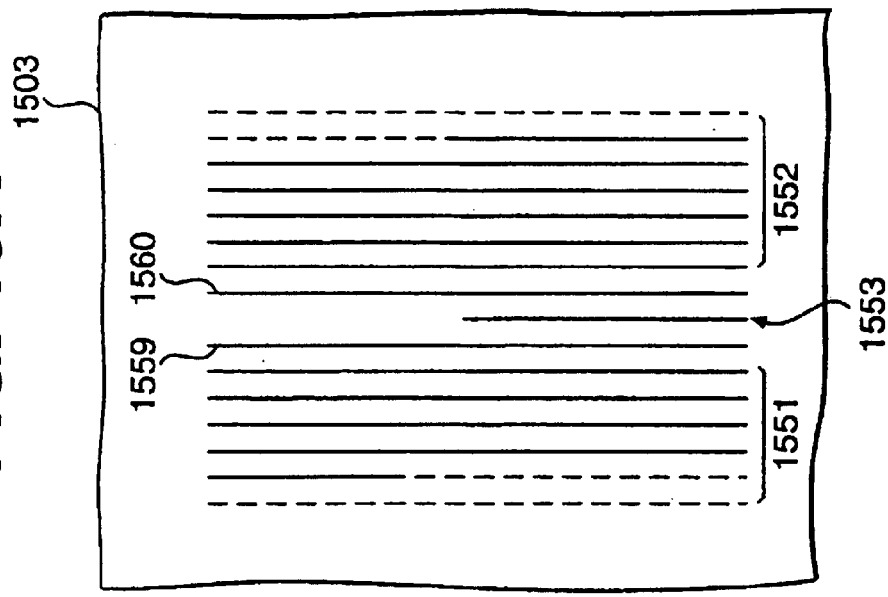
FIG. 15A is a top plan view showing a pattern on a wafer, which corresponds to a pseudo-periodic pattern of Embodiment 15 of the present invention.
Figure 15B:
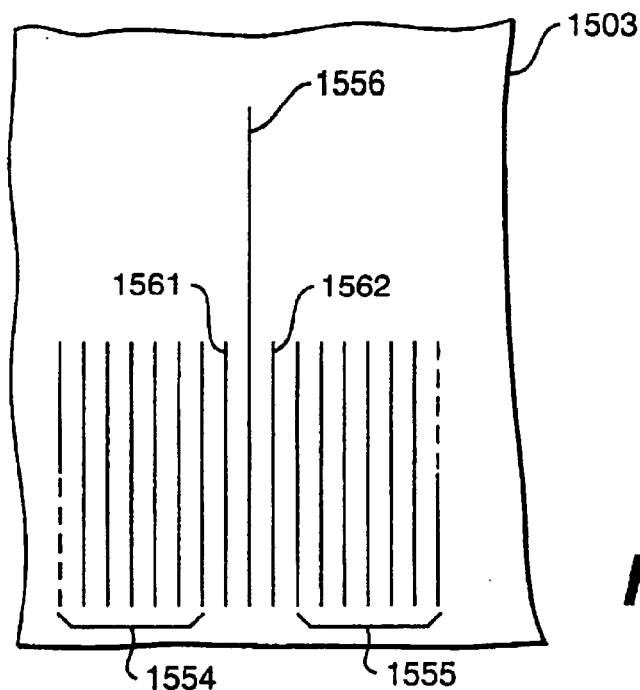
FIG. 15B is a top plan view showing a pattern on a wafer, which corresponds to another pseudo-periodic pattern of the aforementioned embodiment.
Figure 15C:
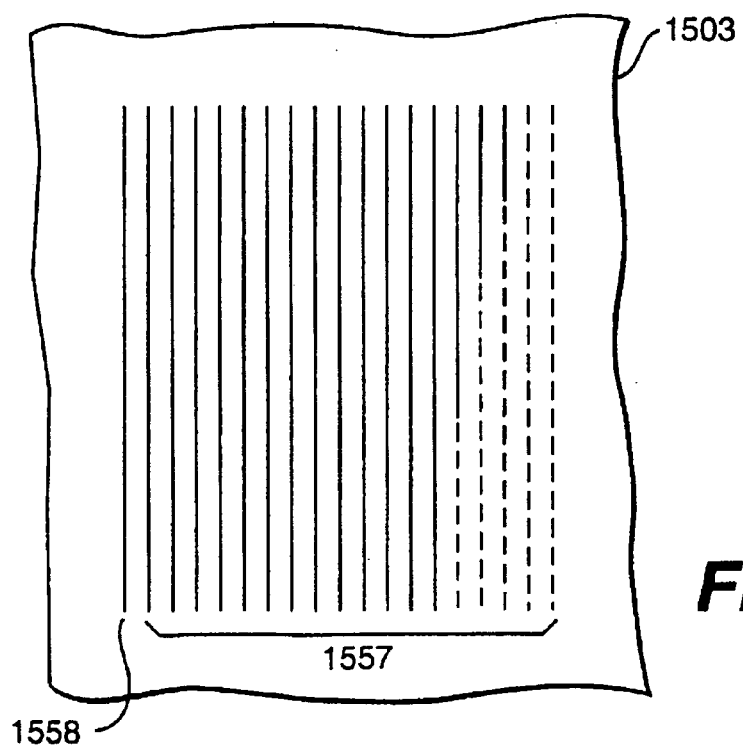
FIG. 15C is a top plan view showing a pattern on a wafer, which corresponds to still another pseudo-periodic pattern of the aforementioned embodiment.

FIGS. 15A to 15C are wafer top plan views schematically showing the Al periodic pattern (on the wafer) according to the present embodiments 15A to 15C. In FIG. 15A: reference numeral 1503 designates a wafer top surface; numeral 1553 designates a unique pattern; numerals 1559 and 1560 designate adjacent patterns; and numerals 1551 and 1552 designate remaining periodic patterns. In FIG. 15B: reference numeral 1556 designates a unique pattern; numerals 1561 and 1562 designate adjacent patterns; numerals 1554 and 1555 designate remaining periodic patterns; and numeral 1503 designates a wafer top surface. In FIG. 15C: reference numeral 1558 designates a unique pattern corresponding to the end portion of the periodic Al wiring pattern; numeral 1557 designates a remaining periodic pattern; and numeral 1503 designates a wafer top surface.

Figure 15E:
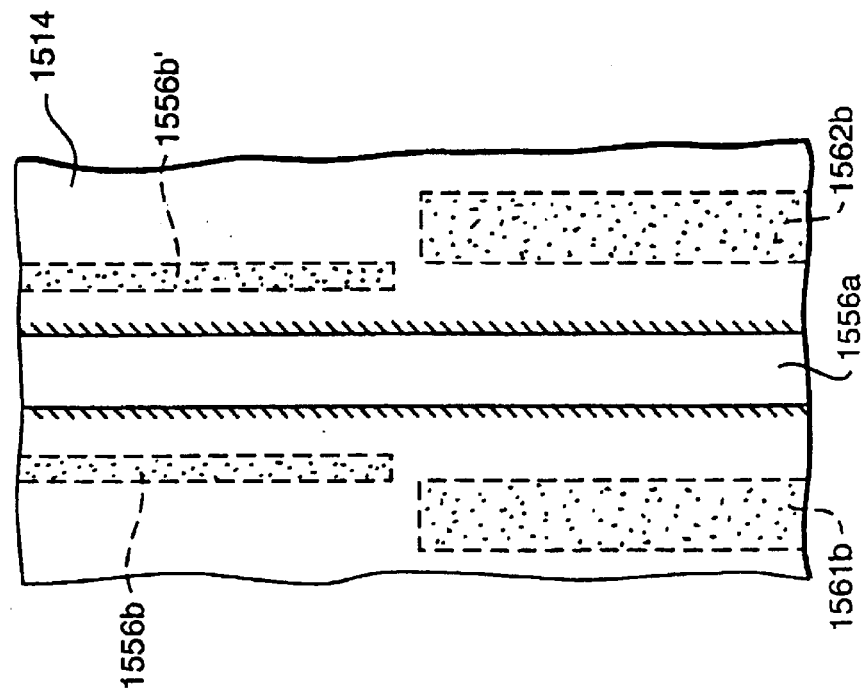
Figure 15D:
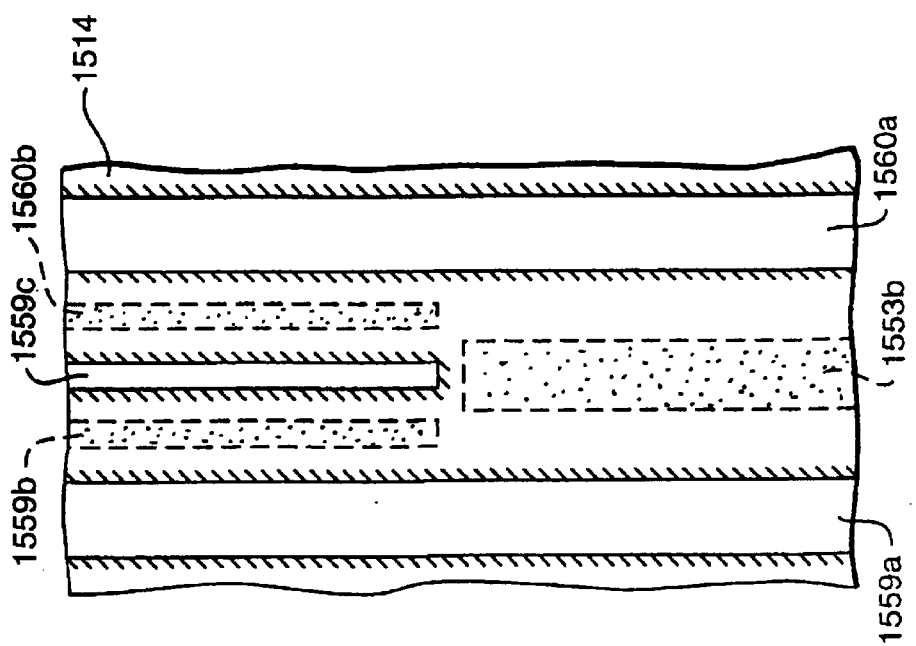
FIG. 15D is a top plan layout or a superposed top plan layout showing either an on-mask corresponding to a pattern on the wafer of FIG. 15A or a mask in a multi-mask phase shifting method.

FIG. 15D is a layout or a superposed layout showing the mask corresponding to the aforementioned FIG. 15A. In FIG. 15D, solid lines indicate the boundary between the opening patterns of the main mask, and broken lines indicate the boundary between the opening patterns of the auxiliary mask. In case of the on-mask phase shift mask, solid lines corresponds to the opening patterns of a phase shift "0", and broken lines correspond to the opening patterns of a phase shift "π". As to the sizes, as shown in FIGS. 15D to 15F, the Al wiring lines have a width of 0.3 to 0.4 $\mu$m, and the individual drawings are presented at a magnification of 1.

In FIG. 15D (as will be described mainly in case of the multi-mask phase inverted shifting method): reference numeral 1514 designates a quartz mask substrate; numeral 1559a designates a main opening pattern corresponding to the Al line 1559 on the main mask; numeral 1559b designates a shifter pattern on the accompanying auxiliary pattern; numeral 1553b designates a main opening pattern on the auxiliary mask, which corresponds to the Al line 1553; numeral 1560a designates a main opening pattern on the main mask, which corresponds to the Al line 1560; numeral 1560b designates a shifter pattern on the accompanying auxiliary mask; and numeral 1559c designates an auxiliary opening pattern for eliminating the ghost which might otherwise be established as a result that it is equidistantly spaced from the openings 1559a and 1560a corresponding to the Al at the two sides.

FIG. 15E is a mask layout corresponding to FIG. 15B like the preceding FIG. 15D. In the same Figure: reference numeral 1514 designates a mask substrate; numeral 1556a designates a main opening (on the main mask) corresponding to the Al line 1556 of FIG. 15B; numerals 1556b and 1556b' designate shifter patterns on the accompanying auxiliary mask; and numerals 1561b and 1562b designate opening patterns on the auxiliary mask, which correspond to the patterns 1561 and 1562.

FIG. 15F is a mask layout corresponding to FIG. 15C like the preceding FIGS. 15D and 15E. In the same Figure: reference numeral 1558a designates a main opening on the main mask, which corresponds to the end Al wiring line 1558 of FIG. 15C; numeral 1558b designates a shifter pattern on the corresponding auxiliary mask; numeral 1557b designates a main opening on the auxiliary mask corresponding to one of the inner Al lines 1557; and numeral 1514 designates a mask substrate.

The following description will be made at first with reference to FIGS. 15C and 15F. In this dense periodic pattern, there is used the mask layout of the type shown in FIG. 6H. At the end portions of the periodic pattern, there is provided an additional accompanying opening pattern (or shifter) 1558b.

Next, the case of FIGS. 15B and 15E will be described in the following. In this periodic pattern, there is alternately used a mask layout which has a phase shift of "π" or equal one, as shown in FIG. 6H. In case only one is projected, as shown in FIG. 15B, or in case every several (or other one) ones are projected, the shifter patterns 1556b are provided and 1556b' are provided.

Next, the case of FIGS. 15A and 15D will be described in the following. In this periodic pattern, too, there is alternately used a mask layout which has a phase shift of "π (or equal one), as shown in FIG. 6H. In case, however, only one is short (or every other or several ones are short), as shown in FIG. 15A, there are provided the accompanying shift patterns 1559b and 1560b and the auxiliary pattern 1559c (or the auxiliary accompanying pattern).

The technologies thus far described are effective especially if they are applied to the dense pattern portion in the following processes: Processes 7P2, 7P4, 7P7, 7P10 and 7P12; and Exposure Processes 2, 4, 9, 11, 18, 20 and 22 of Embodiment 8. Incidentally, the mask and exposure systems may be either the on-mask phase shift or multi-mask phase shift.

(16) Embodiment 16

The present embodiment explains the photo resist which is used for the exposure of the wafer of the present invention. The resist can be selected from FIG. 16 in dependence upon the wavelength of the monochromatic ultraviolet light source to be used for the exposure.

The resist is evenly applied to a thickness of 0.6 µm, for example, to the whole surface of the principal plane of the wafer by the spin coater.

(17) Embodiment 17

The present embodiment relates to an improvement of the mask to be used in the pair-mask or multi-mask phase shifting method.

Figure 17A:
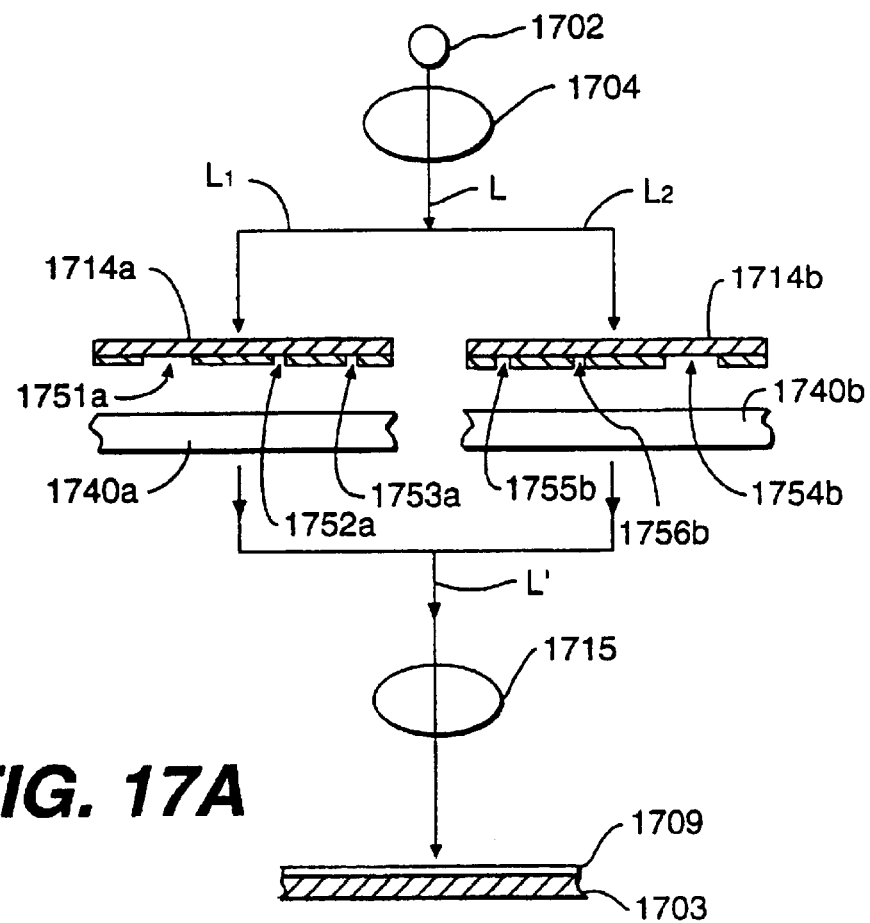
FIG. 17A is a simplified front section showing a step-and-repeat type 5:1 size-reducing projection exposure system for an exposure method in which an accompanying pattern according to Embodiment 17 of the present invention.

FIG. 17A is a schematic section showing an essential portion of the optical system of the step-and-repeat type 5:1 size-reducing projection exposure system according to the present method. In the same Figure: reference numeral 1702 designates an ultraviolet monochromatic light source of i-line or the like for a Hg lamp or the like; numeral 1704 designates an illuminating optical lens system for establishing the Kohler illumination; letter L designates an illumination light; letters $L_1$ and $L_2$ designates divided illumination lights; numerals 1714a and 1714b designate main and auxiliary masks corresponding to the main divided light and the auxiliary divided light; numeral 1751a designates a first main opening pattern corresponding to a first isolated pattern; numeral 1754b designates a second main opening pattern corresponding to a second isolated pattern; numerals 1752a and 1753a designate second auxiliary opening patterns (or shifters) accompanying the aforementioned second main opening pattern; numerals 1755b and 1756b designate first auxiliary opening patterns accompanying the aforementioned first main opening pattern; numerals 1740a and 1740b designate optical path adjusting means or adjusting chambers, as shown in FIG. 5C; letter L' designates a composed light; numeral 1715 designates a 5:1 size reducing projection lens system; numeral 1703 designates an exposed wafer; and numeral 1709 designates a photo resist film applied evenly to the aforementioned wafer 1703.

Figure 17B:
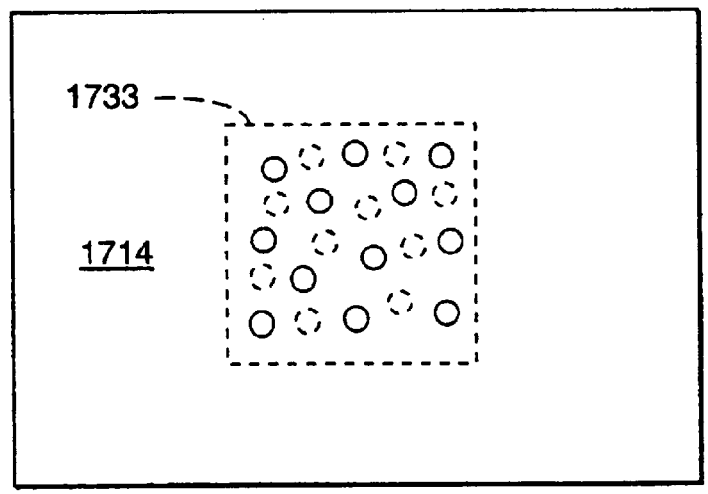
FIG. 17B is a superposed mask pattern for explaining the same method.

FIG. 17B is a superposed mask top plan layout showing how the main opening patterns corresponding to a number of isolated patterns are to be distributed over the main mask and the auxiliary mask. In the same Figure, the mask substrate 1733, in which the mask 1714a is superposed on the mask 1714b, is a pattern portion (for one shot) to be simultaneously exposed; circles indicated by solid lines in a square indicated by broken lines are the individual main opening pattern on the main mask 1714a; and circles indicated by broken lines are the individual main opening pattern on the auxiliary mask 1714b.

Thus, the heating treatments of the two masks by the exposure lights can be made substantially identical and even by distributing the main opening pattern evenly on the two masks.

(18) Embodiment 18

Figure 18:
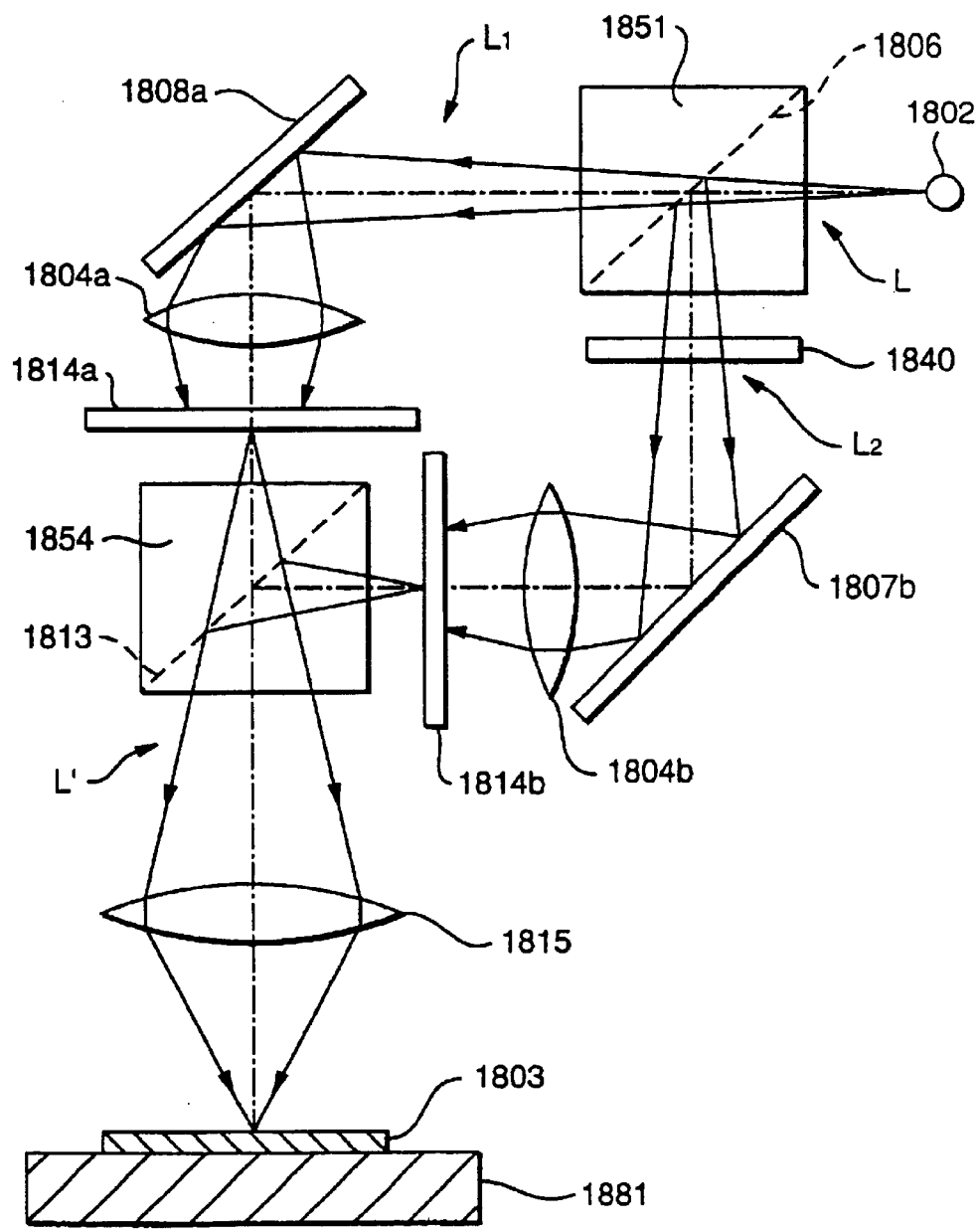
FIG. 18 is a front section showing a simplified multi-mask-stepper according to Embodiment 18 of the present invention.

FIG. 18 is a schematic sectional front elevation showing an exposure optical system of a step-and-repeat type 5:1 size-reducing projection exposure system (or the stepper) for practicing the multi-mask phase shifting method (or the pair-mask phase shifting method) according to one embodiment of the present invention. In the same Figure: reference numeral 1802 designates an exposing light source (as has been described in detail in Embodiment 10) such as the i-line of the Hg lamp; letter L designates an original exposure luminous flux; letter $L_1$ designates a main exposure luminous flux; letter $L_2$ designates an auxiliary exposure luminous flux divided likewise; numeral 1851 designates a prism for accommodating a light dividing half mirror 1806; numeral 1840 designates phase adjusting or optical path adjusting means such as the shifter, as indicated at 205 in FIG. 2A or in FIG. 5C or will be described in the following embodiments; numerals 1808a and 1807b designate main and auxiliary luminous flux mirrors, respectively; numerals 1804a and 1804b designate prisms for accommodating the condensers for establishing the Kohler illuminations; numerals 1814a and 1814b designate main and auxiliary masks; numeral 1854 designates a composing prism for accommodating the composing half mirror 1813; letter L' designates a composing luminous flux; and numeral 1815 designates a 5:1 size-reducing projection lens system which is made telecentric at the two object and image sides. Numeral 1803 designates an exposed wafer, and numeral 1881 designates a wafer state, as shown in FIG. 5A and FIG. 19.

Since, in the present embodiment, the main exposure optical axis extending through the wafer and the main illumination optical axis extending through the light source are perpendicular to each other, the optical paths for the main and auxiliary divided lights can be generally symmetrically constructed with relative ease.

Incidentally, the present system should not be limited to the phase shifting method but can naturally be widely applied to the exposure method using the two masks used in other embodiments of the present invention.

(19) Embodiment 19

In the present embodiment, there will be described a specific example of the exposure illumination system for practicing the pair-mask phase shifting method (or the multi-mask phase shifting method) of the present invention and another example of the exposure optical system.

Figure 19:
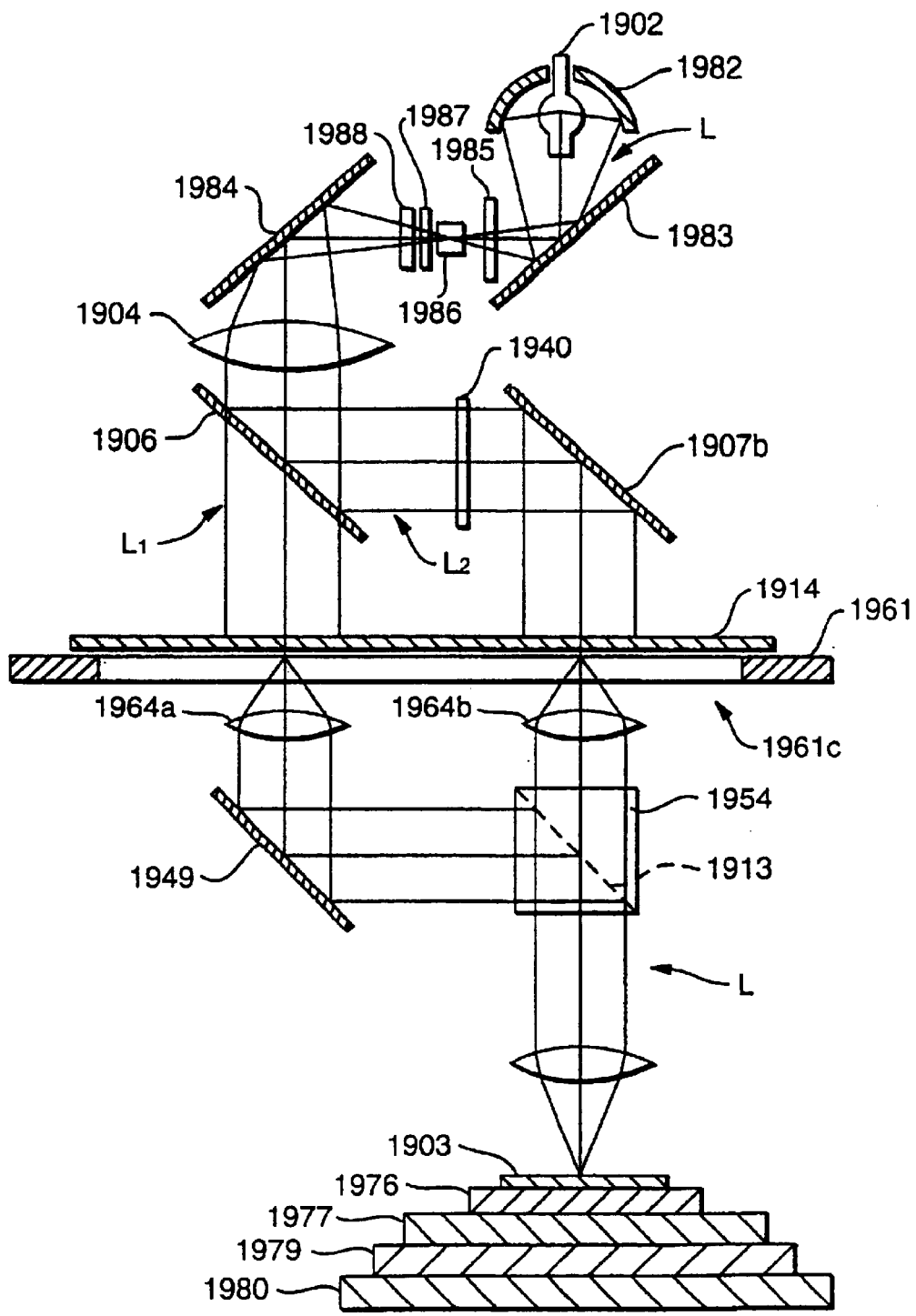
FIG. 19 is a front section showing a pair mask (or pattern) exposure system (or stepper) according to a single mask substrate of Embodiment 19 for explaining the structure of an individual illumination light source of the exposure system of each embodiment of the present invention.

FIG. 19 is a schematic sectional front elevation showing the exposure optical system of the step-and-repeat type 5:1 size-reducing projection exposure system of the present embodiment. In the same Figure: reference numeral 1902 designates a high-pressure mercury lamp; numeral 1982 designates an oval mirror; letter L designates an original exposure illumination luminous flux; numeral 1983 designates a first reflecting mirror (e.g., Al mirror); numeral 1985 designates a shutter; numeral 1986 designates a fly-eye lens; numeral 1987 designates an aperture; numeral 1988 designates a filter (e.g., a short-cut-filter); numeral 1984 designates a second reflecting mirror (e.g., a cold mirror); numeral 1904 designates a condenser lens constituting the Kohler illumination; numeral 1906 designates a half mirror for dividing the original exposure luminous flux L into the main and auxiliary exposure luminous fluxes $L_1$ and $L_2$; numeral 1940 designates optical path adjusting means or phase shifting plate (e.g., 205 of FIG. 2A or 540a and 540b of FIG. 5A), as exemplified in another embodiment; numeral 1907b designates a deflecting mirror for the auxiliary luminous flux $L_2$; numeral 1914 designates a mask bearing the main pattern and the auxiliary pattern; numeral 1961 designates a mask holder for holding the mask as in another example and further for adjusting the X-, Y- and Z-directions, the θ direction and the gradient; numeral 1961c designates an opening at the center; numerals 1964a and 1964b designate object side projection lens systems for the main and auxiliary luminous fluxes; numeral 1949a designates a deflecting mirror for the main luminous flux $L_1$; numeral 1913 designates a composing half mirror for composing the main luminous flux $L_1$ and the auxiliary $L_2$ into the composed light L'; numeral 1954 designates a composing prism for accommodating the half mirror; numeral 1915 designates an image side lens system forming part of the 5:1 size-reducing projection lens system which is made telecentric (as in Embodiment 11) at the two object and image sides separately of the foregoing object side lens systems 1964a and 1964b; numeral 1903 designates an exposed wafer; numeral 1976 designates a wafer sucking tale table acting as the θ drive table; numeral 1977 designates a vertical or Z-axis carriage; numeral 1979 designates a carriage in one horizontal direction, i.e., the X-axis; and numeral 1980 designates a carriage in another horizontal direction, i.e., the Y-axis.

In the present embodiment, the mask substrate is single so that the main and auxiliary masks need not be matched.

(20) Embodiment 20

The present embodiment will be described in connection with the two-dimensional local variable shifter plate which can be used as the optical path adjusting means or the shifter plate in another embodiment.

Figure 20A:
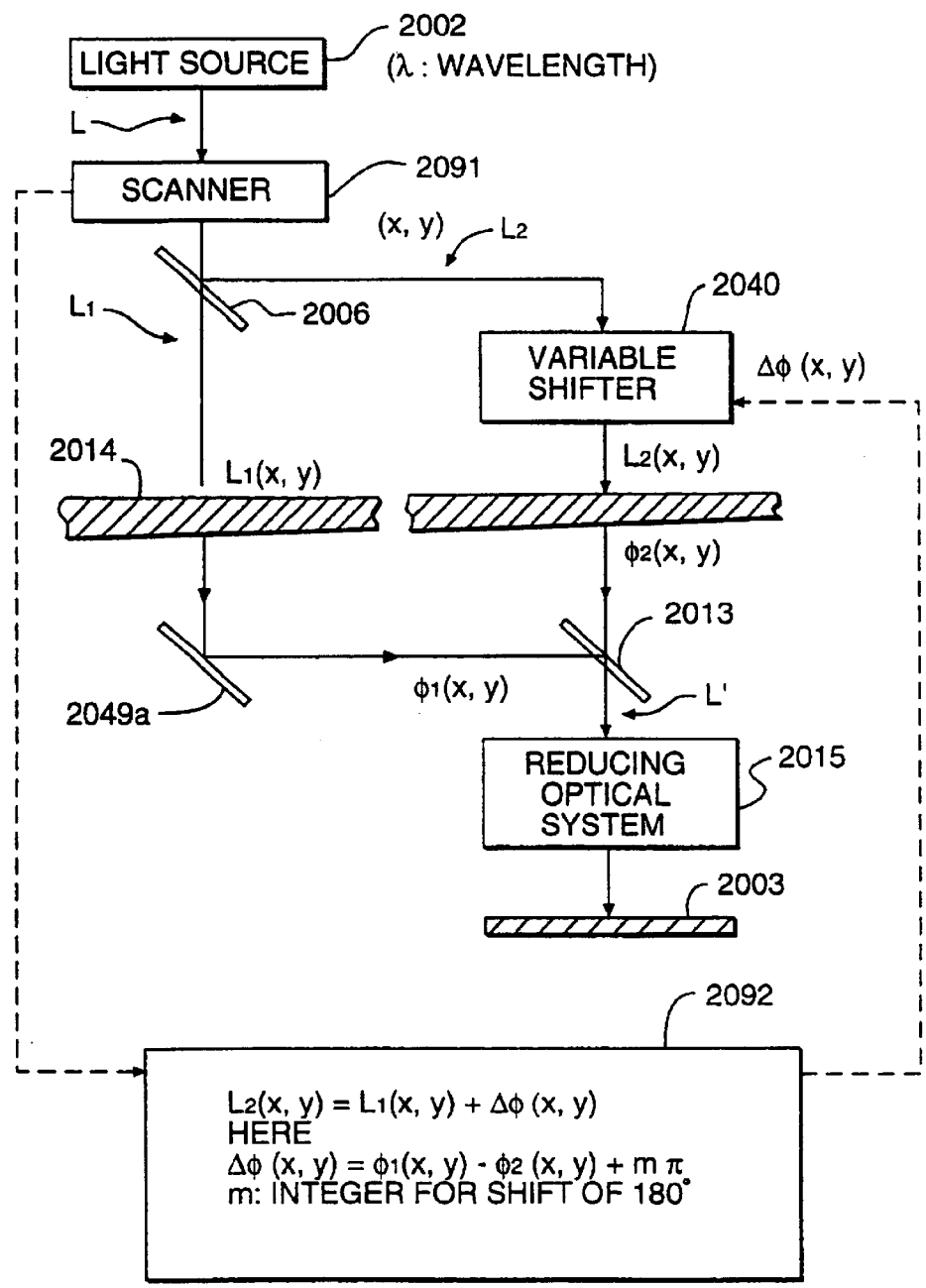
FIG. 20A is a diagram showing the overall structure of a two-dimensional phase adjusting system according to an Embodiment 20 of the present invention.

FIG. 20A is a simplified sectional front elevation showing the stepper, in which the variable shifter of the present embodiment is either replaced by the shift plate 1040 of FIG. 19 or added to the same. In the same Figure: reference numeral 2002 designates an ultraviolet or far ultraviolet light source, as shown in FIG. 10 or 19; letter L designates an original exposure luminous flux; numeral 2091 designates a phase detector, i.e., a scanner for measuring the phase of the original exposure luminous flux in the coordinates (x, y) on the field; numeral 2006 designates a half mirror for dividing the original exposure luminous flux L into the main luminous flux $L_1$ and the auxiliary $L_2$; numeral 2040 designates a two-dimensional variable phase shifting plate or shifter for setting the difference $\Delta\phi$ (x, y) between the phase of the coordinate (x, y) of the main luminous flux $L_1$ and the phase of the same coordinate of the auxiliary luminous flux $L_2$ locally (for each minute portion) to a desired value; and letters $L_1$ (x, y) and $L_2$ (x, y) designate the coordinates (x, y) of the individual luminous fluxes $L_1$ and $L_2$. Numeral 2014 designates a mask carrying the main pattern and the auxiliary pattern at a distance on one mask. It is exaggerated in the drawing that the masks have different thicknesses in the individual portions so that the phase shifts at the time of mask passage depend upon the coordinates (x, y). Numeral 2049a designates a deflecting mirror for the main luminous flux $L_1$; numeral 2013 designates a composing half mirror for composing the main luminous flux $L_1$ and the auxiliary luminous flux $L_2$ into the composed light L'; letters $\phi_1$ (x, y) and $\phi_2$ (x, y) designate the phases of $L_1$ (x, y) and $L_2$ (x, y) designate in the reference plane immediately before the composition; numeral 2015 designates a projection lens system which constitutes the 5:1 size-reducing projection system by itself or together with another lens group and which is made telecentric at the two object and image sides by the projection lens system. Numeral 2003 designates an exposed semiconductor wafer, and numeral 1092 designates a variable shifter control circuit for controlling the phase difference A $\phi$ to a constant and even value over the whole exposure field (or unit shot) on the basis of the phase difference $\Delta\phi$ (x, y) between the divided lights having the coordinates (x, y) detected by the scanner 2091.

FIG. 20B is an enlarged view showing one principal plan of the aforementioned variable shifter 2040 of FIG. 20A. In the same Figure, reference numeral 2040a designates a number of square transparent electrodes, and numeral 2041 designates gaps having no electrode. If the width of these gaps is set to a value equal to or smaller than the size corresponding to the minimum resolution size on the wafer, the noises coming from the gaps can be effectively reduced. The aforementioned square electrodes has a side of about 20 $\mu$m to 200 $\mu$m, for example. Moreover, the position of the variable shifter on the optical path is desired to be located in the vicinity of the optical axis of the optical member for compensating the phase dispersion. Specifically, the variable shifter is effectively arranged on the optical axis in the vicinity of the mask in case the maximum cause for the phase dispersion in the single shot is based upon the mask substrate.

FIG. 20C is a section taken along line XX—XX of FIG. 20B and showing the variable shifter. In the same Figure: reference numeral 2042 designates one of the electrooptical crystals, as shown in FIG. 20D, which have the Pockels effects; numerals 2040a and 2040b designates square transparent electrodes (or segments) opposed to each other; and numeral 2043 designates a transparent insulating film. This insulating film 2043 is formed with transparent wiring lines which have a width smaller than the minimum resolution size (converted on the wafer) so that desired voltages can be independently applied to the individual segments. The aforementioned variable shifter control circuit 2092 compensates the dispersion of the phase difference $\Delta\phi$ at the single shot, i.e., in the single step exposure region by controlling the voltages of the numerous segments through those wiring lines.

(21) Publications for Supplementing the Disclosure of the Present Invention

The theoretical description of the on-mask phase shifting exposure method, the method of forming the mask, the method of calculating the patterns, and the experimental data are made in the following and will form part of the description of the embodiments of the present invention. Specifically: Japanese Patent Application No. 295350/1988 (filed on Nov. 2, 1988); Japanese Patent Application No. 257226/1989 (filed on Oct. 2, 1989); corresponding U.S. patent application Ser. No. 07/437,268 (filed on Nov. 16, 1989); Japanese Patent Publication No. 50811/1987; on pages 74 to 75 of "Nikkei Micro Devices", May, 1990; on pages 1828 to 1836 of vol. ED-29, No. 12, December 1982, P. Levenson et al., "Improving Resolution in Photolithograph with a Phase-Shifting Mask"; and on pages 325 to 332 of "Projected Image Distortion Correction of 1 $\mu$m Processing Photo Mask Pattern", vol. J68-C No. 5, May 1985, Reports of Japanese Electron Communication Association.

Since the Japanese Patent Laid-Open No. 171123/1987 discloses the exposure illumination system using the high-pressure mercury lamp, this will also be included in the description of the embodiments of the present invention.

Since the Japanese Patent Laid-Open No. 22626/1986 discloses the structure of the projection lens system having the two-side telecentric structure, this will also be included in the description of the embodiments of the present invention.

Since the Japanese Patent Laid-Open No. 43420/1986 discloses the technology for forming the mask by using the electron beam, this will also be included in the description of the embodiments of the present invention.

The effects of the representative of the invention to be disclosed herein will be briefly described in the following.

When a predetermined pattern, which is formed on a mask and composed of a shielding region and a transparent region, is to be transferred onto a specimen to be illuminated, by irradiating the mask with a light and irradiating the specimen with the light having passed through the transparent region of said mask, the light emitted from a light source is divided into two lights, and the phases of the two lights immediately after having passed through different portions of said mask are opposed to each other by changing the individual optical lengths for said two lights to reach said mask. After this, said two lights are composed to illuminate said specimen. According to the above-specified means, the two lights immediately after having passed through the different portions of the mask have their phases opposed to each other and are then composed to illuminate the specimen. As a result, one light having passed through a predetermined transparent region on the mask and the other light having passed through another transparent region on the mask interfere with each other and are weakened in their boundary regions at the portions, in which they are arranged close to each other, so that the projected image has its contrast improved drastically.

As a result, the transfer precision of the pattern can be improved without requiring a long time and much labor for fabricating the mask.

What is claimed is:

1. A method of making a semiconductor device, comprising the steps of:

(i) irradiating a mask, where an enlarged circuit pattern is formed, with an exposure light flux, being at least partially coherent in the ultraviolet domain; and (ii) reducing and projecting the exposure light flux passing through the mask, by an optical reducing projection exposure system, so that a desired reduced circuit pattern corresponding to the enlarged circuit pattern can be focused onto a photosensitive resist film overlying a major surface of a wafer, whereby the reduced circuit pattern corresponding to the enlarged circuit pattern is transferred onto the wafer, said mask comprising:

(a) a transparent mask substrate having a first and a second major surfaces;

(b) a first opening region having an inner corner portion and an outer corner portion in a light shielding region over the first major surface of the mask substrate, which inner corner portion borders on a vertex portion of the light shielding region, which outer corner portion borders on a vertex portion of the first opening region, and which first opening region corresponds to the reduced circuit pattern to be transferred onto the wafer;

(c) an auxiliary light shielding region having a size smaller than that of the first opening region, in the first opening region over the first major surface of the mask substrate, which auxiliary light shielding region is disposed at the vertex portion of the light shielding region, and has such a size that the auxiliary light shielding region reduces deformation of the transferred pattern onto the wafer corresponding to the first opening region by reducing the light intensity on the wafer at the inner corner portion of the first opening region without affecting the whole shape of the transferred pattern onto the wafer corresponding to the first opening region; and (d) an auxiliary opening region having a size smaller than that of the first opening region, in the light shielding region over the first major surface of the mask substrate, which auxiliary opening region is disposed at the vertex portion of the first opening region, and has such a size that the auxiliary opening region reduces deformation of the transferred pattern onto the wafer corresponding to the first opening region by enhancing the light intensity on the wafer at the outer corner portion of the first opening region without affecting the whole shape of the transferred pattern onto the wafer corresponding to the first opening region, and the phase of which auxiliary opening region is the same as that of the first opening region.

* * * * *